United States Patent
Watanabe et al.

(10) Patent No.: US 6,989,724 B2
(45) Date of Patent: Jan. 24, 2006

(54) SURFACE ACOUSTIC WAVE DEVICE AND COMMUNICATION DEVICE

(75) Inventors: Hiroki Watanabe, Ishikawa-ken (JP); Masaru Yata, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 82 days.

(21) Appl. No.: 10/820,339

(22) Filed: Apr. 8, 2004

(65) Prior Publication Data

US 2004/0233018 A1    Nov. 25, 2004

(30) Foreign Application Priority Data

May 19, 2003  (JP)  ............................. 2003-139741

(51) Int. Cl.
  *H03H 9/64*  (2006.01)
  *H03H 9/72*  (2006.01)
(52) U.S. Cl. ...................... 333/133; 333/193; 333/195; 310/313 D
(58) Field of Classification Search ................ 333/133, 333/195; 310/313 D
  See application file for complete search history.

(56) References Cited

U.S. PATENT DOCUMENTS

| | | | |
|---|---|---|---|
| 5,936,488 A | * | 8/1999 | Taguchi et al. .............. 333/195 |
| 6,731,188 B2 | * | 5/2004 | Sawada et al. .............. 333/193 |
| 6,771,144 B2 | * | 8/2004 | Takamine .................... 333/133 |
| 6,828,878 B2 | * | 12/2004 | Takamine et al. ........... 333/193 |

FOREIGN PATENT DOCUMENTS

| | | |
|---|---|---|
| JP | 10-117123 | 5/1998 |
| JP | 11-191720 | 7/1999 |
| JP | 2001-308672 | 11/2001 |
| JP | 2002-314366 | 10/2002 |

* cited by examiner

*Primary Examiner*—Barbara Summons
(74) *Attorney, Agent, or Firm*—Keating & Bennett, LLP

(57) ABSTRACT

A surface acoustic wave apparatus include at least two surface acoustic wave filter devices, each of which includes two or more IDTs. One of the at least two surface acoustic wave filter devices is connected to one of balanced signal terminals, and another of the at least two surface acoustic wave filter devices is connected to the other balanced signal terminal, so as to have a balance-unbalance conversion function. The at least two surface acoustic wave devices are configured to produce a difference in the intensity of the excited SSBW therebetween.

83 Claims, 45 Drawing Sheets

INSERTION LOSS OF ARRANGEMENT WITH GROUND-GROUND COUPLING

INSERTION LOSS OF ARRANGEMENT WITH COUPLING OF GROUNDED ELECTRODE AND SIGNAL ELECTRODE

SURFACE ACOUSTIC WAVE DEVICE AND COMMUNICATION DEVICE

BACKGROUND OF THE INVENTION

1. Field of the Invention

The present invention relates to a communication device including a surface acoustic wave device suitable for small-sized communication devices such as cellular phones, and more particularly, to a communication device including surface acoustic wave devices having a balance-unbalance conversion function.

2. Description of the Related Art

In recent years, technology in the field of reduction of the size and weight of communication devices, such as cellular phones, has made remarkable progress. In order to achieve such technology, development of components having multiple functions is progressing, as well as reduction of the number and size of components. With such background, in recent years, there has been intense development of surface acoustic wave devices having a balance-unbalance conversion function, also known as "balun", for an RF (Radio Frequency) section of communication devices such as cellular phones, and such acoustic wave devices are primarily being used for GMS cellular phones.

As a surface acoustic wave device having different input impedance and output impedance, and a balance-unbalance conversion function, a surface acoustic wave device having a configuration as shown in FIG. 2 is known, for example. The surface acoustic wave device shown in FIG. 2 includes a first surface acoustic filter device 108, a second surface acoustic wave filter device 119 designed so as to output signals having a phase difference of 180° as compared to the first surface acoustic filter device 108, a single-port surface acoustic wave resonator 112 and 116, disposed on an unshown piezoelectric substrate. Such a device is disclosed in Japanese Unexamined Patent Application Publication No. 10-117123 or Japanese Unexamined Patent Application Publication No. 2001-308672.

The first surface acoustic wave filter device 108 includes three comb-shaped electrodes (which is also referred to as "interdigital transducer", and will be referred to as "IDT" hereafter) i.e., the IDTs 103, 104, and 105 in the drawing, wherein the IDT 104 and the IDT 105 are disposed on left and right sides of the IDT 103, respectively. Furthermore, reflectors 106 and 107 are arranged so as to surround these IDTs 104, 103, and 105. That is to say, the first surface acoustic filter device 108 is a longitudinally-coupled resonator type filter having a configuration including three IDTs.

The single-port surface acoustic resonator 112 includes reflectors 110 and 111 that are arranged so as to surround an IDT 109. The single-port surface acoustic resonator 116 includes reflectors 114 and 115 that are arranged so as to surround an IDT 113. The IDT 103 is serially connected to the IDT 109. Furthermore, each of IDTs 104 and 105 are serially connected to the IDT 113.

With the first surface acoustic filter device 108, which is a longitudinally coupled-resonator type filter, a predetermined number of electrode fingers are provided with narrower pitch (which will be refereed to as "narrow-pitch electrode fingers" hereafter) around regions of the IDT 103 and the IDT 104 adjacent to one another, and the region of the IDT 103 and the IDT 105 adjacent to one another (regions 117 and 118 shown in FIG. 2) than with the other regions, and furthermore, these IDTs are arranged to have intervals of approximately half of the wavelength of the surface acoustic waves propagating thereon, thereby suppressing loss due to components escaping as bulk waves. Note that FIG. 2 shows an example having a small number of electrode fingers so as to simplify the drawing.

The second surface acoustic wave filter device 119 is a 3-IDT longitudinally coupled-resonator filter device having the same configuration as that of the first surface acoustic wave filter 108, except that the IDT at the middle portion is facing in the opposite direction. The second surface acoustic wave filter device 119 is connected to a single-port surface acoustic wave resonator 120 having the same configuration as the single-port surface acoustic wave resonator 112, and a single-port surface acoustic wave resonator 121 having the same configuration as with the single-port surface acoustic wave resonator 116.

With the first and second surface acoustic wave filters 108 and 119, one pair of terminals 122 and 123 are electrically connected to the load in parallel, and the other pair of the terminals 124 and 125 are electrically connected to the load in series, whereby the terminals connected to the load in parallel define an unbalanced signal terminal, and the terminals connected to the load in series define balanced signal terminals.

With the above-described surface acoustic wave device having a balance-unbalance conversion function, the circuit between the unbalanced signal terminal and one balanced signal terminal ideally exhibits the transmission properties of the same amplitude property and the inverse phase as compared with the circuit between the unbalanced signal terminal and the other balanced signal terminal. Note that actual differences in the amplitude and the phase between the aforementioned two circuits will be respectively referred to as "amplitude difference" and "phase difference" hereafter.

Specifically, the amplitude difference and the phase difference are obtained as follows. Assuming the surface acoustic wave device defining the aforementioned filter having a balance-unbalance conversion function is a 3-port device which includes a port 1 defining an unbalanced input terminal, and a port 2 and a port 3, defining balanced output terminals. In this case, the amplitude difference is defined as |A|, wherein $A=|20 \log(S21)|-|20 \log(S31)|$. On the other hand, the phase difference is defined as |B−180|, wherein $B=|\angle s21-\angle s31|$. The ideal amplitude difference and phase difference are 0 dB and 0°, respectively.

However, with the above-described conventional technique, the surface acoustic wave device having the configuration shown in FIG. 2 exhibits deviations of the amplitude difference and the phase difference from the ideal values, leading to a non-negligible problem in actual use. The reason is that while the electrode fingers of the IDT 103 which are adjacent to the IDT 104 and the IDT 105 are grounded, the electrode fingers of the IDT 127 which are adjacent to the IDT 126 and the IDT 128 define signal electrodes.

Specifically, with an IDT-coupling configuration wherein one of the coupled electrodes of the IDTs is grounded, and the other defines a signal electrode, the IDT-coupling configuration exhibits higher conversion efficiency of current in a resonant mode having an amplitude peak, than with an IDT-coupling configuration wherein both the coupled electrodes of the IDTs are grounded or serve as signal electrodes, leading to a problem that the former IDT-coupling configuration exhibits smaller insertion loss than with the latter IDT-coupling configuration within the pass band, particularly on the high-frequency side, and exhibits a wider pass band than therewith, resulting in a problem of deviation of phase therebetween.

With the conventional surface acoustic wave device having a balance-unbalance conversion function which includes the first surface acoustic wave filter 108 and the second surface acoustic wave filter 119, the aforementioned difference leads to deviation of the amplitude difference and the phase difference from the ideal values, i.e., 0 dB and 0°, respectively.

SUMMARY OF THE INVENTION

To overcome the problems described above, preferred embodiments of the present invention provide a surface acoustic wave device having improved transmission performance such as suppressed amplitude difference and phase difference between the balanced signal terminals.

According to a first preferred embodiment of the present invention, a surface acoustic wave device having a balance-unbalance conversion function includes at least two surface acoustic wave filter devices having at least two IDTs, wherein a first surface acoustic wave filter device is connected to one of balanced signal terminals, and a second surface acoustic wave device is connected to the other balanced signal terminal, and the first and second surface acoustic wave filter devices are configured such that a difference in the intensity of the excited SSBW (Surface Skimming Bulk Wave) occurs therebetween.

With the above-described configuration, a difference in the intensity of the excited SSBW occurs between the first and second surface acoustic wave filter devices, and accordingly, the amplitude difference and the phase difference are controlled between the balanced signal terminals by adjusting the difference in the SSBW occurring thereon, thereby improving transmission performance such as suppressed amplitude difference and phase difference between the balanced signal terminals.

The first and second surface acoustic wave filter devices preferably include IDTs having different intervals between the tips of the electrode fingers and bus bars so as to produce a difference in the intensity of the excited SSBW between the first and second surface acoustic wave filter devices. Furthermore, the first and second surface acoustic wave filter devices may include IDTs having different intervals between the tips of electrode fingers and dummy electrode fingers, each of which are connected to a bus bar so as to produce a difference in the intensity of the excited SSBW between the first and second surface acoustic wave filter devices. Moreover, the first and second surface acoustic wave filter devices may include IDTs having lengths of dummy electrode fingers each of which are connected to a bus bar so as to be introduced between an electrode finger and a bus bar in order to produce a difference in the intensity of the excited SSBW between the first and second surface acoustic wave filter devices. Further yet, the first and second surface acoustic wave filter devices may include IDTs having film thicknesses of bus bars that are different from one another, and/or having film structures thereof that are different from one another in order to produce a difference in the intensity of the excited SSBW between the first and second surface acoustic wave filter devices.

The first and second surface acoustic wave filter devices preferably include IDTs having sound absorptive material that is coated on the bus bars, such that the sound absorptive material is made of compositions that are different from one another, and/or with thicknesses that are different from one another, so as to effect difference in the intensity of the excited SSBW between the first and second surface acoustic wave filter devices. All of the IDTs may have different structures between the first and second surface acoustic wave filters. Or, just one of the IDTs may have different structures between the first and second surface acoustic wave filters.

According to a second preferred embodiment of the present invention, a surface acoustic wave device includes a surface acoustic wave filter with a balance-unbalance conversion function having at least three IDTs, wherein a difference in the intensity of the SSBW occurs between a IDT connected to one of balanced signal terminals and a IDT connected to the other balanced signal terminal.

With the above-described configuration, a difference in the intensity of the excited SSBW occurs between the IDTs connected to respective balanced signal terminals, and accordingly, the amplitude difference and the phase difference are controlled between the balanced signal terminals by adjusting the difference in the SSBW occurring therein, thereby improving transmission performance by suppressing the amplitude difference and the phase difference between the balanced signal terminals.

The multiple surface acoustic wave filters are preferably connected in series, and each of IDTs connected to the balanced signal terminals preferably have different intervals of the tips of electrode fingers and bus bars so as to effect a difference in the intensity of the excited SSBW therebetween, or each of IDTs connected to the balanced signal terminals may have different intervals of the tips of electrode fingers and dummy electrodes each of which are connected to a bus bar so as to produce a difference in the intensity of the excited SSBW therebetween. Further, each of IDTs connected to the balanced signal terminals may have different lengths of dummy electrode fingers, each of which are connected to a bus bar so as to be introduced between an electrode finger and the bus bar in order to produce a difference in the intensity of the excited SSBW therebetween. Moreover, each of IDTs connected to the balanced signal terminals may have different film thicknesses and/or different film structures of bus bar portions so as to produce a difference in the intensity of the excited SSBW therebetween.

Each of the IDTs connected to the balanced signal terminals preferably includes sound absorptive material, with which bus bars are coated, having different compositions and/or having different thicknesses, so as to produce a difference in the intensity of the excited SSBW therebetween.

Each of the first and second surface acoustic wave filter devices are preferably serially connected to a surface acoustic wave resonator. With the above-described configuration wherein the surface acoustic wave resonators are connected in series, decay of the signals outside of the pass band can be adjusted so as to be increased.

According to a third preferred embodiment of the present invention, a surface acoustic wave device includes at least one surface acoustic wave filter with a balance-unbalance conversion function and having at least two IDTs, and surface acoustic wave resonators that are serially connected to respective balanced signal terminals, wherein the two surface acoustic wave resonators have different intervals between the tips of electrode fingers and bus bars.

According to a fourth preferred embodiment of the present invention, a surface acoustic wave device includes at least one surface acoustic wave filter with a balance-unbalance conversion function and having at least two IDTs, and surface acoustic wave resonators that are serially connected to respective balanced signal terminals, wherein the two surface acoustic wave resonators have different intervals between the tips of electrode fingers and dummy electrode fingers, each of which are connected to a bus bar.

According to a fifth preferred embodiment of the present invention, a surface acoustic wave device includes at least one surface acoustic wave filter with a balance-unbalance conversion function and having at least two IDTs, and surface acoustic wave resonators that are serially connected to respective balanced signal terminals, wherein the two surface acoustic wave resonators have different lengths of dummy electrode fingers, each of which are connected to a bus bar so as to be introduced between the electrode finger and a bus bar.

According to a sixth preferred embodiment of the present invention, a surface acoustic wave device includes at least one surface acoustic wave filter with a balance-unbalance conversion function and having at least two IDTs, and surface acoustic wave resonators that are serially connected to respective balanced signal terminals, wherein the two surface acoustic wave resonators have different film thickness bus bar portions, and/or different film structures thereof.

According to a seventh preferred embodiment of the present invention, a surface acoustic wave device includes at least one surface acoustic wave filter with a balance-unbalance conversion function and having at least two IDTs, and surface acoustic wave resonators that are serially connected to respective balanced signal terminals, wherein the two surface acoustic wave resonators include sound absorptive material with which bus bars are coated, of different compositions, and/or with different thicknesses.

According to an eighth preferred embodiment of the present invention, a surface acoustic wave device with a balance-unbalance conversion function includes at least two surface acoustic wave filters, each of which includes at least two IDTs, wherein an unbalanced signal terminal is connected to two of the surface acoustic wave filter devices while each of two balanced signal terminals are connected to separate surface acoustic wave filter devices, and surface acoustic wave resonators are serially connected between the unbalanced signal terminal, and each of the two surface acoustic wave filter devices connected to the unbalanced signal terminal, and the two surface acoustic wave resonators have different intervals between the tips of electrode fingers and bus bars.

According to a ninth preferred embodiment of the present invention, a surface acoustic wave device with a function of balance-unbalance conversion includes at least two surface acoustic wave filters each of which include at least two IDTs, wherein an unbalanced signal terminal is connected to two of the surface acoustic wave filter devices while each of two balanced signal terminals are connected to separate surface acoustic wave filter devices, and surface acoustic wave resonators are serially connected between the unbalanced signal terminal, and each of the two surface acoustic wave filter devices connected to the unbalanced signal terminal, and the two surface acoustic wave resonators have different intervals between the tips of electrode fingers and dummy electrode fingers, each of which are connected to a bus bar.

According to a further preferred embodiment of the present invention, a surface acoustic wave device with a balance-unbalance conversion function includes at least two surface acoustic wave filters, each of which includes at least two IDTs, wherein an unbalanced signal terminal is connected to two of the surface acoustic wave filter devices while each of two balanced signal terminals are connected to separate surface acoustic wave filter devices, and surface acoustic wave resonators are serially connected between the unbalanced signal terminal, and each of the two surface acoustic wave filter devices connected to the unbalanced signal terminal, and the two surface acoustic wave resonators have different lengths of dummy electrode fingers, each of which are connected to a bus bar so as to be introduced between an electrode finger and the bus bar of the IDTs.

According to a further preferred embodiment of the present invention, a surface acoustic wave device with a balance-unbalance conversion function includes at least two surface acoustic wave filters, each of which includes at least two IDTs, wherein an unbalanced signal terminal is connected to two of the surface acoustic wave filter devices while each of two balanced signal terminals are connected to separate surface acoustic wave filter devices, and surface acoustic wave resonators are serially connected between the unbalanced signal terminal, and each of the two surface acoustic wave filter devices connected to the unbalanced signal terminal, and the two surface acoustic wave resonators have different film structures of bus bar portions and/or different film thicknesses thereof.

According to a further preferred embodiment of the present invention, a surface acoustic wave device with a balance-unbalance conversion function includes at least two surface acoustic wave filters, each of which include at least two IDTs, wherein an unbalanced signal terminal is connected to two of the surface acoustic wave filter devices while each of two balanced signal terminals are connected to separate surface acoustic wave filter devices, and surface acoustic wave resonators are serially connected between the unbalanced signal terminal, and each of the two surface acoustic wave filter devices connected to the unbalanced signal terminal, and the two surface acoustic wave resonators include sound absorptive material with which bus bars are coated, of different compositions, and/or with different thicknesses.

With the above-described configuration, a difference in the intensity of the excited SSBW occurs between the surface acoustic wave resonators connected to respective balanced signal terminals, and accordingly, the amplitude difference and the phase difference are controlled between the balanced signal terminals by adjusting the difference in the SSBW occurring thereon, thereby improving transmission performance, such as suppressed amplitude difference and phase difference between the balanced signal terminals.

The aforementioned surface acoustic wave device with a balance-unbalance conversion function may include at least two surface acoustic wave filter devices, each of which includes at least two IDTs, wherein one of balanced signal terminals is connected to a first surface acoustic wave filter device while the other balanced signal terminal is connected to a second surface acoustic wave filter device, and the first and second surface acoustic wave filter devices are configured so as to have at least one difference in the interval between the tips of electrode fingers and a bus bar, the interval between the tips of electrode fingers and dummy electrode fingers connected to a bus bar, the length of the dummy electrode fingers connected to a bus bar, the film thickness of the bus bar, the film structure of the bus bar, the composition of a sound absorptive material with which the bus bar is coated, and the thickness thereof, between the first and second surface acoustic wave filter devices.

The aforementioned surface acoustic wave device with a balance-unbalance conversion function may include at least three IDTs, wherein one of the IDTs connected to one of balanced signal terminals and another one of the IDTs connected to the other balanced signal terminal are configured so as to produce at least one difference in the interval between the tips of electrode fingers and a bus bar, the interval between the tips of electrode fingers and dummy electrode fingers connected to a bus bar, the length of dummy electrode fingers each of which are connected to the bus bar, the film thickness of the bus bar, the film structure of the bus bar, the composition of a sound absorptive material with which the bus bar is coated, and the thickness thereof, between the IDTs connected to the balanced signal terminals.

Furthermore, an arrangement may be provided wherein electrode fingers of a portion facing an IDT coupled to an IDT connected to one of balanced signal terminals are connected to a signal terminal while electrode fingers of a portion facing an IDT coupled to an IDT connected to the other balanced signal terminal are grounded.

Furthermore, the IDTs may have an interval between the tips of electrode fingers and a bus bar of about 0.1 $\mu$m or more, and equal to or less than about 0.55 times the wavelength ($\lambda$) of the surface acoustic wave propagating thereon.

A communication device according to another preferred embodiment of the present invention includes a surface acoustic wave device having one of the aforementioned configurations. With the above-described configuration, the amplitude difference and the phase difference is suppressed between the balanced signal terminals, thereby improving transmission properties of the communication device.

As described above, the surface acoustic wave device having a balance-unbalance conversion function according to various preferred embodiments of the present invention has a configuration wherein a difference in the intensity of the SSBW occurs between the portions for exciting the surface acoustic wave, connected to respective balanced signal terminals.

As described above, the surface acoustic wave device according to preferred embodiments of the present invention has the aforementioned configuration wherein difference in the intensity of the SSBW occurs therebetween, and accordingly, the amplitude difference and the phase difference is controlled between the balanced signal terminals by adjusting the difference in the SSBW occurring thereon, thereby improving transmission properties such as the aforementioned suppressed amplitude difference and phase difference.

Other features, elements, characteristics and advantages of the present invention will become more apparent from the following detailed description of preferred embodiments with reference to the attached drawings.

BRIEF DESCRIPTION OF THE DRAWINGS

FIGS. 4A and 4B are charts which show the relationship between the frequency and the insertion loss with various intervals (gaps) between the electrode finger tip and a bus bar of the surface acoustic wave device according to the first preferred embodiment, wherein FIG. 4A shows the insertion loss over the frequency with the "ground-ground configuration", and FIG. 4B shows the insertion loss over the frequency with the "ground-signal configuration";

DETAILED DESCRIPTION OF THE PREFERRED EMBODIMENTS

First Preferred Embodiment

Figure 1:
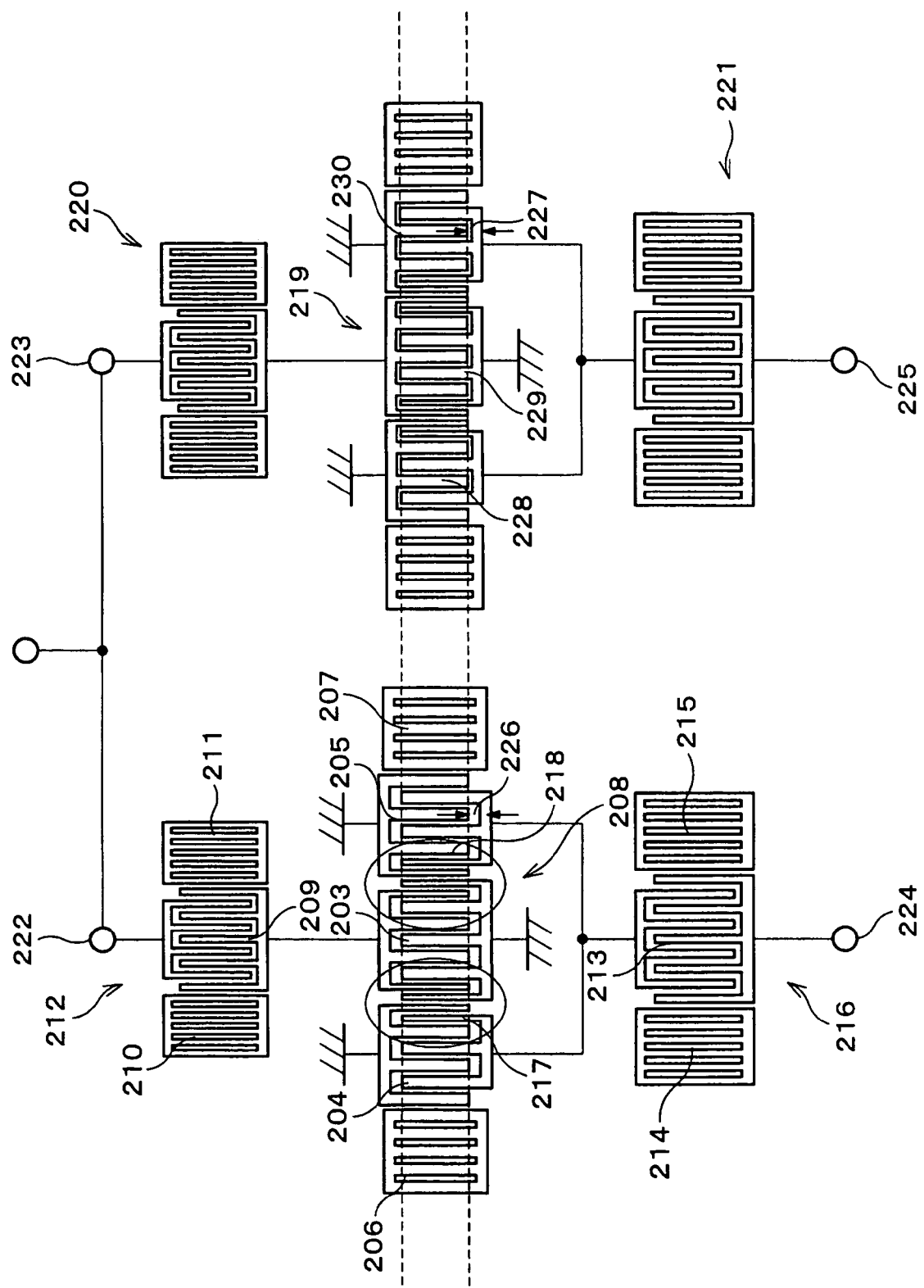
FIG. 1 is a configuration diagram which shows a surface acoustic wave device according to a first preferred embodiment of the present invention.

FIG. 1 shows a surface acoustic wave device according to a first preferred embodiment of the present invention. Description will be made regarding the first preferred embodiment, with a receiving filter for a PSC device, as an example. The surface acoustic wave device according to the first preferred embodiment includes surface acoustic wave devices such as IDTs, reflectors, and surface acoustic wave resonators, preferably formed of aluminum (Al) electrodes on an unshown 40±5°-Y-cut-X-propagation $LiTaO_3$ substrate (piezoelectric substrate), for example.

Each IDT preferably includes two electrode configurations provided on a piezoelectric substrate, each of which includes a strip-shaped bus bar (base), and multiple strip-shaped electrode fingers extending from one side of the bus bar in a direction that is substantially perpendicular to the longitudinal direction of the bus bar, and arranged substantially parallel to one another. The aforementioned two electrode configurations are arranged such that both of the electrode finger configurations thereof interleave with each other, more specifically, such that the sides of each electrode finger of one electrode configuration face the sides of the corresponding electrode finger of the other electrode configuration.

Accordingly, with the IDT, when a voltage difference between the two electrode finger configurations being created through each bus bar occurs, surface acoustic waves are generated at the portion on the piezoelectric substrate, and are propagated on the surface of the piezoelectric substrate in both directions in the width direction of the electrode fingers (directions substantially perpendicular to the longitudinal direction of each electrode finger). On the other hand, the IDT which does not receive electrode signals detects the voltage difference created on the surface of the piezoelectric substrate due to propagating surface acoustic waves through electrode fingers thereof so as to convert the surface acoustic waves into output electric signals.

With such an IDT, the signal conversion properties and the pass band are controlled by adjusting the length and width of each electrode finger, and the interleaving depth, which is the length over which electric fingers of the interleaved electrode configurations face each other.

The aforementioned reflectors are arranged so as to reflect the propagating surface acoustic wave in the direction of the propagation thereof. Each reflector includes a pair of base portions (bus bars), and multiple electrode fingers extending from the sides of the aforementioned bus bars, substantially perpendicular to the aforementioned sides of the bus bars and substantially parallel to one another, electrically connected to both the bus bars.

Figure 2:
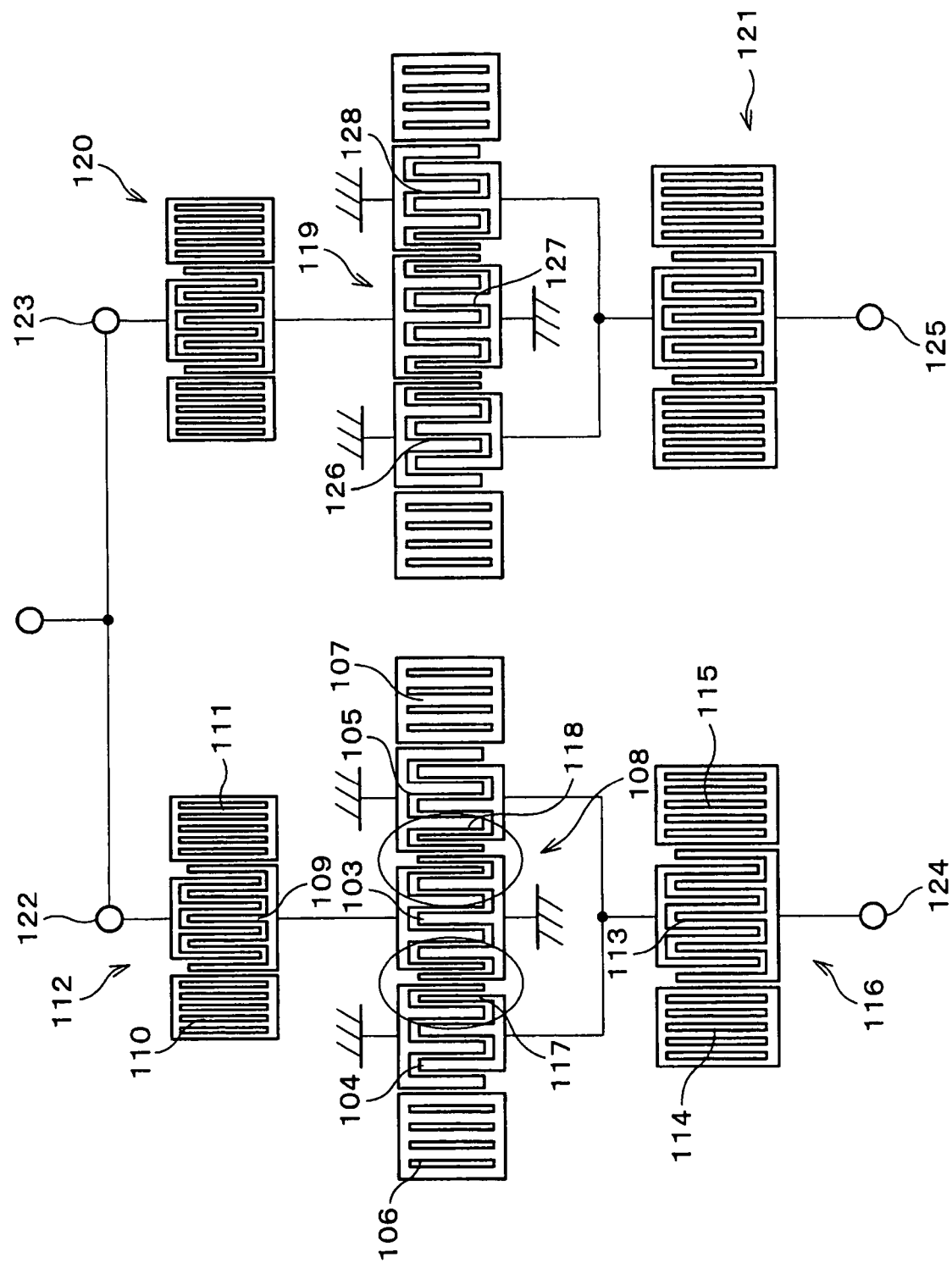
FIG. 2 is a configuration diagram which shows a conventional surface acoustic wave device.

The surface acoustic wave device according to the first preferred embodiment of the present invention preferably has basically the same configuration as the configuration of the conventional arrangement shown in FIG. 2, except for components according to the present invention which will be described later. The surface acoustic wave device according to the first preferred embodiment of the present invention includes a first surface acoustic wave filter device 208 and a second surface acoustic wave filter device 219, each of which outputs signals with an inverse phase relative to that of the other surface acoustic wave filter device. The first surface acoustic wave filter device 208 is a 3-IDT longitudinally coupled-resonator filter device. The first surface acoustic wave filter device 208 is preferably connected to single-port surface acoustic wave resonators 212 and 216.

The longitudinally-coupled-resonator-type first surface acoustic wave filter 208 includes an IDT 203 that is disposed at a middle portion so as to be disposed between IDTs 204 and 205 which are disposed on the left and the right sides thereof (along the propagating direction of the surface acoustic waves). Furthermore, reflectors 206 and 207 are arranged on the left and the right sides thereof so as to surround these IDTs 204, 203, and 205.

The single-port surface acoustic wave resonator 212 includes an IDT 209 that is disposed at a middle portion so as to be located between reflectors 210 and 211 disposed on the left and the right sides thereof. On the other hand, the single-port surface acoustic wave resonator 216 includes an IDT 213 that is disposed at a middle portion so as to be located between reflectors 214 and 215, disposed on the left and the right sides thereof. Furthermore, the IDT 203 is connected to the IDT 209 in series. Furthermore, the IDT 213 is connected to the IDTs 204 and 205 in series.

With the longitudinally-coupled-resonator-type first surface acoustic filter device 208 having such a configuration, a predetermined number of electrode fingers have a narrower pitch (which will be refereed to as "narrow-pitch electrode fingers" hereafter) around regions of the IDT 203 and the IDT 204 adjacent one to another, the region of the IDT 203 and the IDT 205 adjacent one to another (regions 217 and 218 shown in FIG. 1) than with the other regions, and furthermore, these IDTs are disposed with intervals of approximately half of the wavelength of the surface acoustic waves propagating thereon, thereby suppressing loss due to components escaping as bulk waves. Note that FIG. 1 shows an example having a small number of electrode fingers to simplify the drawing.

The second surface acoustic wave filter device 219 is a 3-IDT longitudinally coupled-resonator filter device having the same configuration as that of the first surface acoustic wave filter 208, except that the IDT 219 at the middle portion, corresponding to the IDT 203 of the first surface acoustic wave filter 208, is facing in the reverse direction. The second surface acoustic wave filter device 219 is preferably connected to a single-port surface acoustic wave resonator 220 having the same configuration as that of the single-port surface acoustic wave resonator 212, and a single-port surface acoustic wave resonator 221 having the same configuration as that of the single-port surface acoustic wave resonator 216.

With the first and second surface acoustic wave filters 208 and 219, one pair of terminals 222 and 223 are electrically connected to the load in parallel, and the other pair of the terminals 224 and 225 are electrically connected to the load in series, whereby the terminals connected to the load in parallel form an unbalanced signal terminal, and the terminals connected to the load in series serve balanced signal terminals.

Description will be made in detail regarding a design of the first and second surface acoustic wave filter devices 208 and 219, with the wavelength determined by the normal pitch as $\lambda 1$, and with the wavelength determined by the pitch of the narrow-pitch electrode fingers as $\lambda 2$.

That is to say:
Interleaving depth: about 29.2 $\lambda 1$
Number of electrode fingers of IDTs (in the order of the IDTs 204, 203, and 205): 25(4), (4)/47/(4), and (4)/25, (the numerals in parentheses are the number of narrow-pitch electrode fingers)
Note that IDTs 228, 229, and 230, each have the same number of electrode fingers.
IDT wavelength $\lambda 1$: about 2.049 $\mu$m, $\lambda 2$: about 1.860 $\mu$m ($\lambda 1$ corresponds to normal pitch, $\lambda 2$ corresponds to narrow pitch)
Reflector wavelength $\lambda R$: about 2.056 $\mu$m
Number of electrode fingers of reflectors: 150
IDT-IDT interval (interval between normal electrode finger with wavelength of $\lambda 1$ and narrow electrode finger with wavelength of $\lambda 2$): about $0.25\lambda 1+0.25\ \lambda 2$
IDT-IDT interval (interval between narrow electrode fingers with wavelength of $\lambda 2$): about 0.50 $\mu 2$
IDT-reflector interval: about 0.50 $\lambda R$
Duty of IDT: about 0.70
Duty of reflector: about 0.57
Electrode thickness: about 8.03 $\lambda 1$
Interval between electrode finger tip and bus bar
First surface acoustic wave filter device 208: about 0.9 $\mu$m
Second surface acoustic wave filter device 219: about 0.3 $\mu$m Description will be made below in detail regarding a design of the single-port surface acoustic wave resonators 212 and 220.
That is to say:
Interleaving depth: about 49.1 $\lambda 1$
Number of electrode fingers of IDTs: 281
IDT wavelength and reflector wavelength: about 2.035 $\mu$m
Number of electrode fingers of reflectors: 29
IDT-reflector interval: about 0.50 $\lambda R$
Description will be made below in detail regarding a design of the single-port surface acoustic wave resonators 216 and 221.
That is to say:
Interleaving depth: about 17.7 $\lambda 1$
Number of electrode fingers of IDTs: 281
IDT wavelength and reflector wavelength: about 1.980 $\mu$m
Number of electrode fingers of reflectors: 29
IDT-reflector interval: about 0.50 $\lambda R$ The surface acoustic wave device according to the first preferred embodiment of the present invention has a featured configuration wherein the first and second surface acoustic wave filter devices 208 and 219 are each provided with a different interval between the electrode finger tip and the bus bar, i.e., while the first surface acoustic wave filter devices 208 have an interval between the electrode finger tip and the bus bar of about 0.9 $\mu$m, the second surface acoustic wave filter devices 219 have an interval between the electrode finger tip and the bus bar of about 0.3 $\mu$m.

Figure 3:
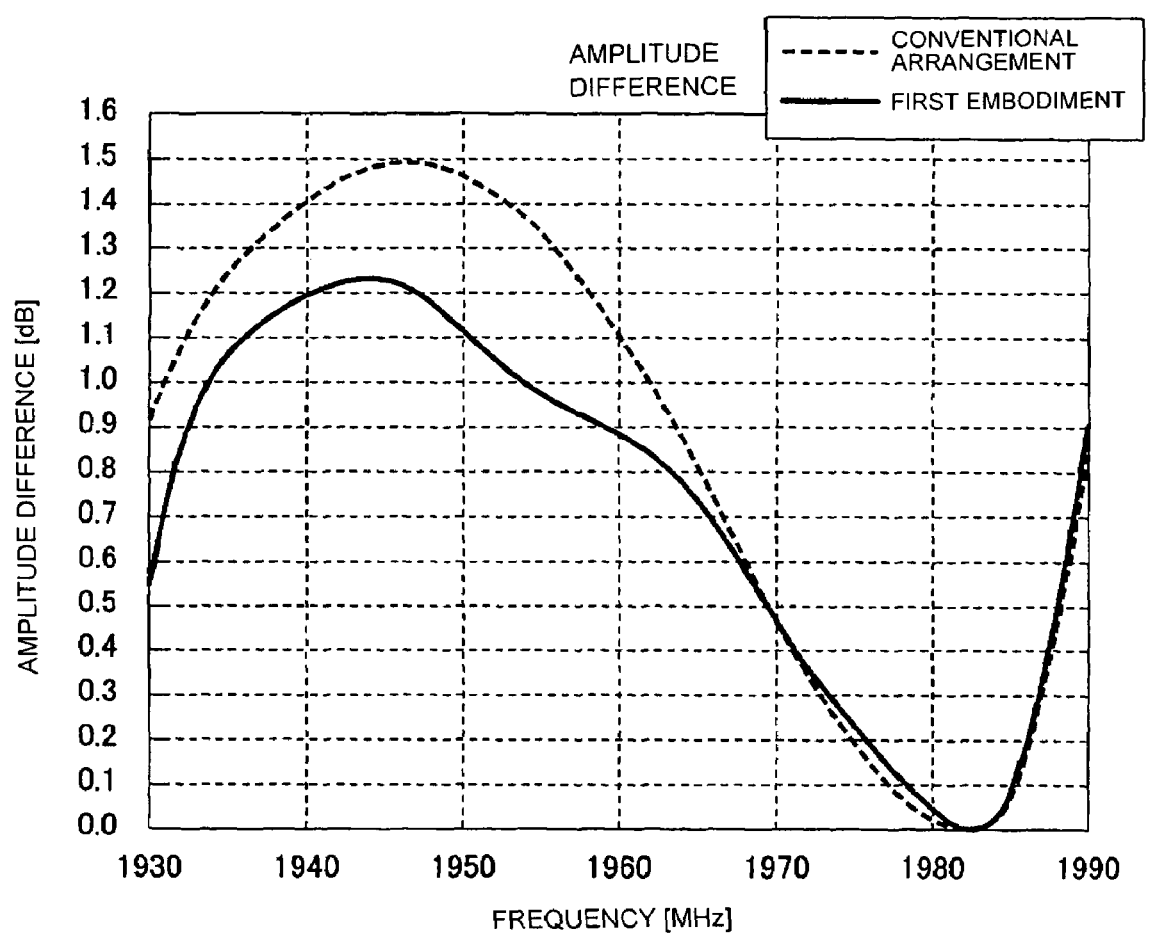
FIG. 3 is a chart which shows the relationship between the frequency and the amplitude difference with the aforementioned first preferred embodiment and conventional arrangement.

Description will be made below regarding the advantages of the surface acoustic wave device according to the first preferred embodiment of the present invention. FIG. 3 is a chart which shows the amplitude difference over frequency with a configuration according to the first preferred embodiment. As a comparative example, FIG. 3 shows the property of the amplitude difference with the conventional arrangement shown in FIG. 2, as well. Note that the frequency range of the pass band for a PCS receiving filter is 1930 MHz to 1990 MHz. In the aforementioned range, while the conventional arrangement exhibits a maximal amplitude difference of 1.50 dB, the arrangement according to the first preferred embodiment exhibits a maximal amplitude difference of about 1.23 dB, thereby improving the amplitude difference by about 0.27 dB.

Description will be made below regarding the reason why the arrangement according to the present preferred embodiment exhibits improved properties. First, the reason why the conventional arrangement having such a configuration shown in FIG. 2 exhibits deviation of amplitude difference is that the electrode fingers of the IDT 103 coupled to the IDTs 104 and 105 are grounded, but the electrode fingers of the IDT 127 coupled to the IDTs 126 and 128 define signal electrodes.

This causes a difference in frequency properties between the first surface acoustic wave filter devices 108 and the second surface acoustic wave filter devices 119, which produces a difference in the frequency properties and the phase properties between the first surface acoustic wave filter devices 108 and the second surface acoustic wave filter devices 119, resulting in a greater deviation of amplitude difference.

On the other hand, with resonator-type surface acoustic filter devices and surface acoustic wave resonators, SSBW (Surface Skimming Bulk Wave) occurs at the gap portion between the IDT electrode finger tip and the bus bar, leading to a change in the level of the resonant mode.

With the first preferred embodiment, the second surface acoustic wave filter device 219 has a smaller interval (gap) between the tips of the electrode fingers where the surface acoustic waves are generated, and the bus bar which is electrically connected to electrode fingers facing the aforementioned electrode fingers, than with the first surface acoustic wave filter device 208.

Thus, with the present preferred embodiment, deviation of the frequency properties between the first surface acoustic wave filter device 208 and the second surface acoustic wave filter device 219 is compensated for by adjusting the magnitude of the SSBW occurring on the first surface acoustic wave filter device 208 and the second surface acoustic wave filter device 219.

Thus, with the present preferred embodiment, deviations of the frequency properties between the first surface acoustic wave filter device 208 and the second surface acoustic wave filter device 219 are compensated for, thereby compensating for the amplitude difference.

Next, description will be made regarding the mechanism according to preferred embodiments of the present invention. First, surface acoustic wave devices having the configuration shown in FIG. 1 were prepared with several different intervals between the electrode finger tip and the bus bar, and the amplitude properties were measured. The measurement results are shown in FIGS. 4A and 4B.

Figure 4A:
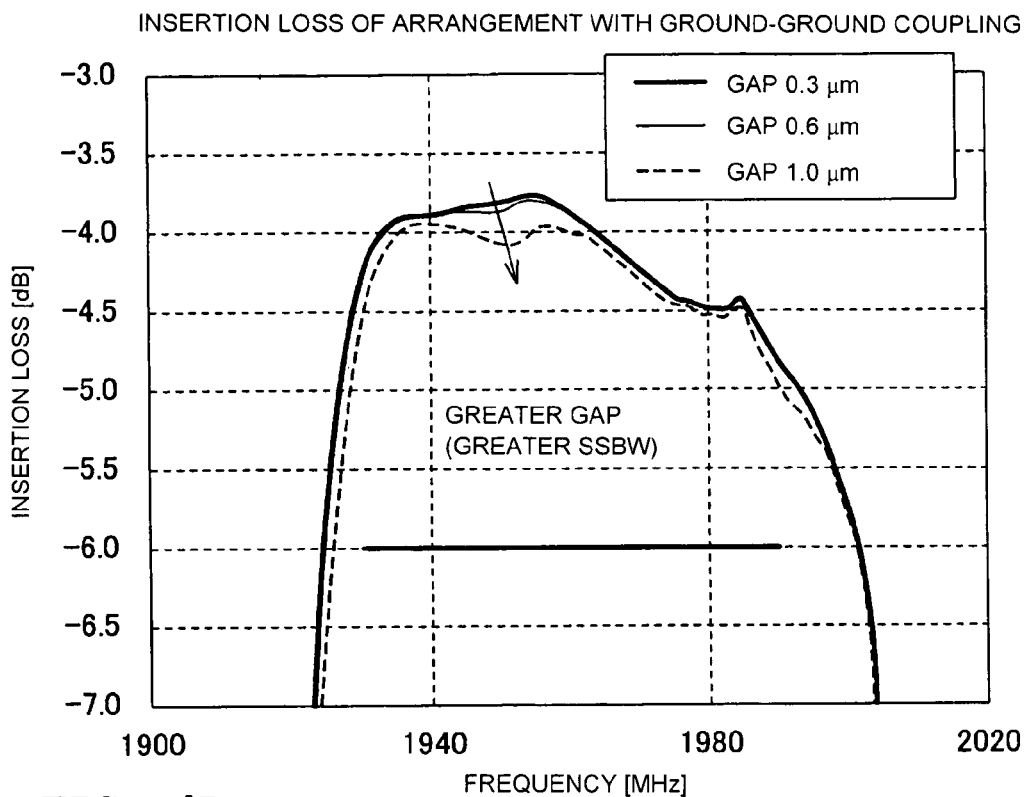

FIG. 4A shows the insertion loss of the first surface acoustic wave filter device 208 connected to the one balanced signal terminal 224, wherein the electrode fingers of the IDTs 204 and 205 connected to the balanced signal terminal 224, coupled to the IDT 203, and the electrode fingers of the IDT 203, coupled to the aforementioned electrode fingers of the IDTs 204 and 205, are grounded. On the other hand, FIG. 4B shows the insertion loss of the second surface acoustic wave filter device 219 connected to the other balanced signal terminal 225, wherein the electrode fingers of the IDTs 228 and 230 connected to the balanced signal terminal 225, coupled to the IDT 229, are grounded, but the electrode fingers of the IDT 229, coupled to the aforementioned electrode fingers of the IDTs 228 and 230, are connected to a signal electrode.

Figure 4B:
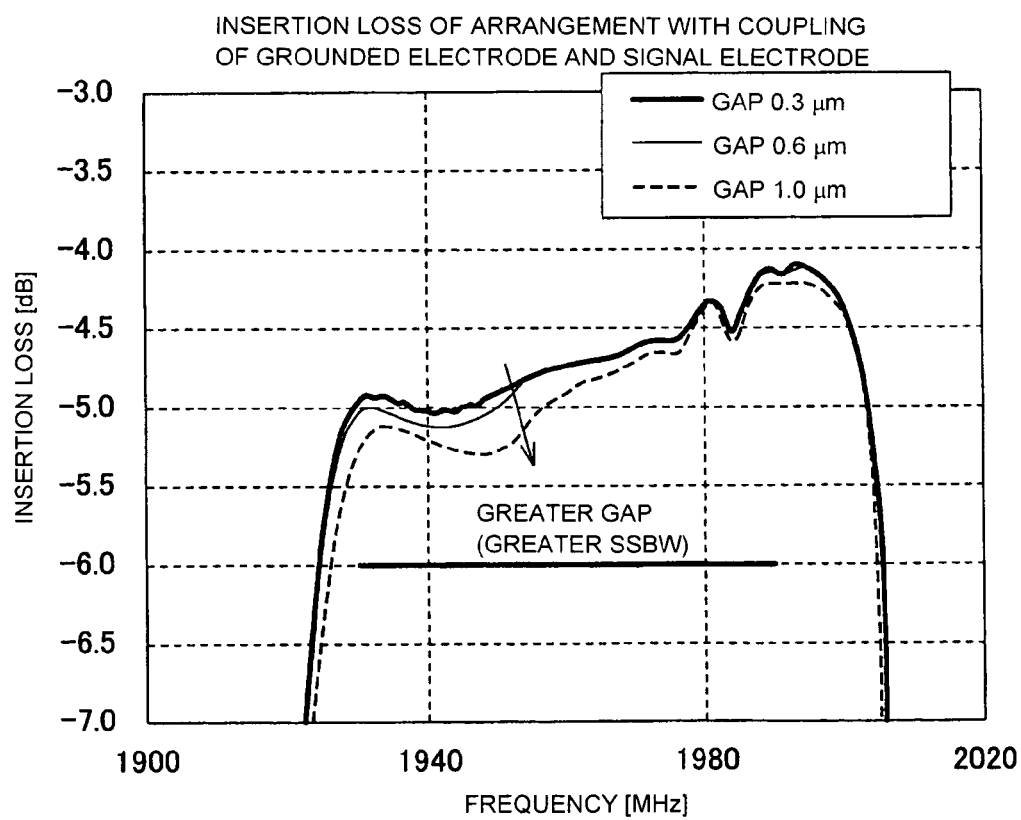

As can be understood from FIGS. 4A and 4B, changes in the interval between the electrode finger tip and the bus bar cause changes in magnitude of exited SSBW, resulting in change in insertion loss.

Figure 5:
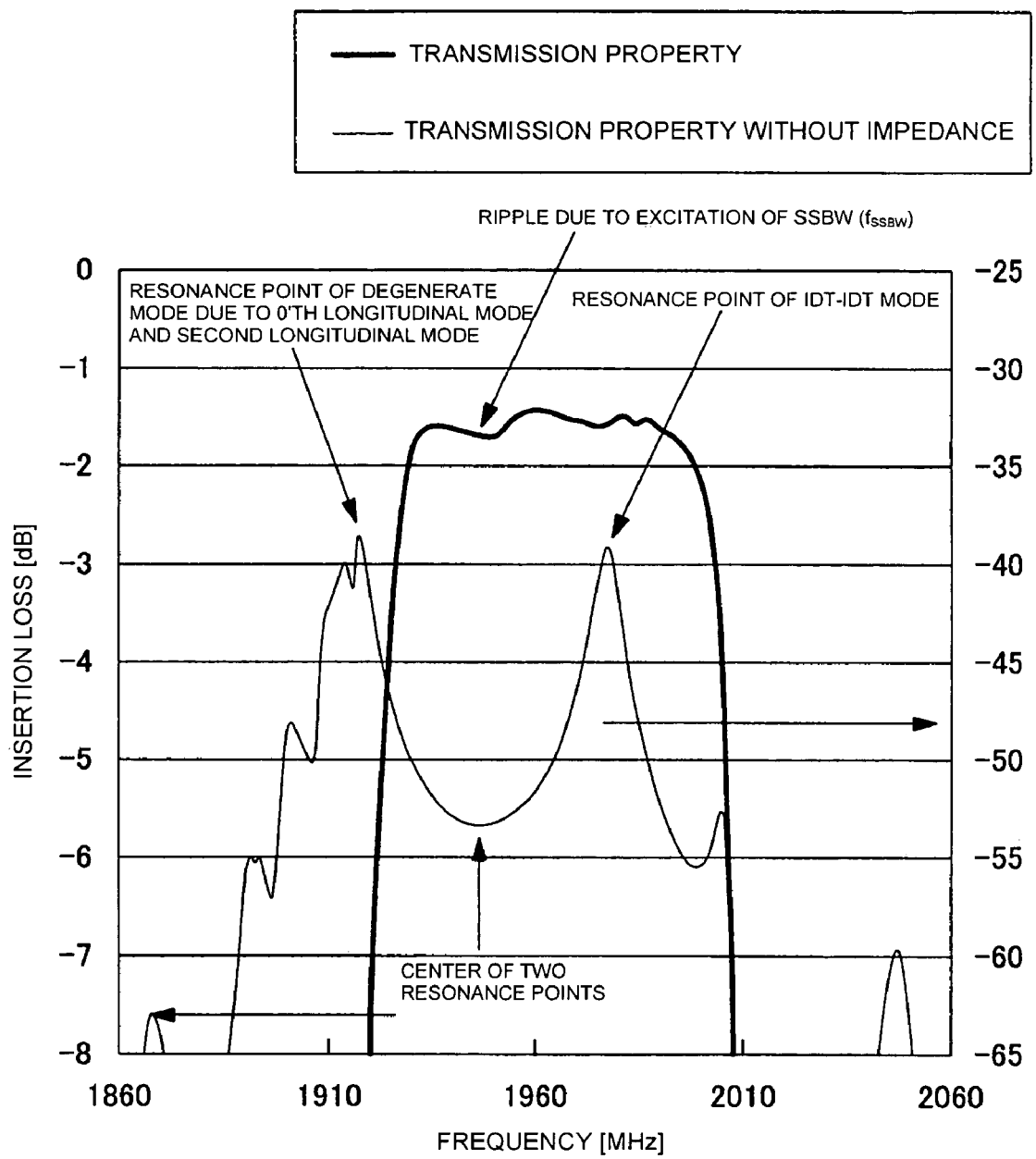
FIG. 5 is a chart for describing the SSBW occurring on the surface acoustic wave device.

FIG. 5 shows the relationship between the SSBW and the frequency properties. As shown in FIG. 5, excitation of the SSBW causes ripples around a frequency of approximately 1948 MHz which is positioned around a middle portion between the resonant point where the 0-th longitudinal mode and second longitudinal mode are degenerated, and the resonant point of the IDT-IDT mode, leading to increased ripples, resulting in increased insertion loss within the frequency band corresponding to the ripples. In most cases, excited SSBW causes occurrence of ripples as described above, and accordingly, in general cases, the SSBW is preferably suppressed. However, the surface acoustic wave device according to various preferred embodiments of the present invention has a featured configuration wherein occurrence of the SSBW is controlled so as to improve balancing of the surface acoustic wave device.

Furthermore, each IDT preferably has an interval between the electrode finger tip and the bus bar, equal to or less than about 0.55 times the wavelength ($\lambda$) of the surface acoustic wave propagating thereon, and equal to and greater than about 0.1 $\mu$m. Next, description will be made regarding the reason for this interval.

Figure 6:
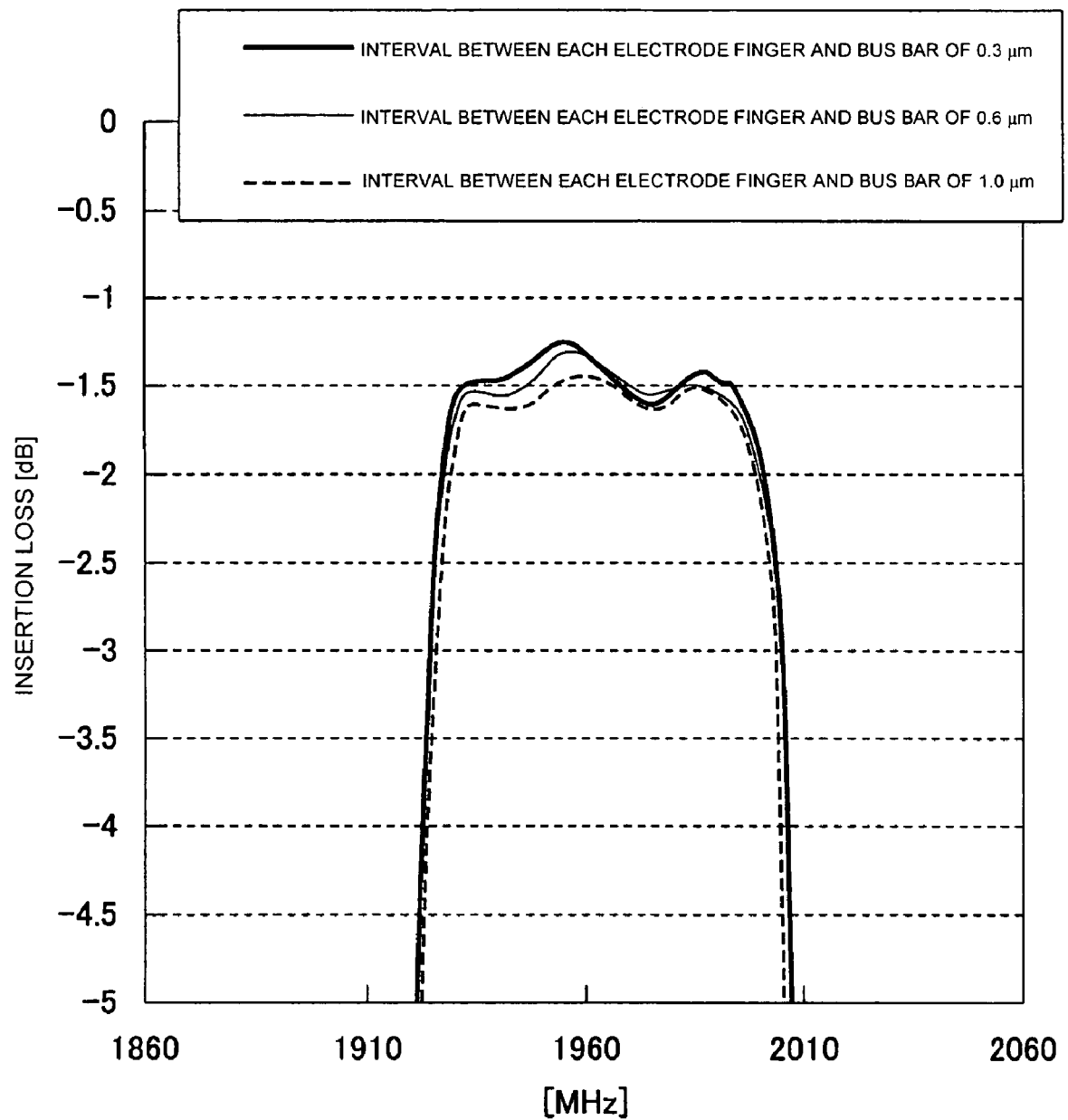
FIG. 6 is a chart which shows the relationship between the frequency and the insertion loss with various intervals (gaps) between the electrode finger tip and the bus bar of the aforementioned surface acoustic wave device according to the first preferred embodiment of the present invention.

First, FIG. 6 shows the relationship between the transmission properties and the interval between the electrode finger tip and the bus bar. As shown in FIG. 6, the IDT having an interval between the electrode finger tip and the bus bar of about 0.3 $\mu$m exhibits improved insertion loss in the vicinity of 1945 MHz, which is less than with the IDT having an interval therebetween of about 1.0 $\mu$m by approximately 0.2 dB. That is to say, it is assumed that a reduction of the interval between the electrode finger tip and the bus bar shifts the ripple frequency ($f_{SSBW}$) to the low frequency side beyond the portion around the middle portion (($f_1+f_2$)/2) between the resonance frequency wherein the 0-th longitudinal mode and the second longitudinal mode ($f_1$ or $f_2$) are degenerated, and the resonance frequency of the IDT-IDT mode ($f_2$ or $f_1$), as well as reducing ripples occurring due to excitation of bulk wave (SSBW), thereby improving the insertion loss. Note that the insertion loss is improved not only in the vicinity of the frequency of 1945 MHz corresponding to the aforementioned ripple due to the SSBW, but also over the entire frequency range. As described above, excitation of SSBW affects insertion loss not only around the frequency of 1954 MHz corresponding to the SSBW, but also over the entire frequency range, and accordingly, excitation of the SSBW is preferably suppressed in order to improve the insertion loss over the entire frequency range.

Figure 7:
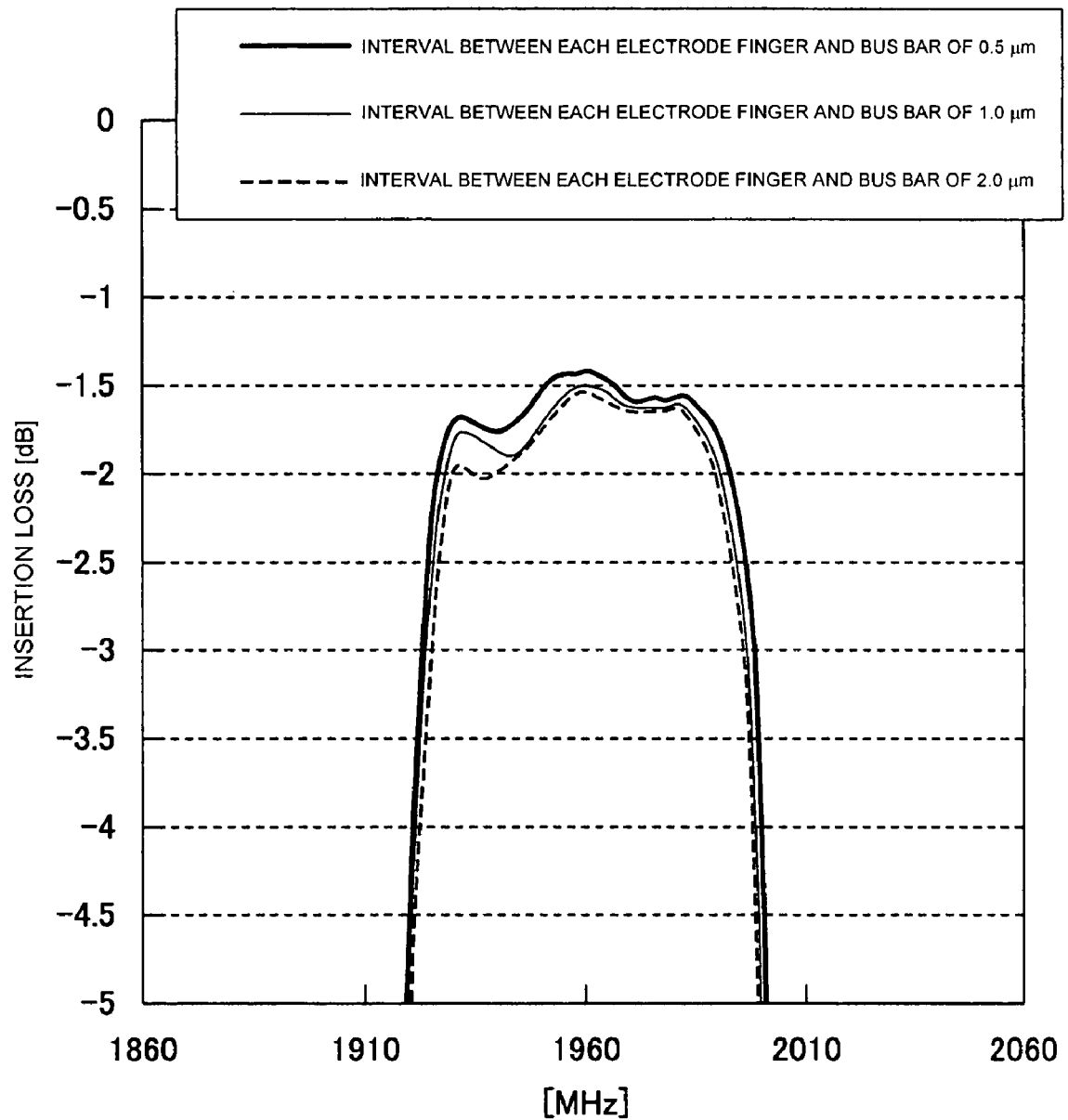
FIG. 7 is a chart which shows the relationship between the frequency and the insertion loss with further various intervals (gaps) between the electrode finger tip and the bus bar of the aforementioned surface acoustic wave device according to the first preferred embodiment of the present invention.

Next, FIG. 7 shows the transmission properties of the IDTs having intervals between the electrode finger tip and the bus bar of about 0.5 $\mu$m, about 1.0 $\mu$m, and about 2.0 $\mu$m, respectively. As shown in FIG. 7, the greater the interval between the electrode finger tip and the bus bar is, the greater the magnitude and frequency of ripples occurring due to excitation of the SSBW are, similar to FIG. 6 described above.

Figure 8:
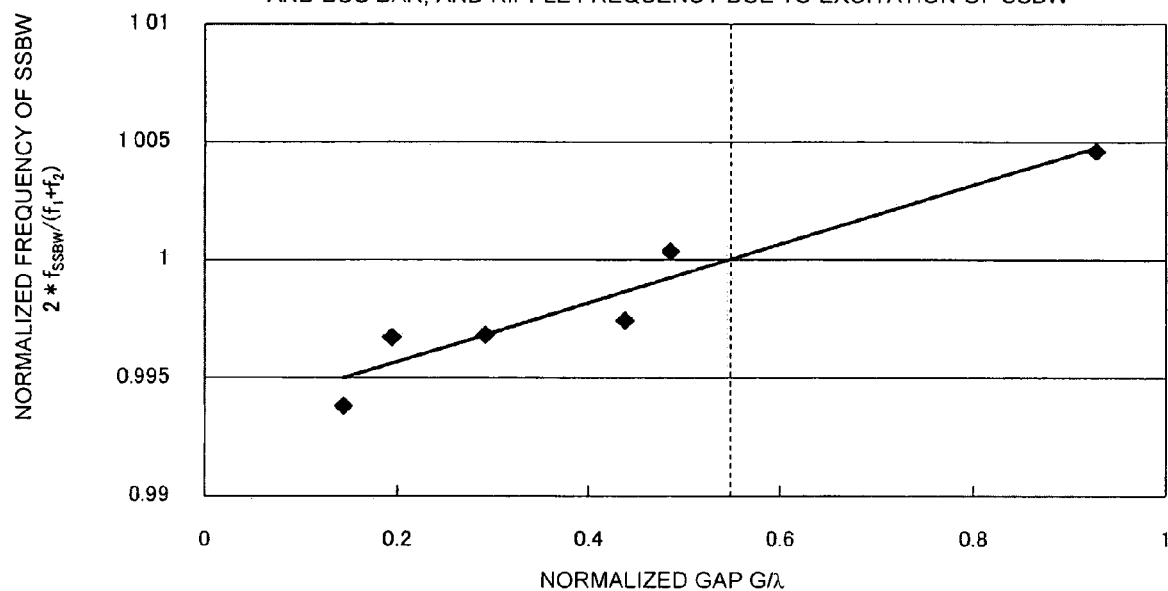
FIG. 8 is a chart which shows the relationship between the aforementioned interval (gap) and the frequency of the ripple occurring due to the excited SSBW.

Next, FIG. 8 shows the relationship between the interval between the electrode finger tip and the bus bar, and the ripple frequency ($f_{SSBW}$) due to excitation of SSBW as to the middle portion (($f_1+f_2$)/2) between the resonance frequency wherein the 0-th longitudinal mode and the second longitudinal mode ($f_1$ or $f_2$) are degenerated, and the resonance frequency of the IDT-IDT mode ($f_2$ or $f_1$), with the first preferred embodiment.

In FIG. 8, the interval between the electrode finger tip and the bus bar represented by the horizontal axis is normalized with the wavelength of the surface acoustic wave propagating thereon, and the ripple frequency ($f_{SSBW}$) due to excitation of SSBW represented by the vertical axis is normalized with the middle portion (($f_1+f_2$)/2) between the resonance frequency wherein the 0-th longitudinal mode and the second longitudinal mode ($f_1$ or $f_2$) are degenerated, and the resonance frequency of the IDT-IDT mode ($f_2$ or $f_1$), i.e., the vertical axis represents (2·($f_{SSBW}$)/($f_1+f_2$)).

As shown FIG. 8, with the surface acoustic wave device having an interval between the electrode finger tip and the bus bar equal to or less than about 0.55 times (shown by a broken line) the wavelength of the surface acoustic wave propagating thereon, the aforementioned surface acoustic wave device exhibits a lower ripple frequency ($f_{SSBW}$) due to excitation of SSBW than the middle portion (($f_1+f_2$)/2) between the resonance frequency wherein the 0-th longitudinal mode and the second longitudinal mode ($f_1$ or $f_2$) are degenerated, and the resonance frequency of the IDT-IDT mode ($f_2$ or $f_1$).

As described above, the insertion loss of the surface acoustic wave device is improved within the pass band by adjusting the frequency properties such that the ripple frequency ($f_{SSBW}$) due to excitation of SSBW is shifted from the middle portion (($f_1+f_2$)/2) wherein $f_1$ and $f_2$ denote the resonance frequencies of the two resonance modes adjacent one to another on the frequency axis.

As a method for effectively shifting the aforementioned frequency, with a single IDT, the interval between the electrode finger tip of one IDT electrode and the bus bar of the other IDT electrode is adjusted.

According to the first preferred embodiment, in particular, with a single IDT, the interval between the electrode finger tip of one IDT electrode and the bus bar of the other IDT electrode is adjusted such that the ripple frequency ($f_{SSBW}$) due to excitation of SSBW is shifted to the lower frequency side beyond the middle portion (($f_1+f_2$)/2) between the resonance frequency wherein the 0-th longitudinal mode and the second longitudinal mode ($f_1$ or $f_2$) are degenerated, and the resonance frequency of the IDT-IDT mode ($f_2$ or $f_1$), i.e., ($f_{SSBW}$)<(($f_1+f_2$)/2), producing a reduction of the ripple level, thereby effectively improving the insertion loss.

However, it has been determined that adjustment of the frequency properties of the IDT such that ($f_{SSBW}$) is greater than (($f_1+f_2$)/2) increases the ripple level, leading to deterioration in the insertion loss as compared with the IDT with the frequency properties wherein ($f_{SSBW}$) is generally the same as (($f_1+f_2$)/2).

Figure 9:
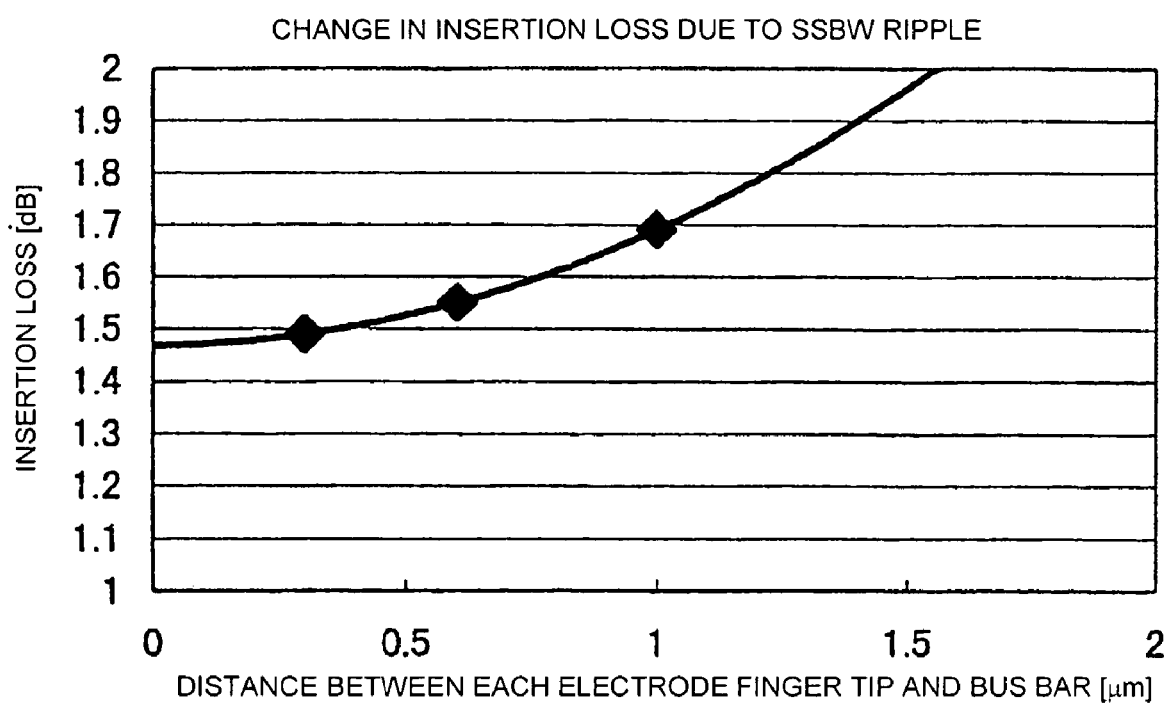
FIG. 9 is a chart which shows the relationship between the interval between the electrode finger tip and the bus bar and the insertion loss due to the ripple occurring due to the SSBW with the aforementioned surface acoustic wave device according to the first preferred embodiment.

Now, FIG. 9 shows the relationship between the interval between the electrode finger tip and the bus bar, and the insertion loss due to the ripple with the frequency of ($f_{SSBW}$) occurring due to excitation of SSBW. As shown in FIG. 9, a reduction of the interval between the electrode finger tip and the bus bar effectively improves the insertion loss due to the ripple occurring due to excitation of the SSBW.

Figure 10:
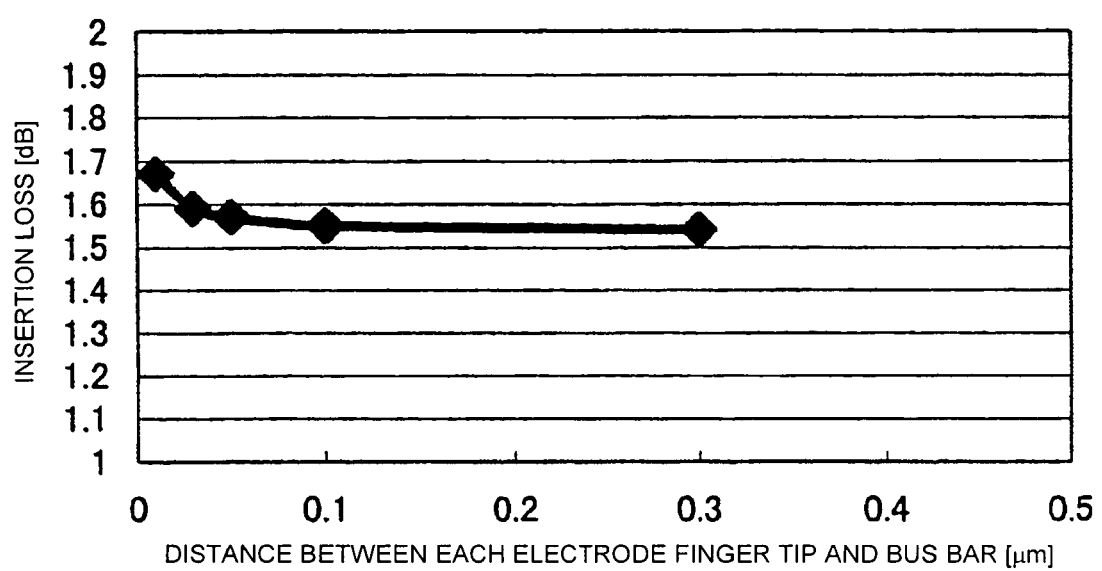
FIG. 10 is a chart which shows the relationship between the interval between the electrode finger tip and the bus bar and the insertion loss with the aforementioned surface acoustic wave device according to the first preferred embodiment.

However, a reduction of the interval between the electrode finger tip and the bus bar leads to a problem in that the parasitic capacitance increases between the electrode finger tip and the bus bar. The parasitic capacitance may leads to deterioration in the insertion loss. FIG. 10 shows the relationship between the interval between the electrode finger tip and the bus bar, and the insertion loss due to parasitic capacitance, wherein the parasitic capacitance has been calculated with the finite element method. As clearly shown in FIG. 10, when the interval between the electrode finger tip and the bus bar is less than about 0.1 μm, the parasitic capacitance is rapidly increased between the electrode finger tip and the bus bar, which leads to deterioration in the insertion loss.

Figure 11:
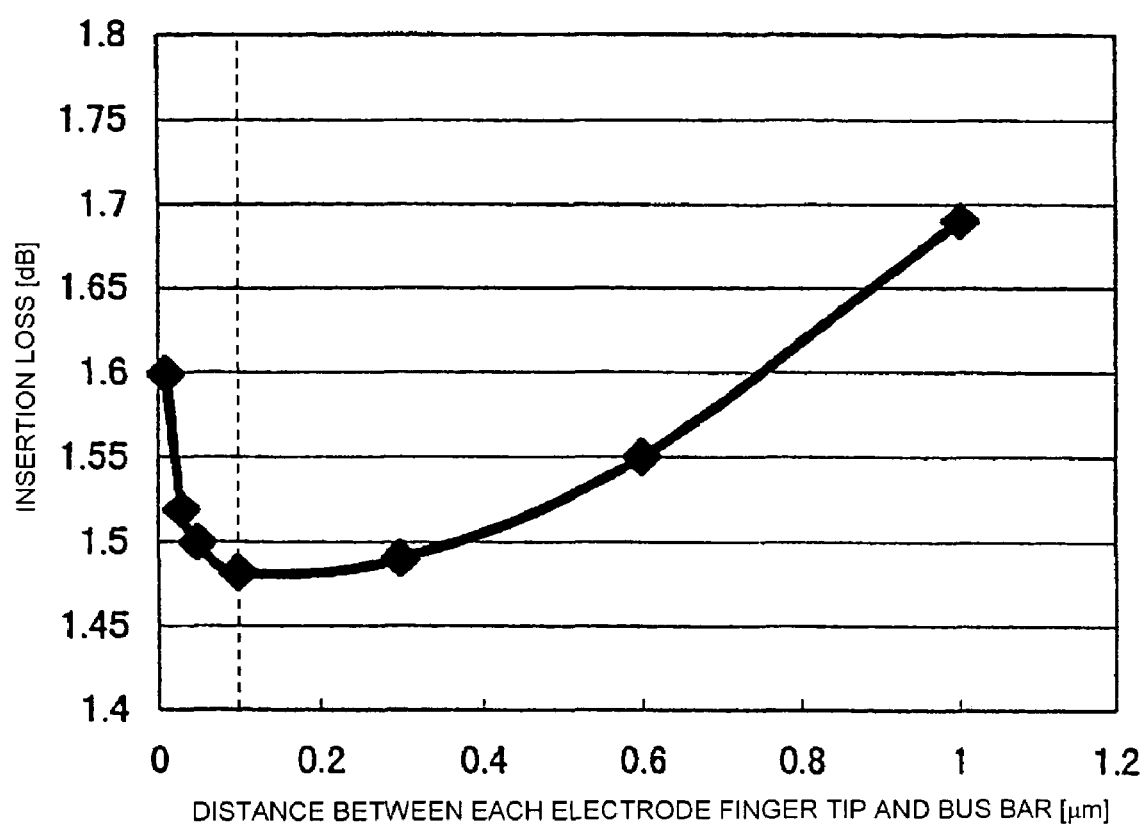
FIG. 11 is another chart which shows the relationship between the interval between the electrode finger tip and the bus bar and the insertion loss with the aforementioned surface acoustic wave device according to the first preferred embodiment.

FIG. 11 shows the relationship between the interval between the electrode finger tip and the bus bar, and the insertion loss due to parasitic capacitance, wherein the insertion loss includes both the effects caused the ripple occurring due to excitation of the SSBW shown in FIG. 9, and the effects caused parasitic capacitance shown in FIG. 10. As described above, the IDT having a narrow interval between the electrode finger tip and the bus bar, particularly an interval therebetween equal to or less than about 0.55 times the wavelength of the surface acoustic wave propagating thereon, exhibits reduced ripples due to excitation of the SSBW. However, as clearly shown in FIG. 11, an IDT having an interval between the electrode finger tip and the bus bar less than about 0.1 μm exhibits a greater deterioration in the insertion loss due to increased parasitic capacitance than the improvement of insertion loss produced by the reduced ripples from the SSBW. As a result, this leads to deterioration in the insertion loss over the entire range.

Accordingly, it has been determined that the IDTs preferably have an interval of about 0.1 μm or more and equal to or less than about 0.55 times the wavelength of the surface acoustic wave propagating thereon. This design of IDTs is effectively incorporated in the same way for other preferred embodiments which are described later.

As described above, changes in the interval between the electrode finger tip and the bus bar produce changes in excitation of the SSBW, and changes in the parasitic capacitance. Accordingly, with a practical formation of IDTs of metal thin films on a piezoelectric substrate, precise control of the IDT thickness and the electrode-finger line width must be performed, which have been performed in conventional arrangements, but also precise control of the interval between the electrode finger tip and the bus bar must be performed, in order to obtain stable electric properties.

In general, the IDT is formed using photolithography with the wavelength of the light from the exposure light source of about 0.2 μm to about 0.4 μm. Accordingly, it is difficult to perform precise control of the gap width of the IDT electrode about 0.5 μm or less due to diffraction effects of the light.

However, reduction of the IDT electrode size is advancing due to properties-related advantages. With the surface acoustic wave device according to various preferred embodiments of the present invention, the IDT electrode is preferably formed such that the interval between the electrode finger tip and the bus bar and the minimal gap between the electrode fingers have generally the same as the wavelength of the light from the exposure light source, so as to produce improved performance. Accordingly, with the present preferred embodiment, the IDT is formed such that both the interval between the electrode finger tip and the bus bar and the minimal gap between the electrode fingers are generally the same as each other, which enables precise control of both, thereby enabling the surface acoustic wave device to exhibit more stable electric properties.

With the surface acoustic wave device according to the present preferred embodiment, the IDT is formed such that the interval between the electrode finger tip and the bus bar and the minimal gap between the electrode fingers are the same as each other, and accordingly, the surface acoustic wave device does not include any narrow gaps, thereby further improving surge-withstanding capabilities and voltage-withstanding capabilities.

Furthermore, the surface acoustic wave device according to various preferred embodiments of the present invention preferably has a configuration wherein the surface acoustic wave filters and the IDTs included in the circuit connected to one of the balanced signal terminals are configured so as to exhibit great excitation of the SSBW, and the surface acoustic wave filters and the IDTs included in the circuit connected to the other balanced signal terminal are formed so as to produce small excitation of the SSBW. Furthermore, the circuit having a configuration wherein the electrode fingers of the IDT electrodes coupled one to another are grounded exhibits improved insertion loss on the low frequency side, and the circuit having a configuration wherein with the electrode fingers of the IDT electrodes coupled one to another, the electrode fingers of one IDT electrode are grounded, and the electrode fingers of the other IDT electrode are connected to a signal electrode, exhibits improved insertion loss on the high frequency side.

On the other hand, the SSBW causes deterioration of the insertion loss on the low frequency side within the pass band. The smaller the gap between the bus bar and the electrode finger tip on the filter portion, the smaller the deterioration in the insertion loss due to the SSBW is, as well as shifting the deterioration in the insertion loss due to the SSBW to the low frequency side (see FIG. 6).

The addition of a dummy electrode to the surface acoustic wave device portion of the surface acoustic wave filter device reduces the aforementioned deterioration in the insertion loss due to the SSBW, as well as shifting the deterioration to the low frequency side (see FIG. 6). Thus, the surface acoustic wave filter device is preferably designed as follows. The design described below is advantageous for other preferred embodiments described later, as well.

With the surface acoustic wave device having a configuration wherein with the surface acoustic wave filter connected to one of the balanced signal electrodes, all of the electrode fingers of the IDTs coupled one to another are grounded, and with the surface acoustic wave filter connected to the other balanced signal electrode, of the electrode fingers of the IDTs coupled one to another, the electrode fingers of one of the coupled IDTs are grounded, and the electrode fingers of the other IDT are connected to the signal electrode, (1) With the surface acoustic wave filter having a configuration wherein all the electrode fingers of the IDTs coupled one to another are grounded, the IDTs are designed such that the gap between the bus bar and the electrode finger tip is increased on the surface acoustic wave filter portion so as to increase excitation of the SSBW (or with the surface acoustic wave filter having a configuration wherein with the electrode fingers of the IDTs coupled one to another, wherein the electrode fingers of one of the coupled IDTs are grounded, and the electrode fingers of the other IDT are connected to the signal electrode, the IDTs are designed such that the gap between the bus bar and the electrode finger tip is reduced on the surface acoustic wave filter portion so as to suppress excitation of the SSBW).

(2) With the surface acoustic wave filter having a configuration wherein all the electrode fingers of the IDTs coupled one to another are grounded, the IDTs are designed so as to include a small-sized dummy electrode in order to produce increased excitation of the SSBW or with the surface acoustic wave filter having a configuration wherein with the electrode fingers of the IDTs coupled one to another, wherein the electrode fingers of one of the coupled IDTs are grounded, and the electrode fingers of the other IDT are connected to the signal electrode, the IDTs are designed so as to include a large-sized dummy electrode in order to produce reduced excitation of the SSBW. At the same time, fluctuation of the amplitude balancing is suppressed.

Note that the SSBW readily combines with the transverse mode wave. Accordingly, changes in the transverse mode properties causes changes in the combination of the SSBW and the transverse mode wave, leading to changes in excitation of the SSBW. That is to say, excitation of the SSBW is controlled by adjusting the transverse mode properties, thereby obtaining the advantages according to preferred embodiments of the present invention, as well.

Figure 12:
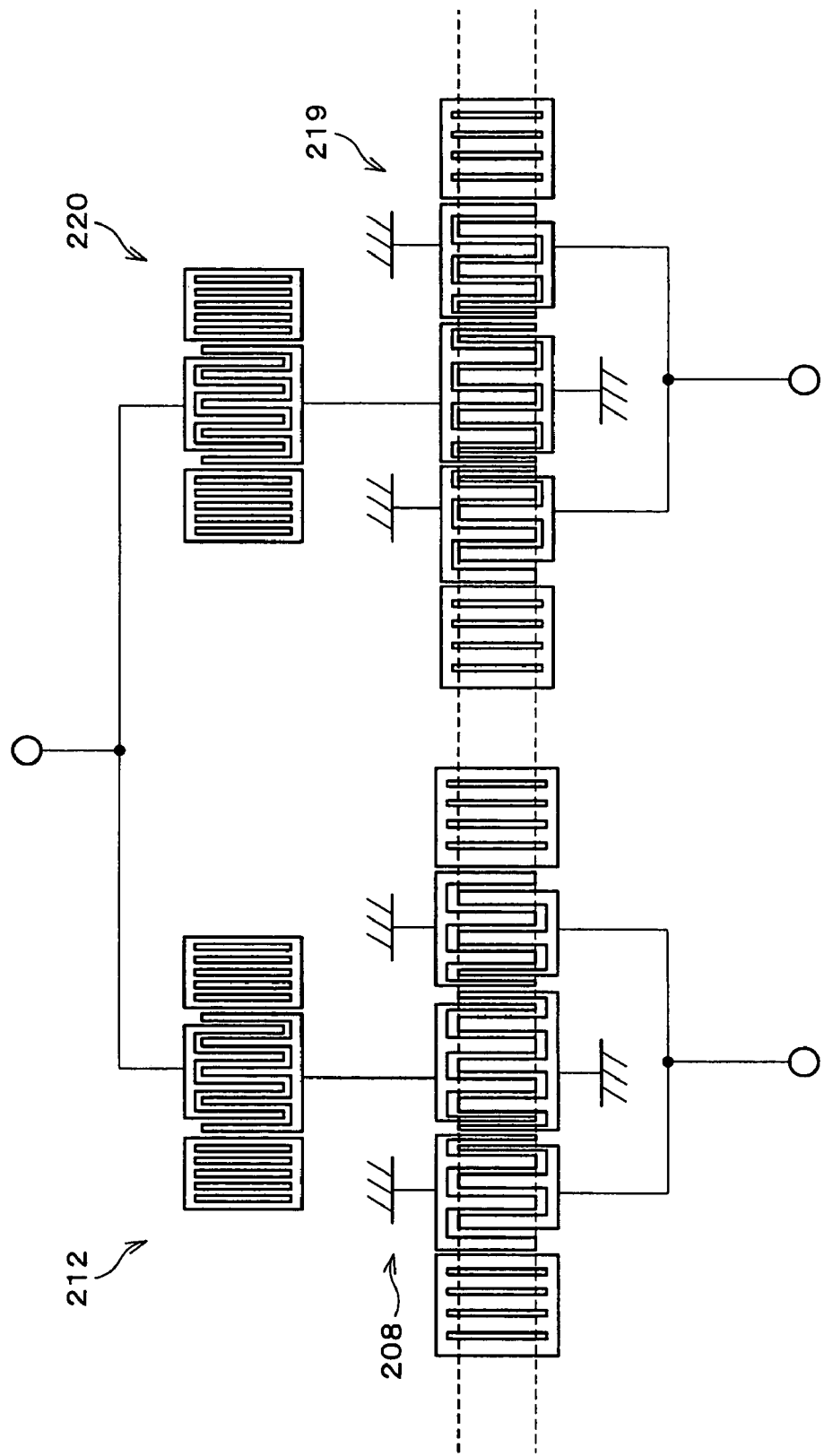
FIG. 12 is a configuration diagram which shows a modification according to the aforementioned first preferred embodiment of the present invention.
Figure 13:
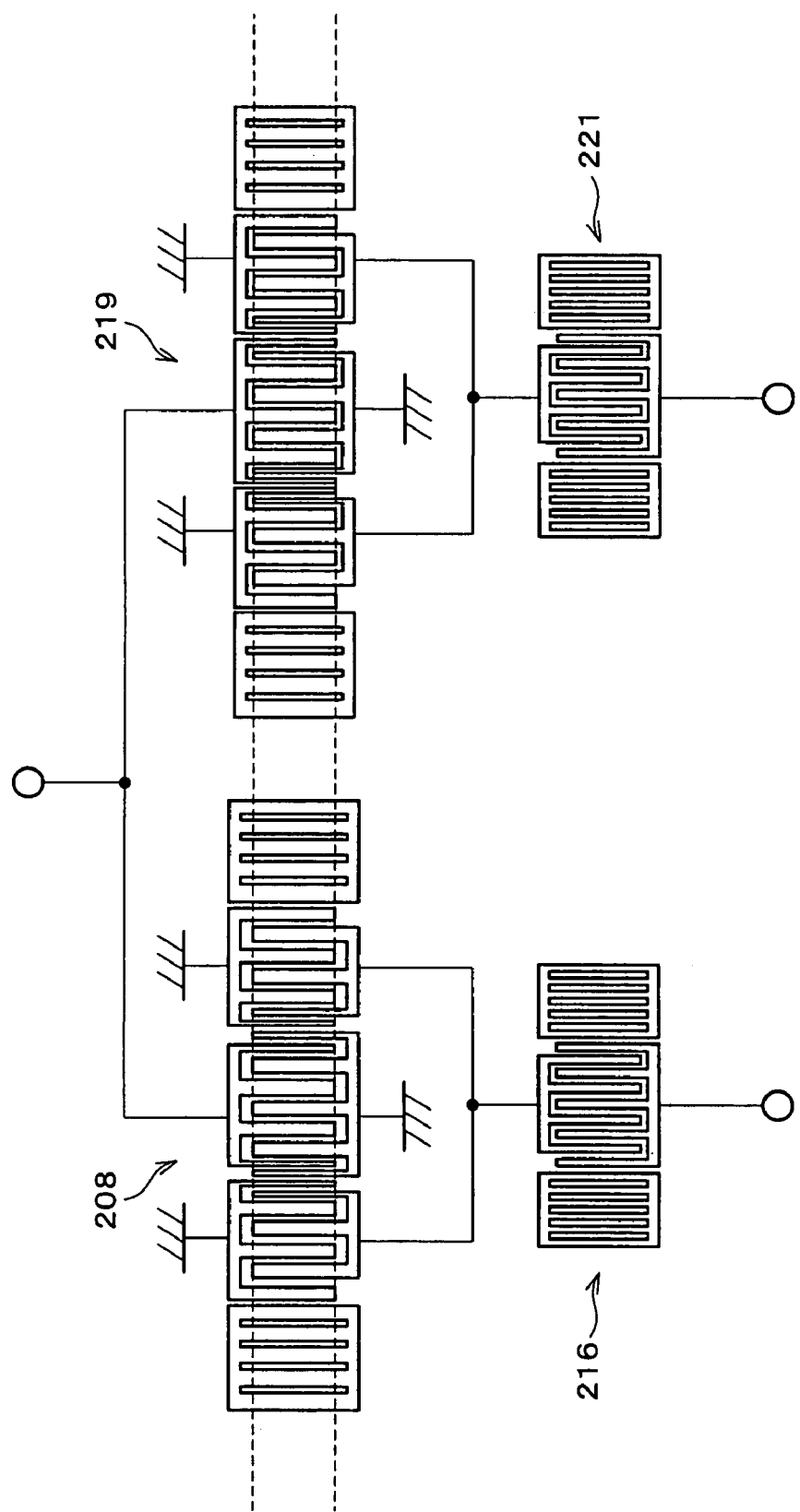
FIG. 13 is a configuration diagram which shows another modification according to the aforementioned first preferred embodiment of the present invention.
Figure 14:
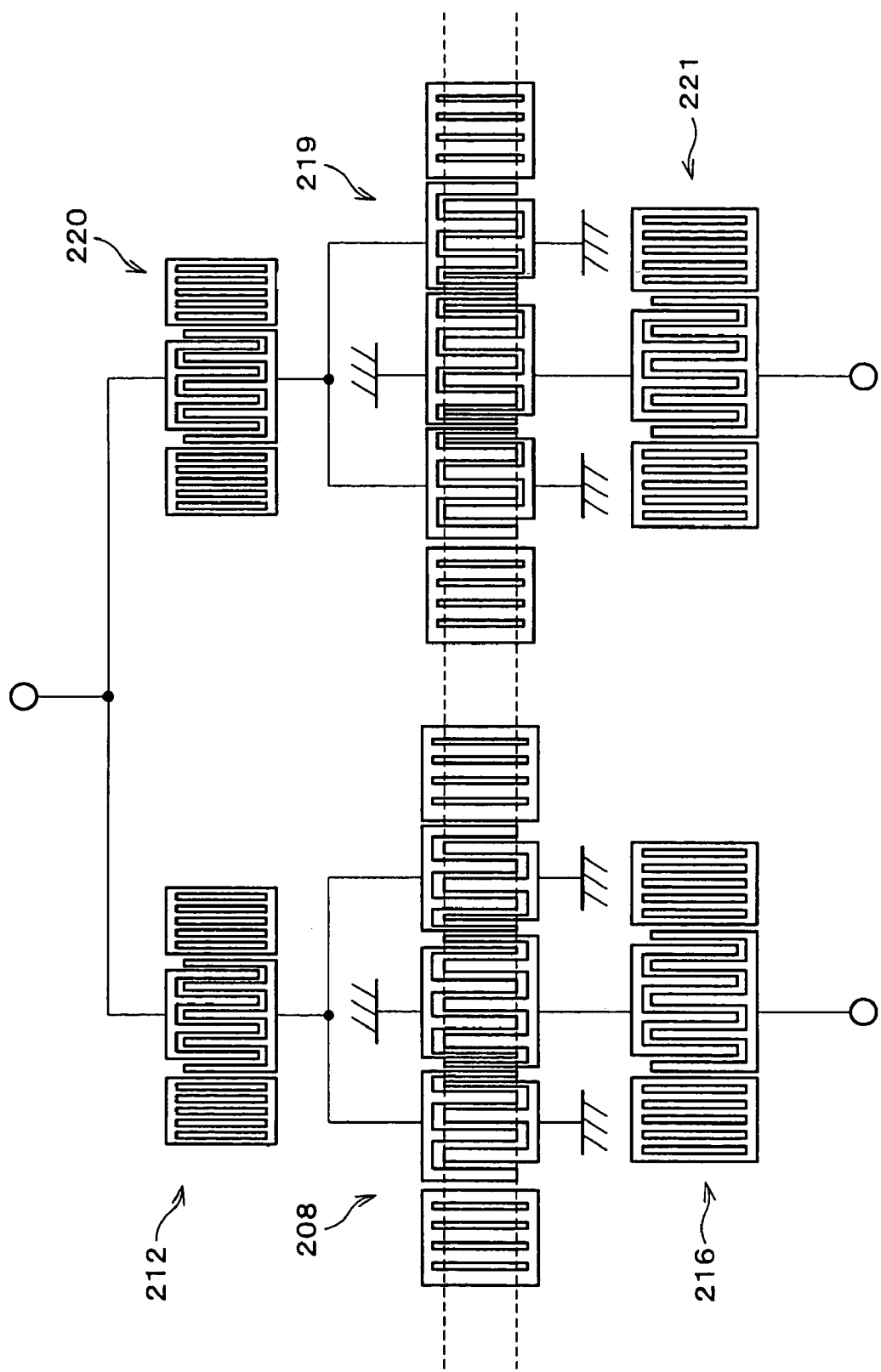
FIG. 14 is a configuration diagram which shows yet another modification according to the aforementioned first preferred embodiment of the present invention.

Note that while description has been made in the first preferred embodiment regarding a configuration wherein each of the first and second surface acoustic wave filter devices 208 and 219, which are preferably 3-IDT longitudinally coupled-resonator type surface acoustic wave devices, are serially connected to a single-port surface acoustic wave resonator on the input side and another single-port surface acoustic wave resonator on the output side, an arrangement according to the present invention is not restricted to the above-described configuration, and the present invention may be applied to the surface acoustic wave device including balanced signal terminals, regardless of the configuration thereof, which produces the same advantages. For example, the present invention may be applied to a configuration wherein each of the first and second surface acoustic wave filter devices 208 and 219, which are 3-IDT longitudinally coupled-resonator type surface acoustic wave devices, are serially connected to a single-port surface acoustic wave resonator only on the input side (unbalanced signal terminal side) as shown in FIG. 12, which produces the same advantages, as well. Furthermore, the present invention may be applied to a configuration wherein each of the first and second surface acoustic wave filter devices 208 and 219, which are 3-IDT longitudinally coupled-resonator type surface acoustic wave devices, are serially connected to a single-port surface acoustic wave resonator only on the output side (balanced signal terminal side) as shown in FIG. 13, which produces the same advantages, as well.

Furthermore, while description has been made in the first preferred embodiment regarding a configuration wherein with each of the first and second surface acoustic wave filter devices 208 and 219, which are 3-IDT longitudinally coupled-resonator type surface acoustic wave devices, the IDTs disposed at the middle portion are connected to the input terminal (unbalanced signal terminal), and the IDTs disposed on the left and the right sides of the IDT at the middle portion are connected to the output terminals (balanced signal terminals), the present invention may be applied to a configuration wherein with each of the first and second surface acoustic wave filter devices 208 and 219, which are 3-IDT longitudinally coupled-resonator type surface acoustic wave devices, the IDTs disposed at the middle portion are connected to the output terminals (balanced signal terminals), and the IDTs disposed on the left and the right sides of the IDT at the middle portion are connected to the input terminals (unbalanced signal terminal), for example, which produces the same advantages, as well.

Figure 15:
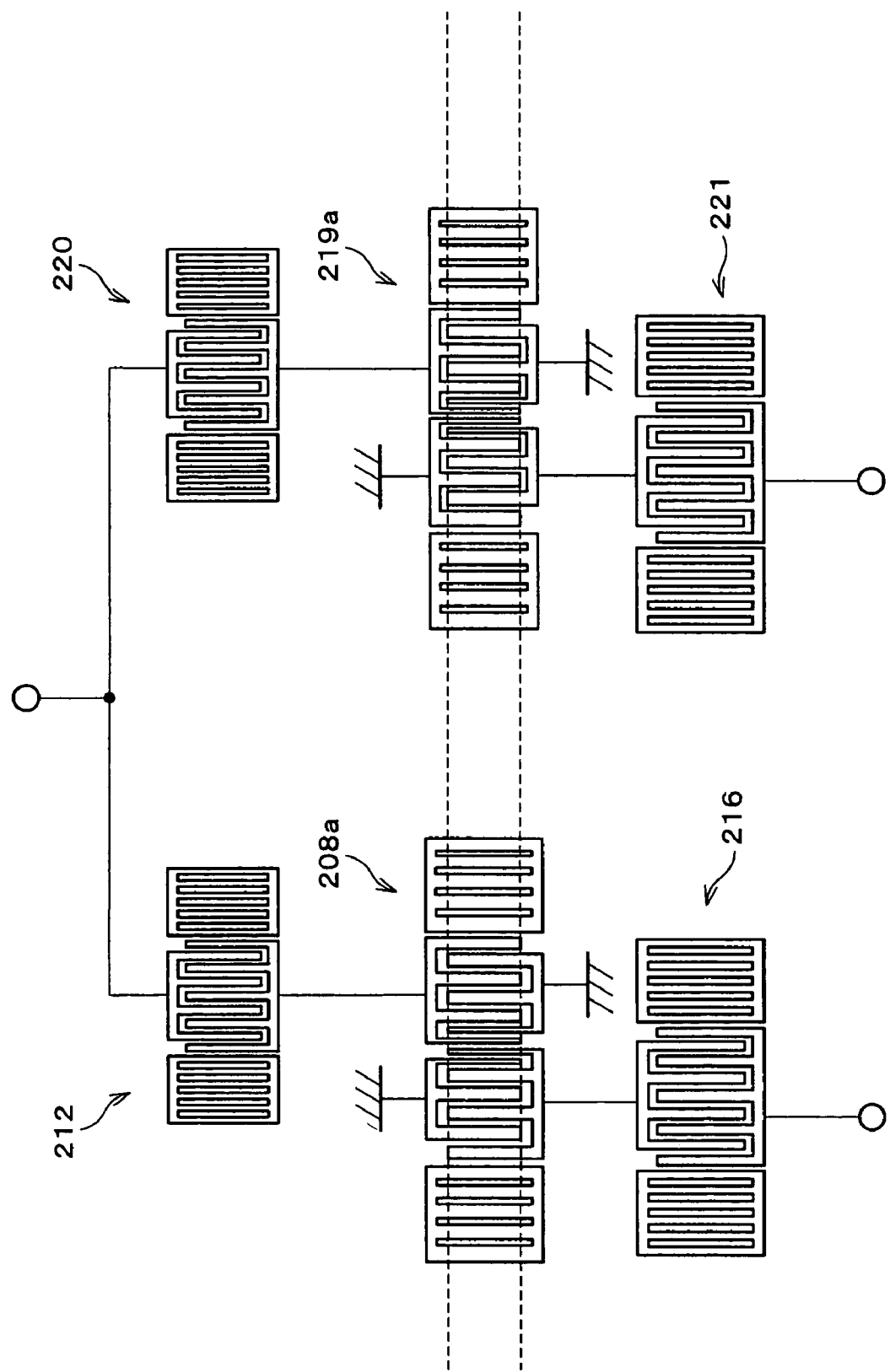
FIG. 15 is a configuration diagram which shows yet another modification according to the aforementioned first preferred embodiment of the present invention.
Figure 16:
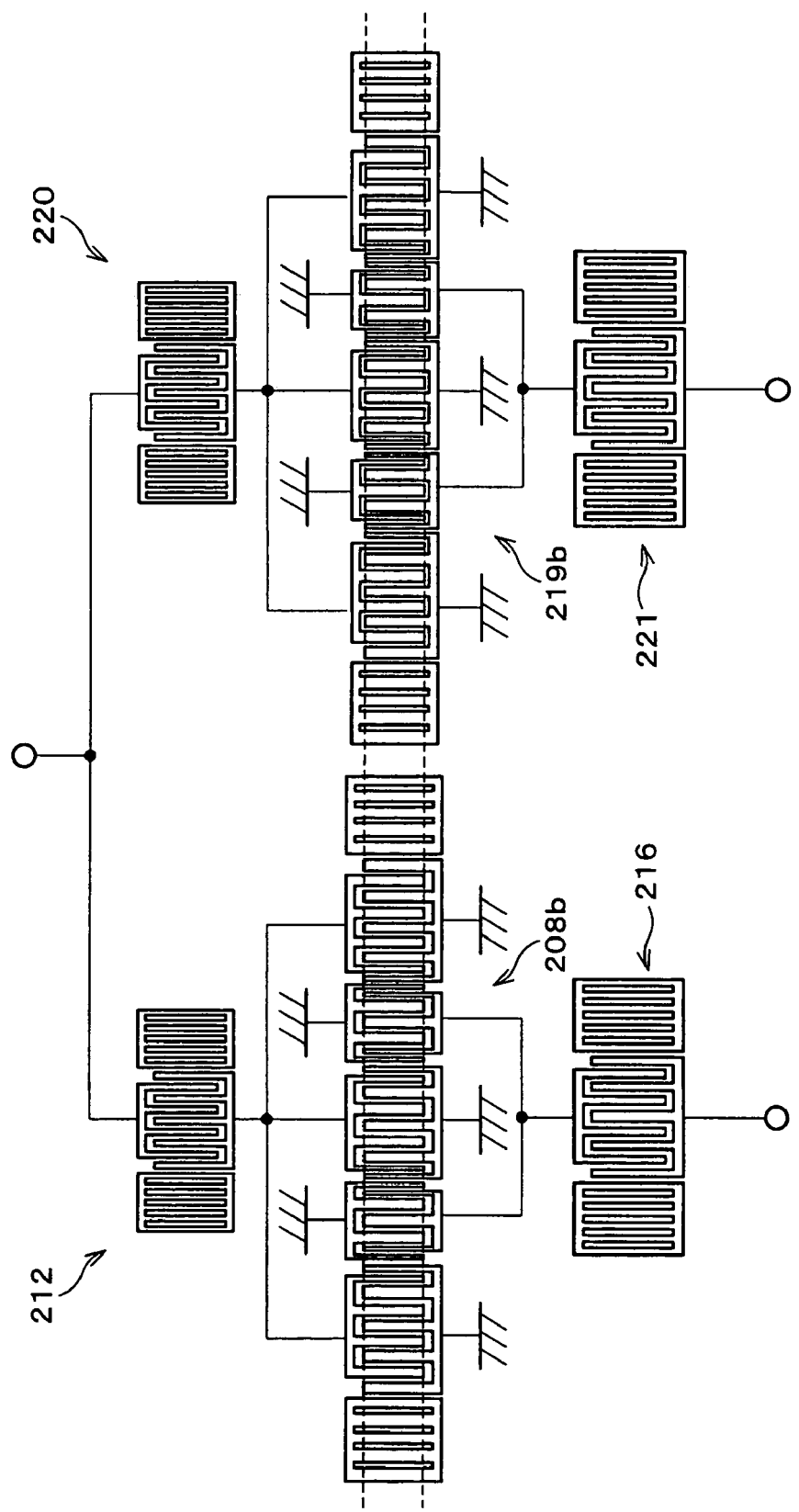
FIG. 16 is a configuration diagram which shows yet another modification according to the aforementioned first preferred embodiment of the present invention.

Furthermore, while description has been made in the first preferred embodiment regarding a configuration wherein each of the first and second surface acoustic wave filter devices 208 and 219 include a 3-IDT longitudinally coupled-resonator type surface acoustic wave device, the present invention may be applied to a configuration wherein each of first and second surface acoustic wave filter devices 208a and 219a, corresponding to the first and second surface acoustic wave filter devices 208 and 219, respectively, include a 2-IDT longitudinally coupled-resonator type surface acoustic wave device as shown in FIG. 15, and furthermore, the present invention may be applied to a configuration wherein each of first and second surface acoustic wave filter devices 208b and 219b, corresponding to the first and second surface acoustic wave filter devices 208 and 219, respectively, include a 5-IDT longitudinally coupled-resonator type surface acoustic wave device as shown in FIG. 16, each of which produce the same advantages, as well.

Figure 17:
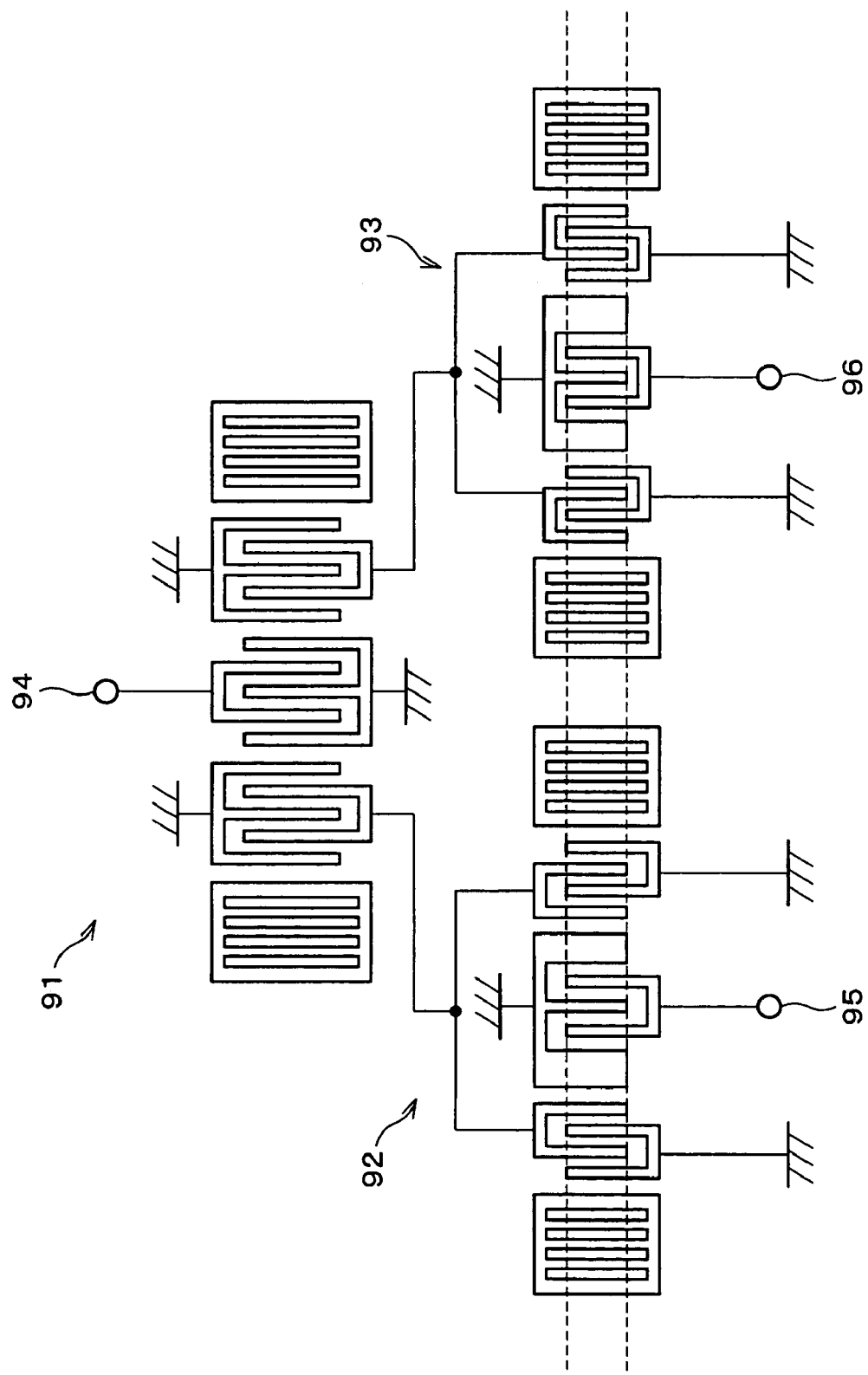
FIG. 17 is a configuration diagram which shows yet another modification according to the aforementioned first preferred embodiment of the present invention.

Furthermore, with the present preferred embodiment, as shown in FIG. 17, the present invention may be applied to an arrangement including three surface acoustic wave filter devices 91, 92, and 93, each of which includes two or more IDTs, wherein the surface acoustic wave filter device 91 is connected to an unbalanced signal terminal 94, and each of the other two surface acoustic wave filter devices 92 and 93 are connected to the surface acoustic wave filter device 91 in parallel, while also being connected to the balanced signal terminals 95 and 96, respectively, which produces the same advantages, as well.

Figure 18:
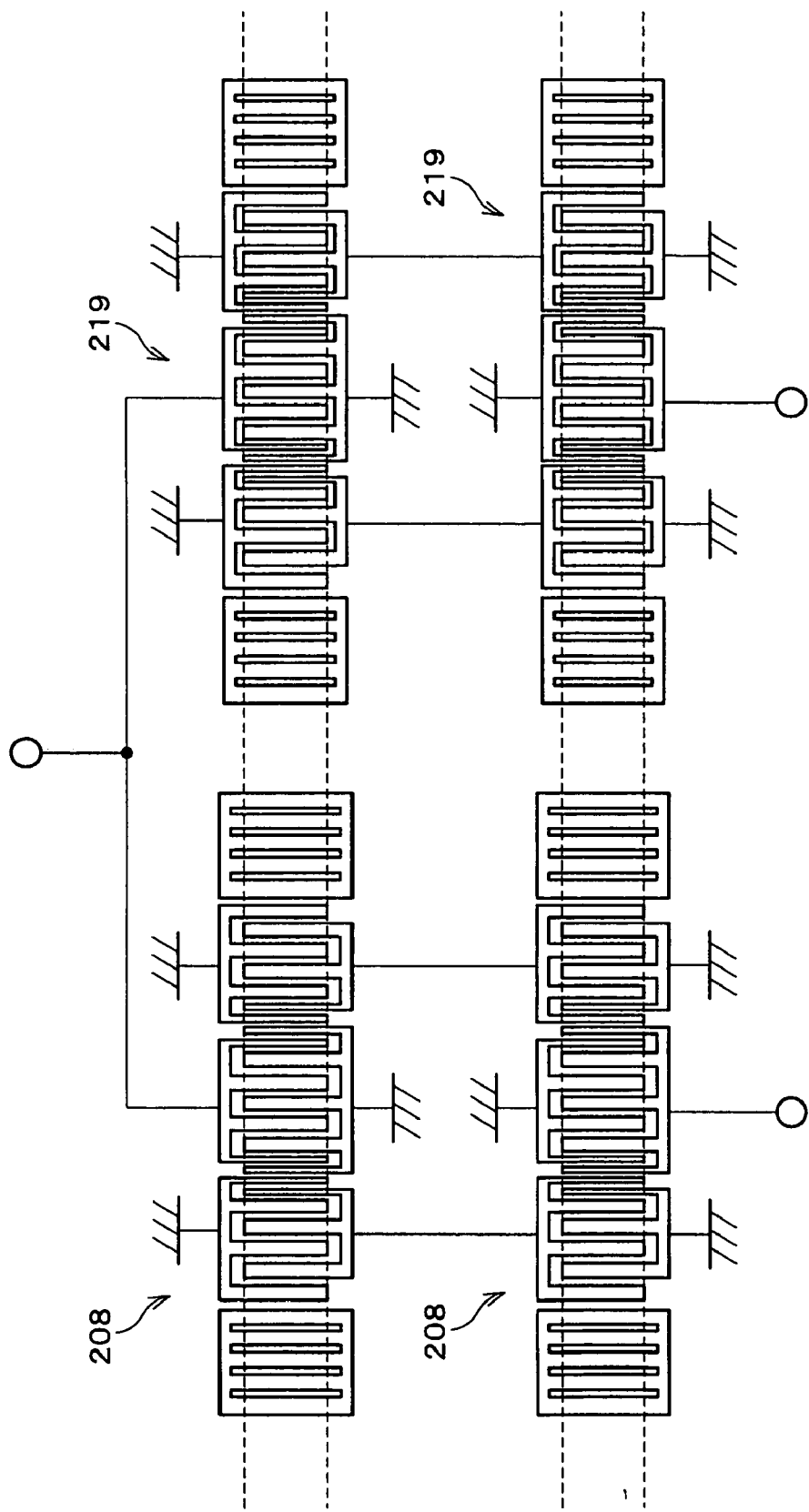
FIG. 18 is a configuration diagram which shows yet another modification according to the aforementioned first preferred embodiment of the present invention.

Furthermore, while description has been made in the first preferred embodiment regarding an arrangement wherein each of the first and second surface acoustic wave filter devices 208 and 219 includes a single 3-IDT longitudinally coupled-resonator type surface acoustic wave device, the present invention may be applied to an arrangement wherein each of the first and second surface acoustic wave filter devices 208 and 219 include two 3-IDT longitudinally coupled-resonator type surface acoustic wave devices connected serially as shown in FIG. 18, for example, which produces the same advantages, as well.

Figure 19:
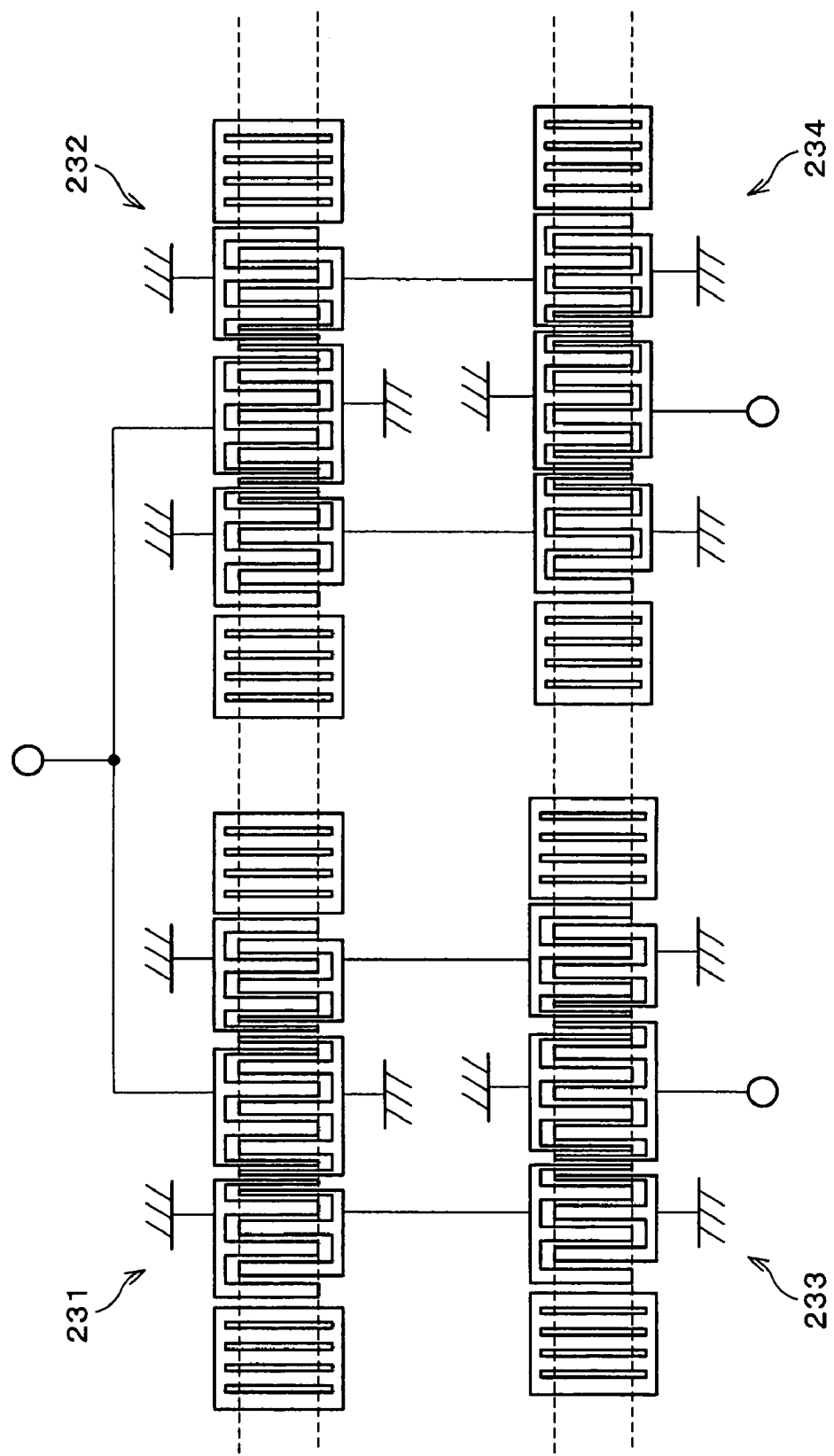
FIG. 19 is a configuration diagram which shows yet another modification according to the aforementioned first preferred embodiment of the present invention.

Furthermore, as shown in FIG. 19, the present invention may be applied to an arrangement having the same configuration as that shown in FIG. 18 described above, except that the surface acoustic wave filter devices 231 and 232 are configured to have the same interval between the tip of the IDT electrode fingers and the bus bar connected to the electrode fingers facing the aforementioned electrode fingers while the surface acoustic wave filter devices 233 and 234 are configured to have different intervals between the tip of the IDT electrode fingers and the bus bar connected to the electrode fingers facing the aforementioned electrode fingers, which produces the same advantages, as well.

Figure 20:
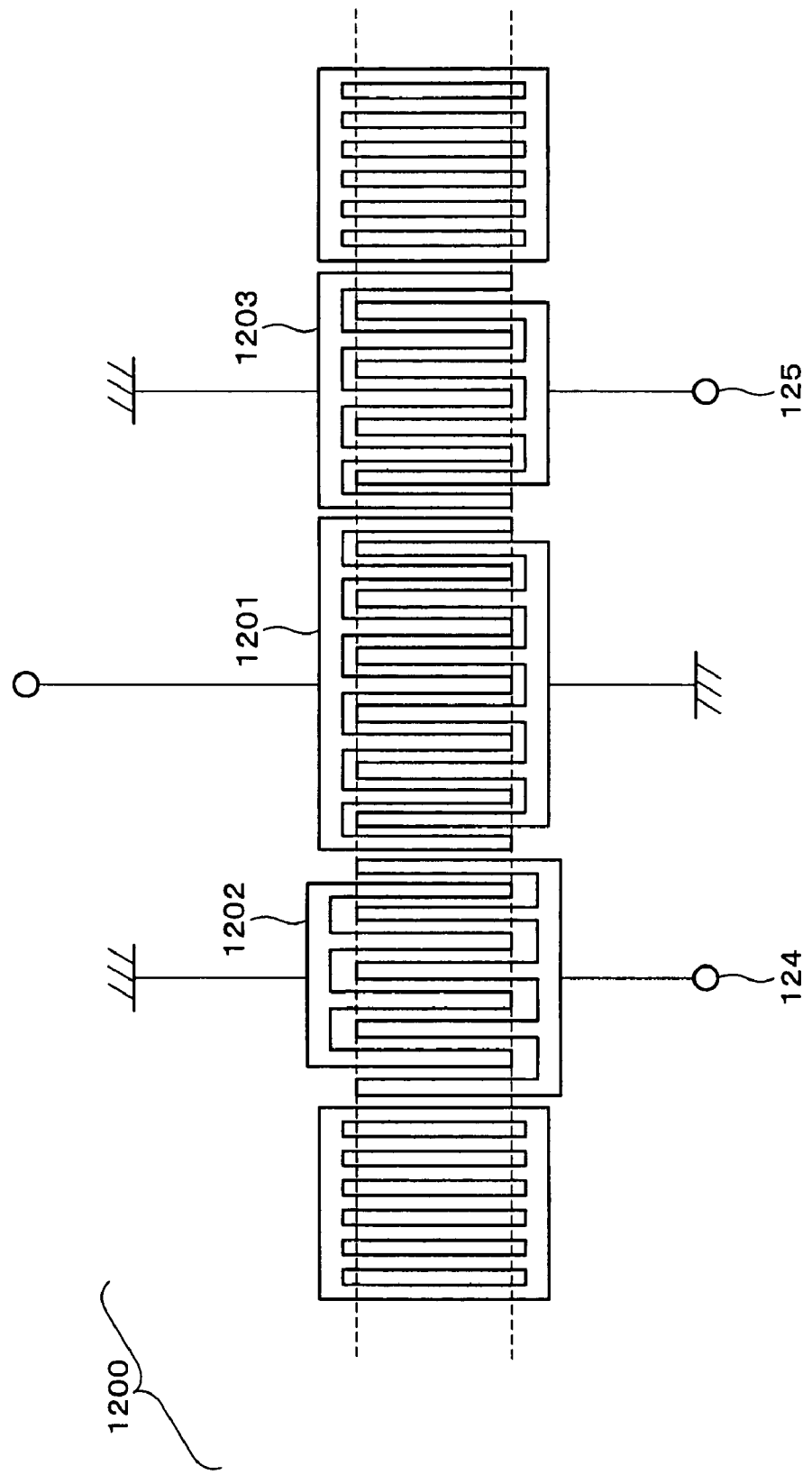
FIG. 20 is a configuration diagram which shows yet another modification according to the aforementioned first preferred embodiment of the present invention.

Furthermore, as shown in FIG. 20, the present invention may be applied to a surface acoustic wave device 1200 having a balance-unbalance conversion function, including at least three IDTs, wherein the balanced signal terminals 124 and 125 are connected to IDTs 1202 and 1203, respectively, and the IDTs 1202 and 1203 are configured to have different intervals between the electrode finger tip and the bus bar, which produces the same advantages, as well.

Figure 21:
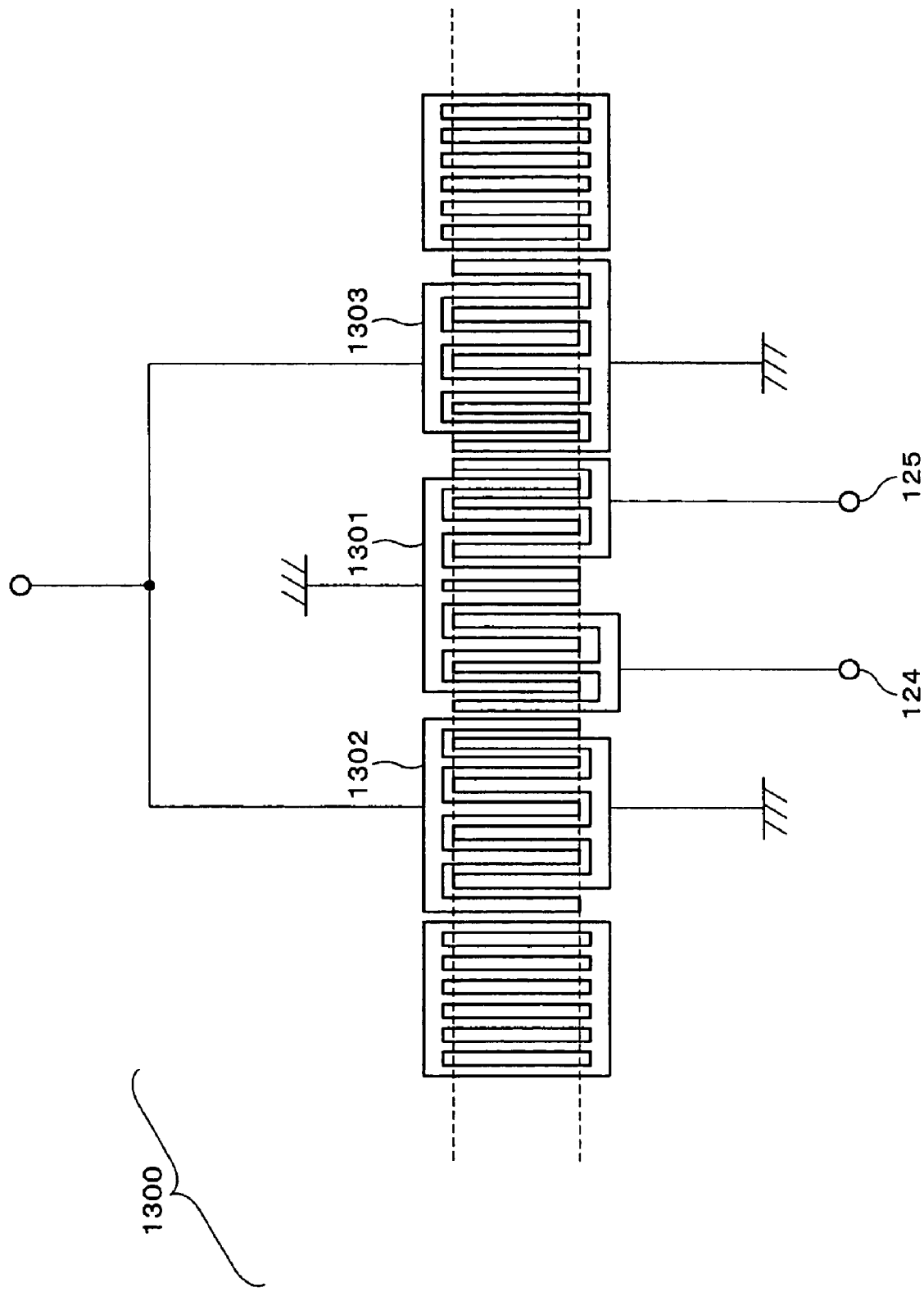
FIG. 21 is a configuration diagram which shows yet another modification according to the aforementioned first preferred embodiment of the present invention.

Furthermore, as shown in FIG. 21, the present invention may be applied to a surface acoustic wave device 1300 having a balance-unbalance conversion function, including three IDTs, wherein a comb-shaped electrode of an IDT 1301 disposed at the middle portion is divided into two portions along the propagation direction of the surface acoustic wave so as to be connected to the balanced signal terminals 124 and 125, respectively, wherein the two portions of the divided comb-shaped electrode have different intervals between the electrode finger tip and the bus bar, while IDTs 1302 and 1303 disposed on the left and the right sides of the IDT 1301 at the middle portion are connected to the unbalanced signal terminal, which produces the same advantages, as well.

Figure 22:
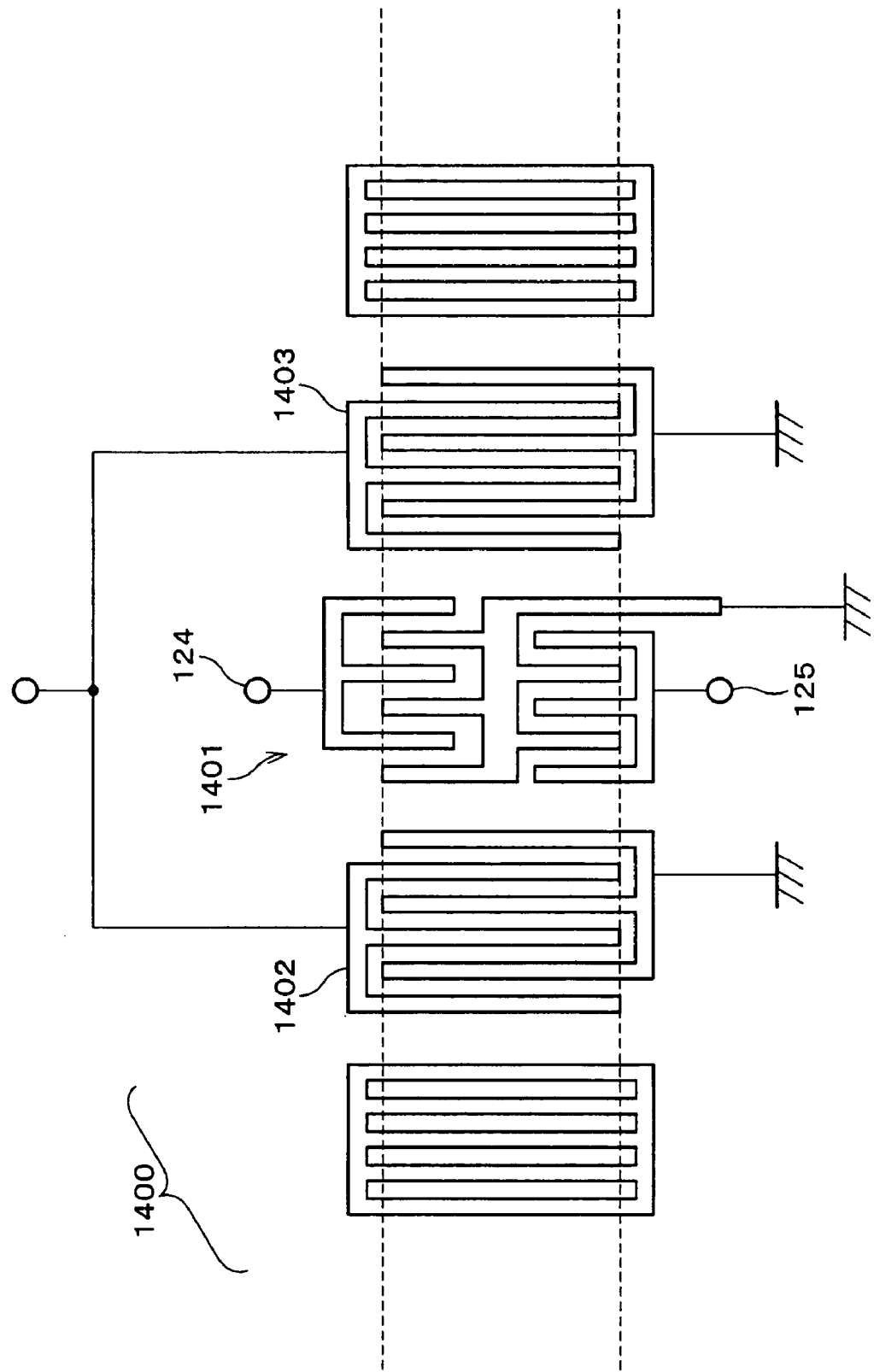
FIG. 22 is a configuration diagram which shows yet another modification according to the aforementioned first preferred embodiment of the present invention.

Furthermore, as shown in FIG. 22, the present invention may be applied to a surface acoustic wave device 1400 having a function of balance-unbalance conversion, including three IDTs, wherein a comb-shaped electrode of an IDT 1401 disposed at the middle portion is divided into two portions along the interleaving direction wherein the two portions of the divided comb-shaped electrode have different intervals between the electrode finger tip and the bus bar, while IDTs 1402 and 1403 disposed on the left and the right sides of the IDT 1401 at the middle portion are connected to the unbalanced signal terminal, which produces the same advantages, as well.

Figure 23:
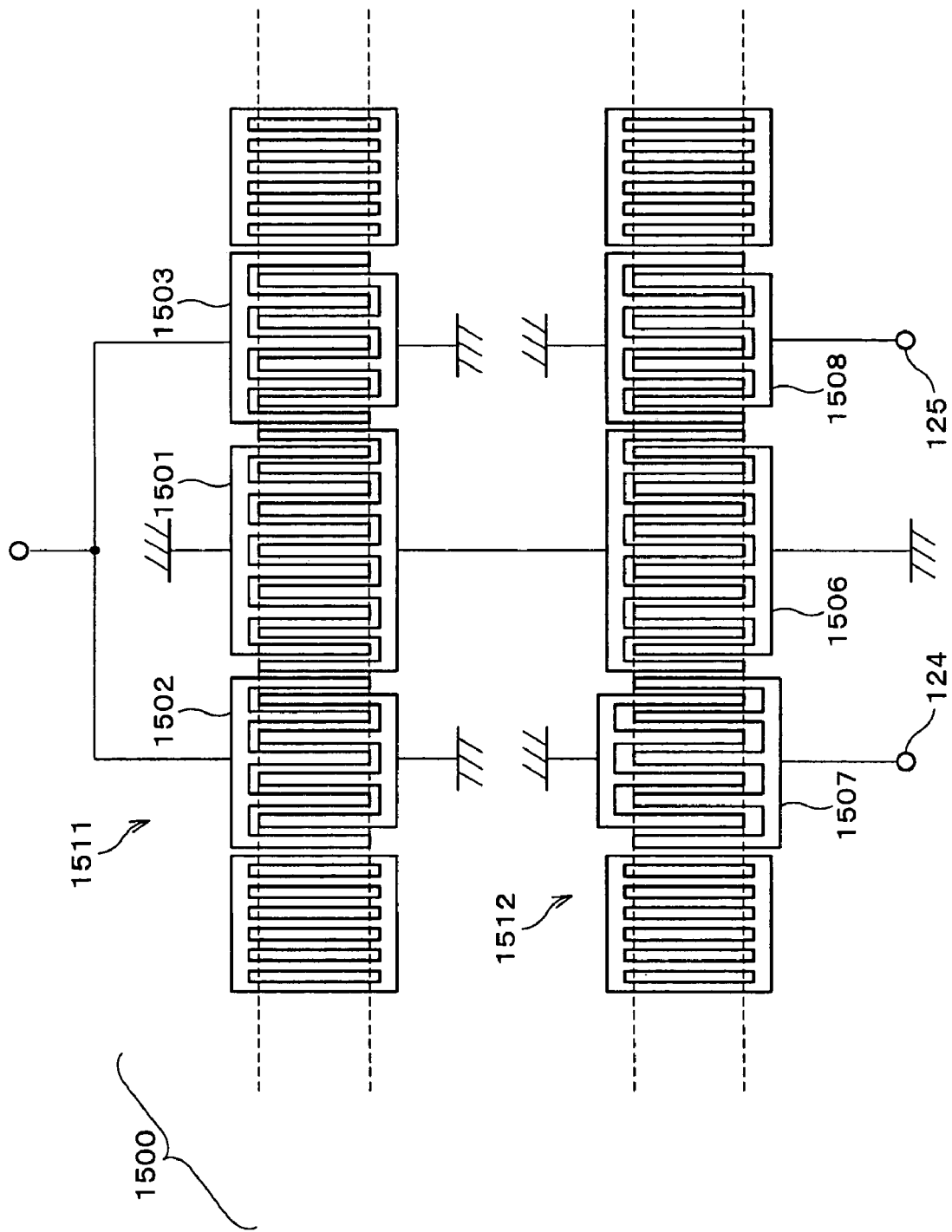
FIG. 23 is a configuration diagram which shows yet another modification according to the aforementioned first preferred embodiment of the present invention.

Furthermore, as shown in FIG. 23, the present invention may be applied to a surface acoustic wave device 1500 wherein two surface acoustic wave filter devices 1511 and 1512, each of which have two or more IDTs, are connected serially such that IDTs 1502 and 1503 of the one surface acoustic wave filter device 1511, disposed on the left and the right side of an IDT 1501 at the middle portion, are connected to the unbalanced signal terminal, and IDTs 1507 and 1508 of the other surface acoustic wave filter device 1512, disposed on the left and the right side of an IDT 1506 at the middle portion, are connected to the balanced signal terminals 124 and 125, and the aforementioned IDTs 1507 and 1508 have different intervals between the electrode finger tip and the bus bar, which produces the same advantages, as well.

Figure 24:
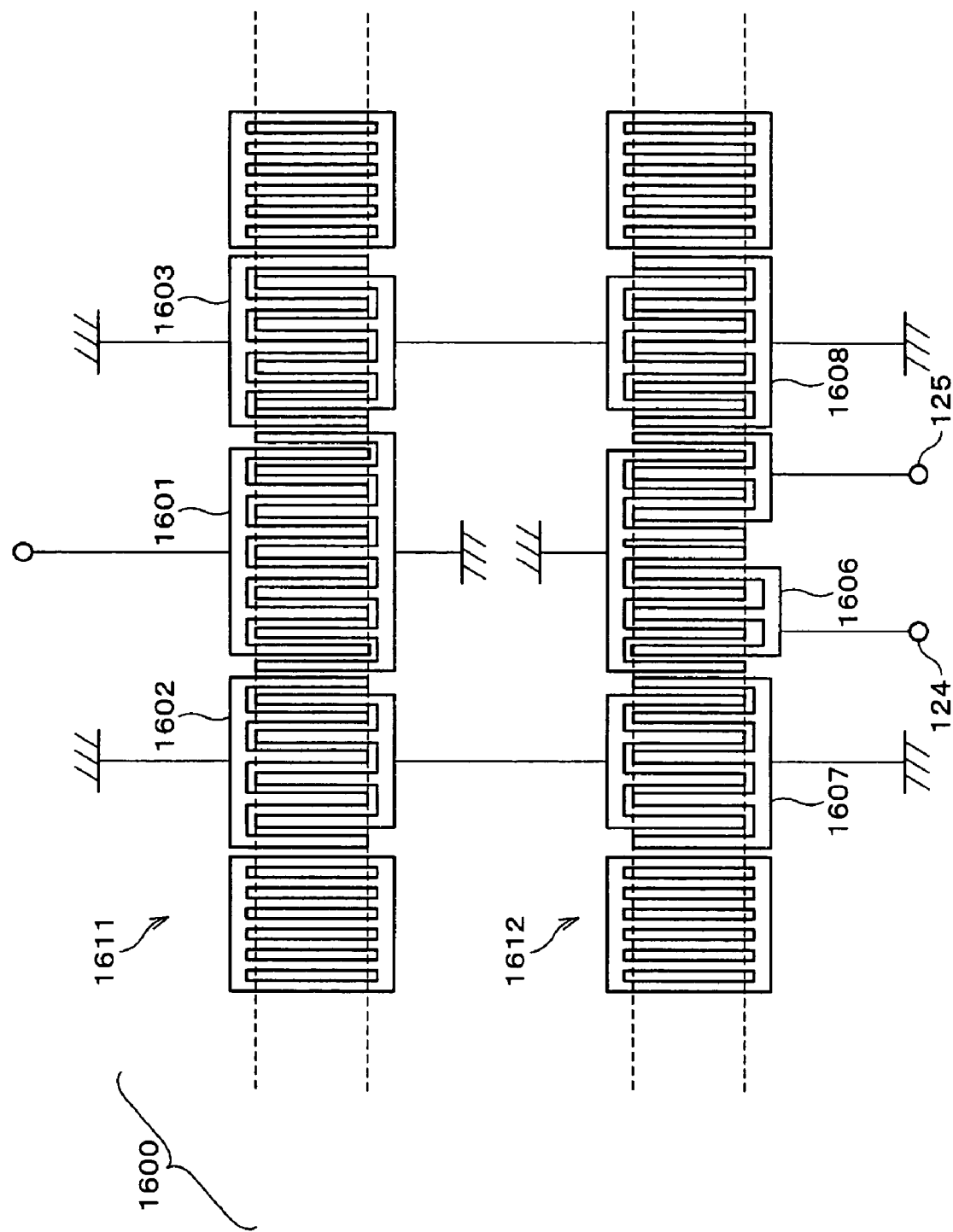
FIG. 24 is a configuration diagram which shows yet another modification according to the aforementioned first preferred embodiment of the present invention.

Furthermore, as shown in FIG. 24, the present invention may be applied to a surface acoustic wave device 1600 wherein two surface acoustic wave filter devices 1611 and 1612, each of which have two or more IDTs, are connected serially, an IDT 1601 disposed at the middle portion of the surface acoustic wave filter device 1611 is connected to the unbalanced signal terminal, an IDT 1606 disposed at the middle portion of the other surface acoustic wave filter device 1612 is divided into two portions along the propagating direction of the surface acoustic wave, the two divided comb-shaped electrodes are connected to the balanced signal terminals 124 and 125, respectively, and the two divided comb-shaped electrodes have different intervals between the electrode finger tip and the bus bar, which produces the same advantages, as well.

Note that the arrangements shown in FIGS. 23 and 24 includes two surface acoustic wave filter devices connected one to another in the vertical direction, and preferably has the same configuration as shown in FIGS. 20 and 21, wherein both the balanced signal terminals 124 and 125 are connected to a single surface acoustic wave filter device.

As described above, with the surface acoustic wave device which performs balance-unbalance conversion using two or more surface acoustic wave filter devices according to the present preferred embodiment, the first longitudinally coupled surface acoustic wave filter device and the second longitudinally coupled surface acoustic wave filter device include IDTs having different intervals between the electrode finger tip and the bus bar, thereby suppressing the amplitude difference between the balanced signal terminals.

Second Preferred Embodiment

Figure 25:
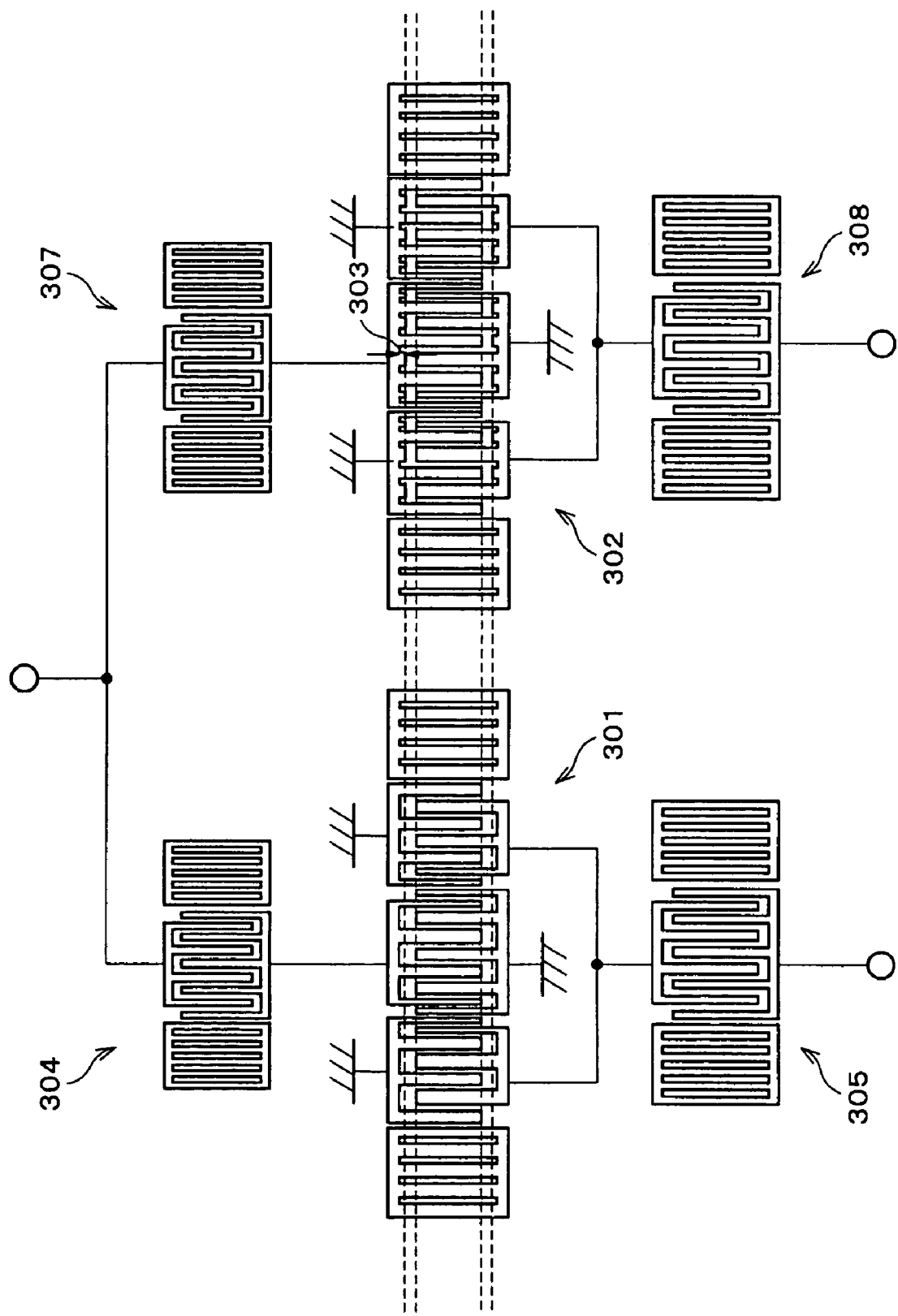
FIG. 25 is a configuration diagram which shows a surface acoustic wave device according to a second preferred embodiment of the present invention of the present invention.

Description will be made with respect to a second preferred embodiment according to the present invention, with a receiving filter for a PCS device, as an example. The surface acoustic wave device according to the second preferred embodiment preferably includes Al electrodes on an unshown 40±5°-Y-cut-X-propagation LiTaO$_3$ substrate, for example. The surface acoustic wave device according to the second preferred embodiment preferably has the same configuration as the conventional configuration shown in FIG. 2, except for the configuration described below. Accordingly, description will be made below regarding the differences between the configuration according to the second preferred embodiment and the conventional configuration with reference to FIG. 25.

With the second preferred embodiment, the interval between an electrode finger tip and the bus bar is adjusted with the addition of a dummy electrode. Specifically, while with the conventional arrangement a dummy electrode is provided to the IDT between each electrode finger and the bus bar with the dummy-electrode length of 0 μm (i.e., both the first and second surface acoustic wave filter devices 108 and 119 do not include any dummy electrodes), with the longitudinally coupled-resonator type surface acoustic wave filter device 302 according to the second preferred embodiment, a dummy electrode is provided with the IDT between each electrode finger and the bus bar having a dummy-electrode length of about 0.3 μm (the portion denoted by reference numeral 303, for example). Note that the longitudinally coupled-resonator type surface acoustic wave filter device 301 does not include any dummy electrodes.

The surface acoustic wave device according to the second preferred embodiment has a configuration in which the surface acoustic wave filter devices 301 and 302 include IDTs having different lengths of dummy electrodes, each of which are disposed between an electrode finger and a bus bar thereof.

Figure 26:
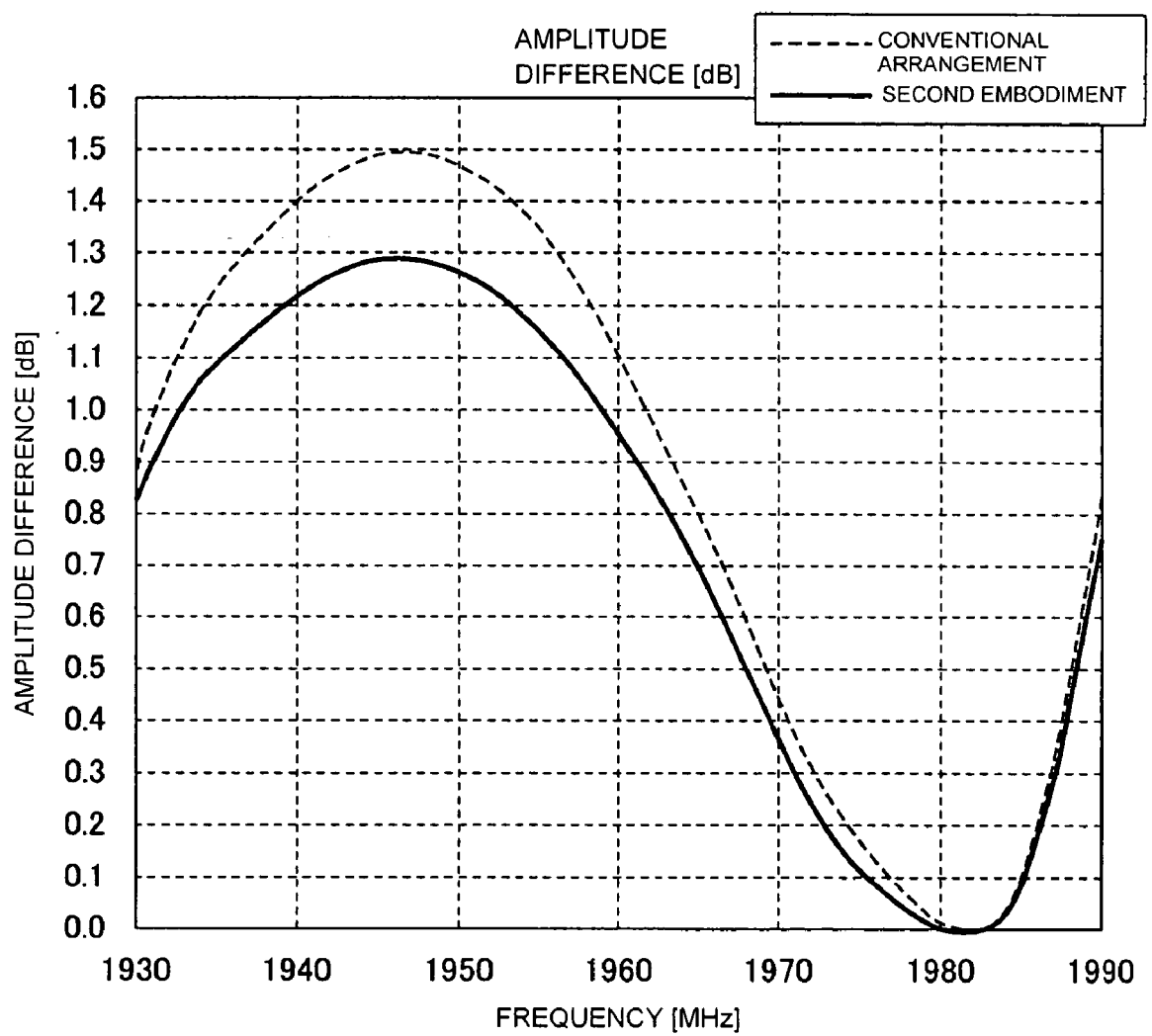
FIG. 26 is a chart which shows the relationship between the frequency and the amplitude difference with the aforementioned second preferred embodiment and conventional arrangement.

Next, description will be made regarding the advantages of the surface acoustic wave device according to the second preferred embodiment. FIG. 26 is a chart which shows the amplitude difference over the frequency obtained with the configuration according to the second preferred embodiment. FIG. 26 shows the amplitude difference obtained with the conventional arrangement shown in FIG. 2, as a comparative example. Note that the frequency range of the pass band for the PCS receiving filter is 1930 MHz to 1990 MHz. While the conventional arrangement exhibits the maximal amplitude difference of 1.50 dB within the aforementioned range, the arrangement according to the second preferred embodiment exhibits the maximal difference of about 1.29 dB in the range, which is improved by about 0.21 dB.

Description will be made regarding the reason why the surface acoustic wave device according to the second preferred embodiment exhibits the aforementioned advantage. With the second preferred embodiment, the surface acoustic wave filter device 302 includes IDTs having a greater length of dummy electrodes, each of which being provided between an electrode finger and the bus bar, than with the surface acoustic wave filter device 301. Thus, with the second preferred embodiment, the intensities of the SSBW occurring on the surface acoustic wave filter devices 301 and 302 are adjusted such that the deviation of the frequency properties and the deviation of the phase properties between the surface acoustic wave filter devices 301 and 302 are compensated for.

As a result, with the second preferred embodiment, deviation of the frequency properties and deviation of the phase properties are compensated for between the surface acoustic wave device defined by the surface acoustic wave filter device 301, and single-port surface acoustic wave resonators 304 and 305, and the surface acoustic wave device defined by the surface acoustic wave filter device 302, and single-port surface acoustic wave resonators 307 and 308, thereby suppressing amplitude difference.

Figure 27:
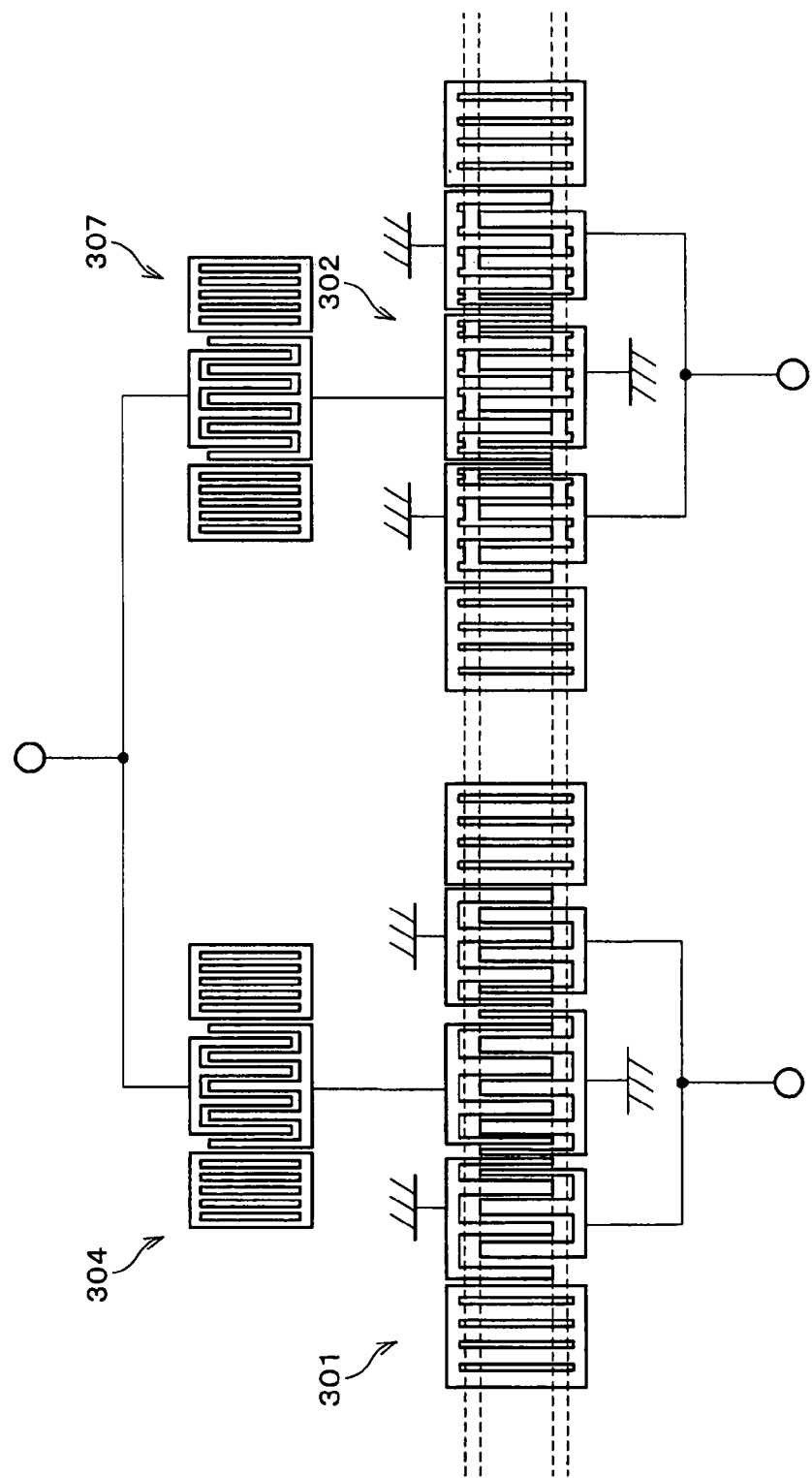
FIG. 27 is a configuration diagram which shows a modification according to the aforementioned second preferred embodiment of the present invention.
Figure 28:
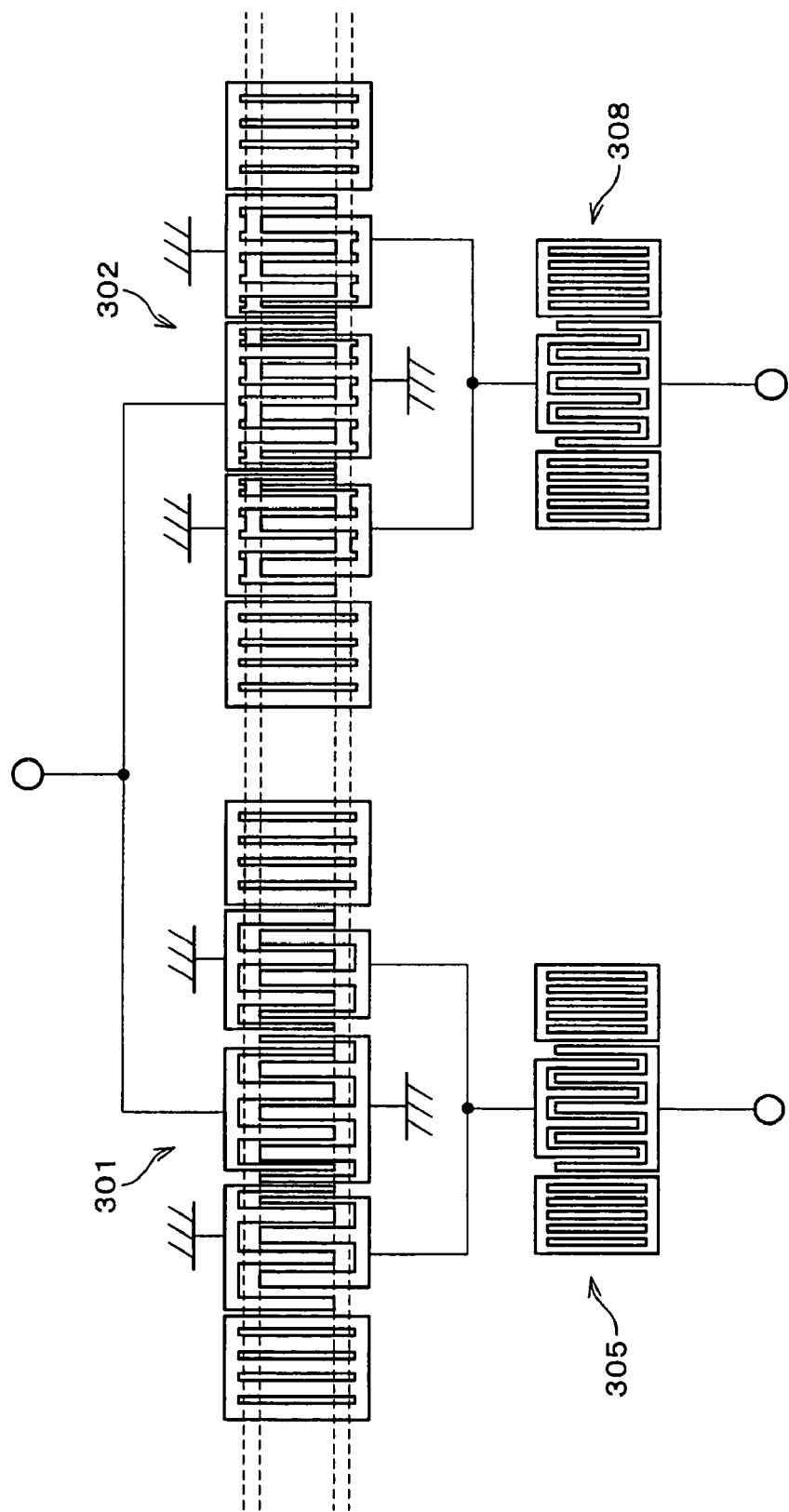
FIG. 28 is a configuration diagram which shows another modification according to the aforementioned second preferred embodiment of the present invention.

While description has been made in the second preferred embodiment regarding an arrangement wherein each of the input/output terminals of the 3-IDT longitudinally coupled-resonator type surface acoustic wave filter devices 301 and 302 are serially connected to one single-port surface acoustic surface wave resonator, an arrangement according to the present invention is not restricted to the above-described configuration, but rather, the present invention may be applied to any surface acoustic wave device having balanced signal terminals, regardless of the configuration thereof, which produces the same advantages. For example, the present invention may be applied to an arrangement wherein each of the input terminals of the surface acoustic wave filter devices 301 and 302 are connected to a single-port surface acoustic wave resonator as shown in FIG. 27, and an arrangement wherein each of the output terminals of the surface acoustic wave filter devices 301 and 302 are connected to a single-port surface acoustic wave resonator as shown in FIG. 28, which produce the same advantages.

Figure 29:
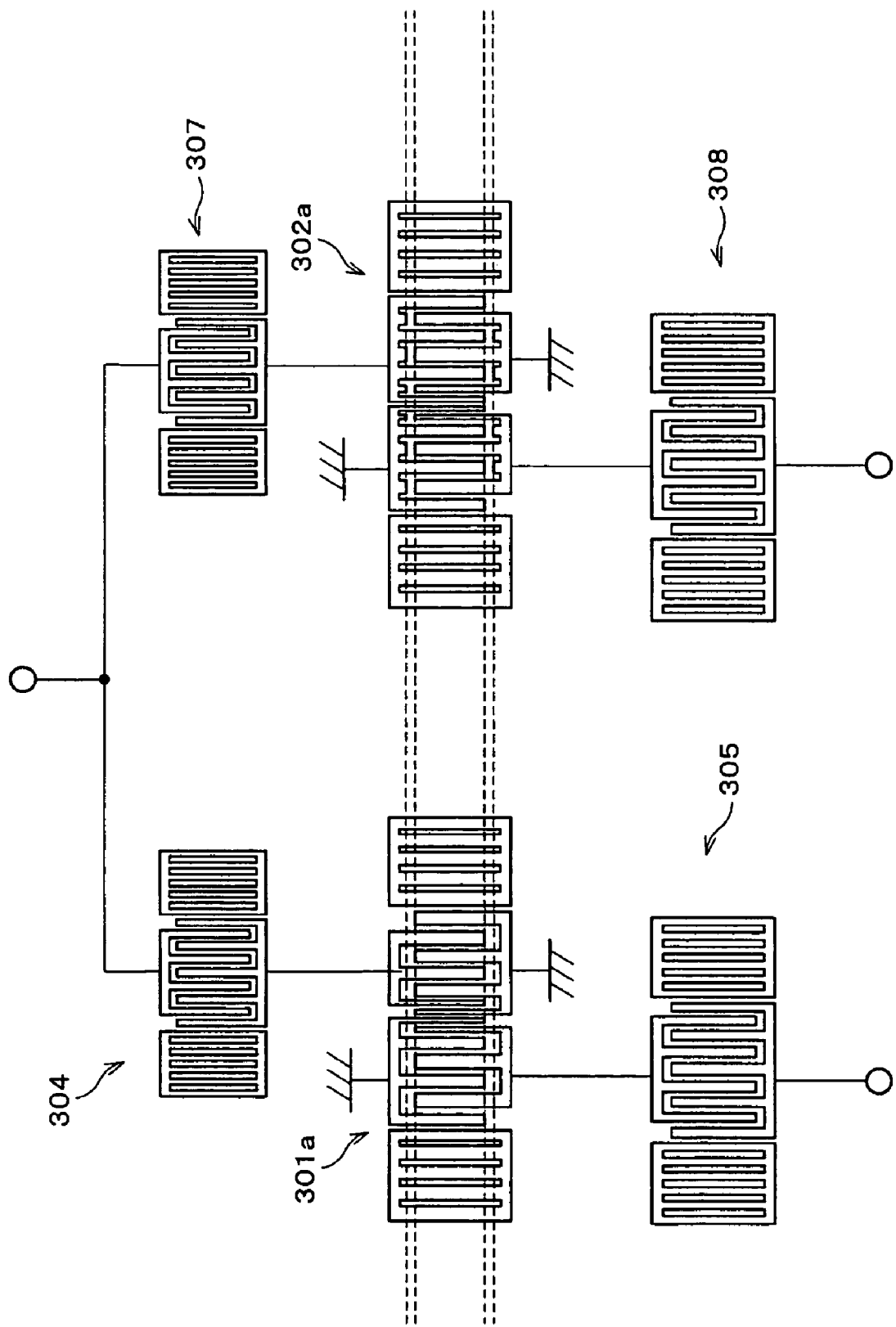
FIG. 29 is a configuration diagram which shows yet another modification according to the aforementioned second preferred embodiment of the present invention.
Figure 30:
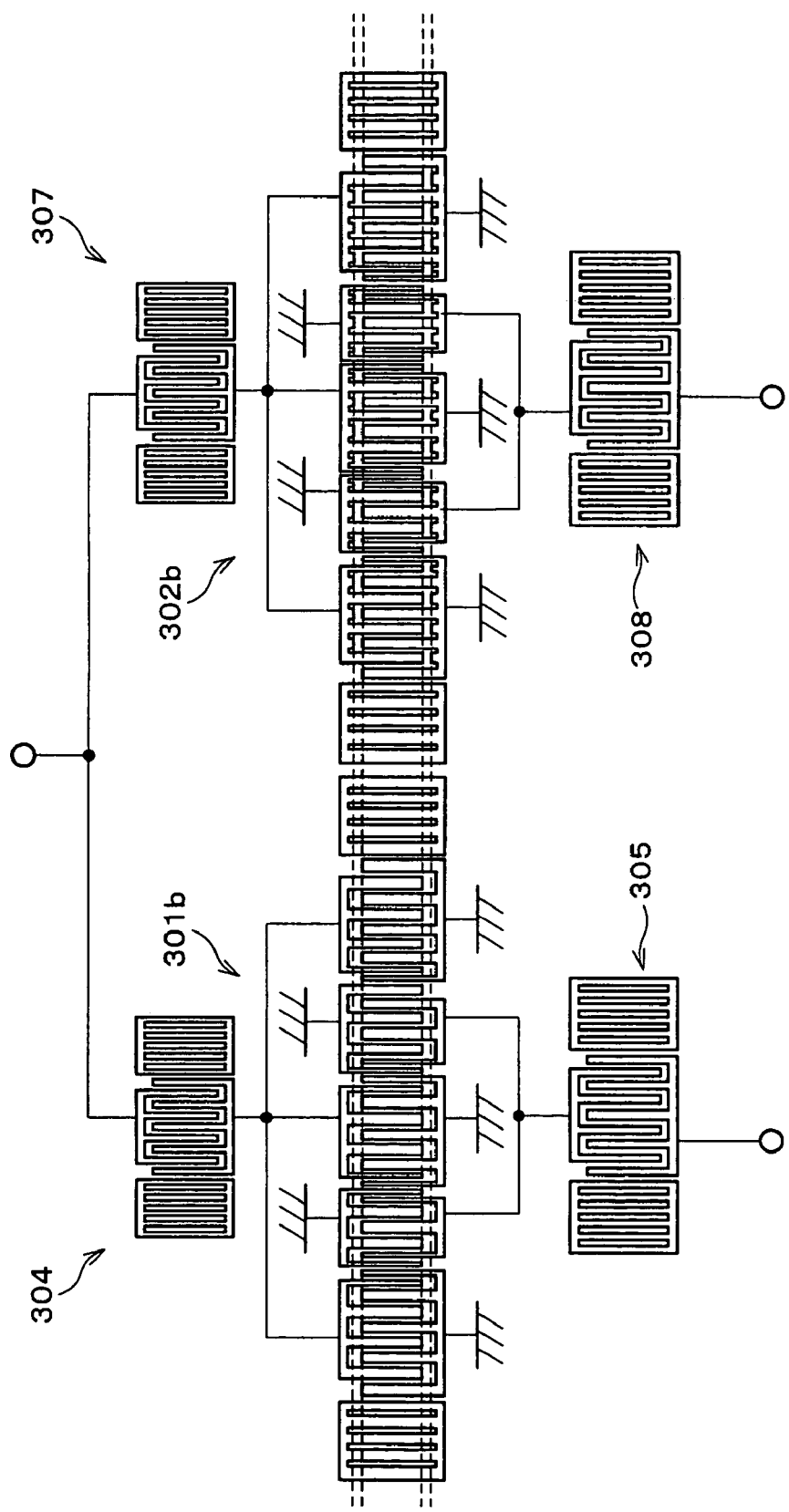
FIG. 30 is a configuration diagram which shows yet another modification according to the aforementioned second preferred embodiment of the present invention.

While description has been made in the second preferred embodiment regarding the arrangement wherein the two surface acoustic wave filter devices 301 and 302 include 3-IDT longitudinally coupled-resonator type surface acoustic wave filter devices, the present invention may be applied to an arrangement wherein surface acoustic wave filter devices 301a and 302a, corresponding to the surface acoustic wave filter devices 301 and 302, include 2-IDT longitudinally coupled-resonator type surface acoustic wave filter devices as shown in FIG. 29, and an arrangement wherein surface acoustic wave filter devices 301b and 302b, corresponding to the surface acoustic wave filter devices 301 and 302, include 5-IDT longitudinally coupled-resonator type surface acoustic wave filter devices as shown in FIG. 30, for example, which produce the same advantages.

Figure 31:
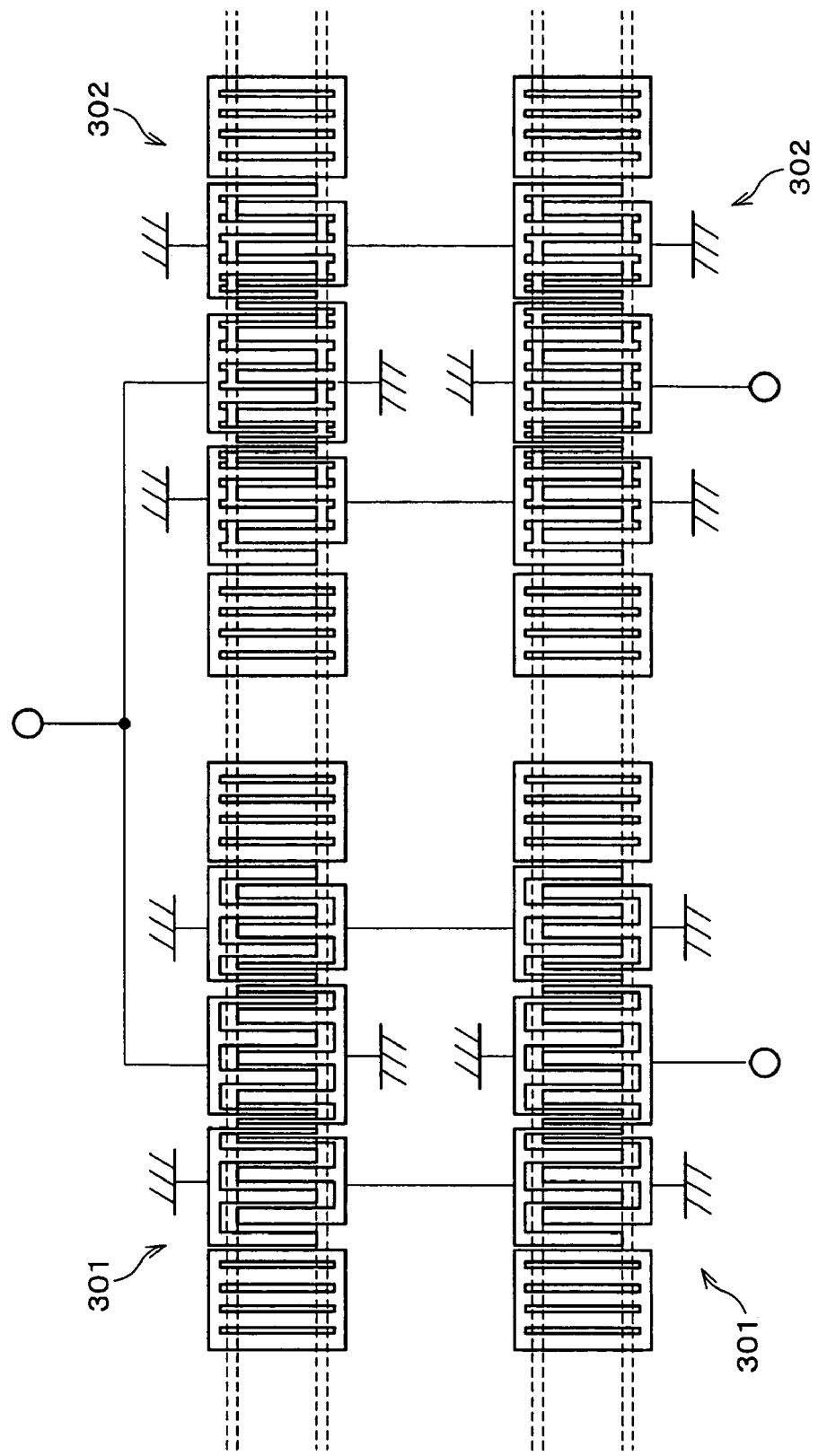
FIG. 31 is a configuration diagram which shows yet another modification according to the aforementioned second preferred embodiment of the present invention.

Furthermore, while description has been made regarding the arrangement wherein the two 3-IDT longitudinally coupled-resonator type surface acoustic wave filter devices 301 and 302 are connected in parallel, the present invention may be applied to an arrangement wherein each of the surface acoustic wave filter devices 301 and 302 include two 3-IDT longitudinally coupled-resonator type surface acoustic wave filter devices connected serially as shown in FIG. 31, for example, which produces the same advantages.

Figure 32:
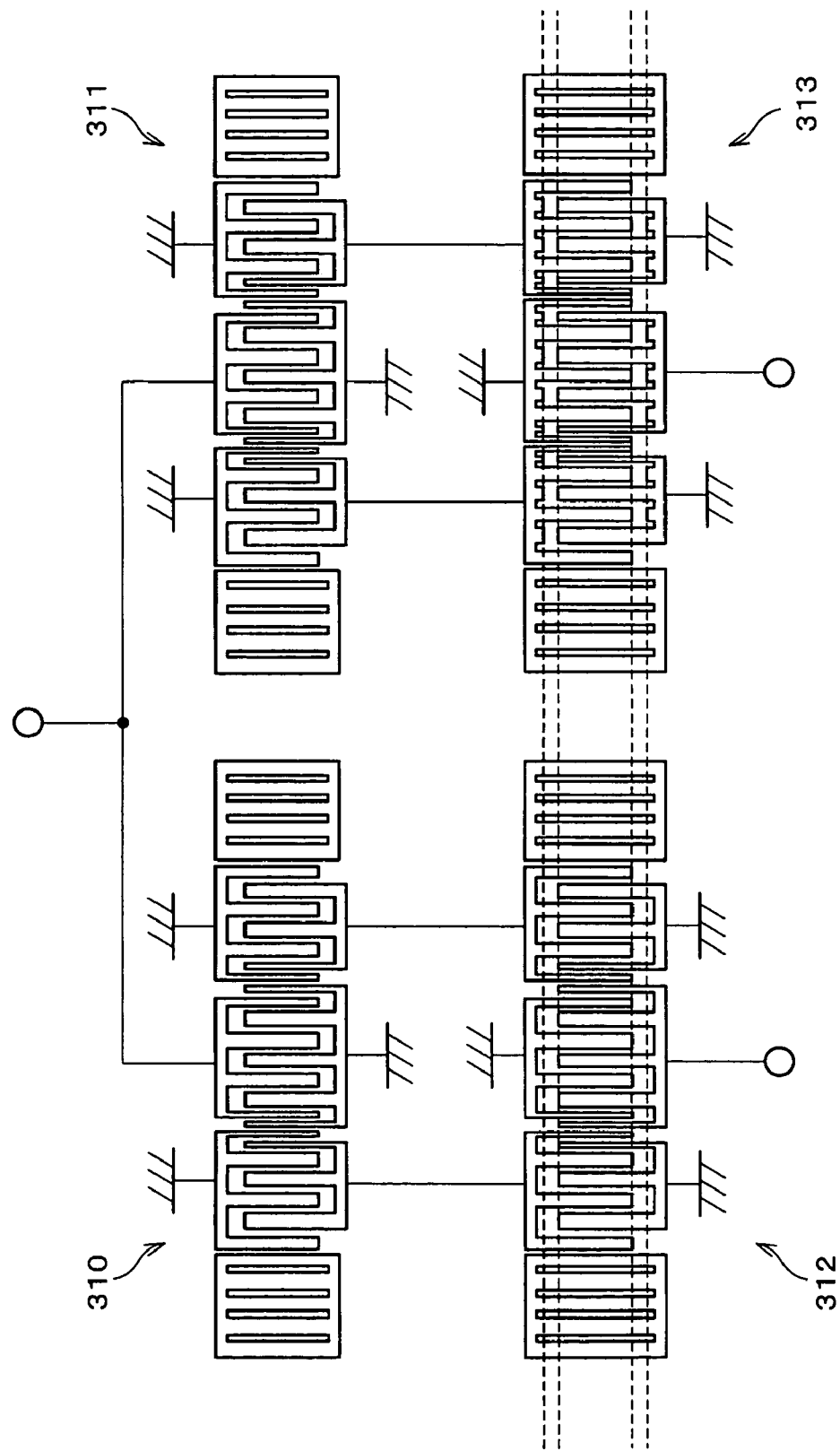
FIG. 32 is a configuration diagram which shows yet another modification according to the aforementioned second preferred embodiment of the present invention.

Furthermore, as shown in FIG. 32, the present invention may be applied to an arrangement having the same configuration as in FIG. 31, except that the surface acoustic wave filter devices 310 and 311 have the same interval between the electrode finger tip and the bus bar electrically connected to the electrode fingers facing the aforementioned electrode fingers, while the surface acoustic wave filter devices 312 and 313 have different intervals therebetween, which produces the same advantages.

As described above, with the surface acoustic wave device which performs balance-unbalance conversion using the two surface acoustic wave filter devices according to the second preferred embodiment, the first and second longitudinally coupled surface acoustic wave filter devices include IDTs having different length of the dummy electrodes, each of which are provided between an electrode finger and the bus bar, thereby suppressing the amplitude difference between the balanced signal terminals.

Third Preferred Embodiment

Description will be made with respect to a third preferred embodiment according to the present invention, with a receiving filter for a PCS device, as an example. The surface acoustic wave device according to the third preferred embodiment preferably includes Al electrodes on an unshown 40±5°-Y-cut-X-propagation LiTaO$_3$ substrate, for example. The surface acoustic wave device according to the third preferred embodiment has the same configuration as the conventional configuration shown in FIG. 2, except for the configuration described below. Accordingly, description will be made below regarding the differences between the configuration according to the third preferred embodiment and the conventional configuration.

Figure 33:
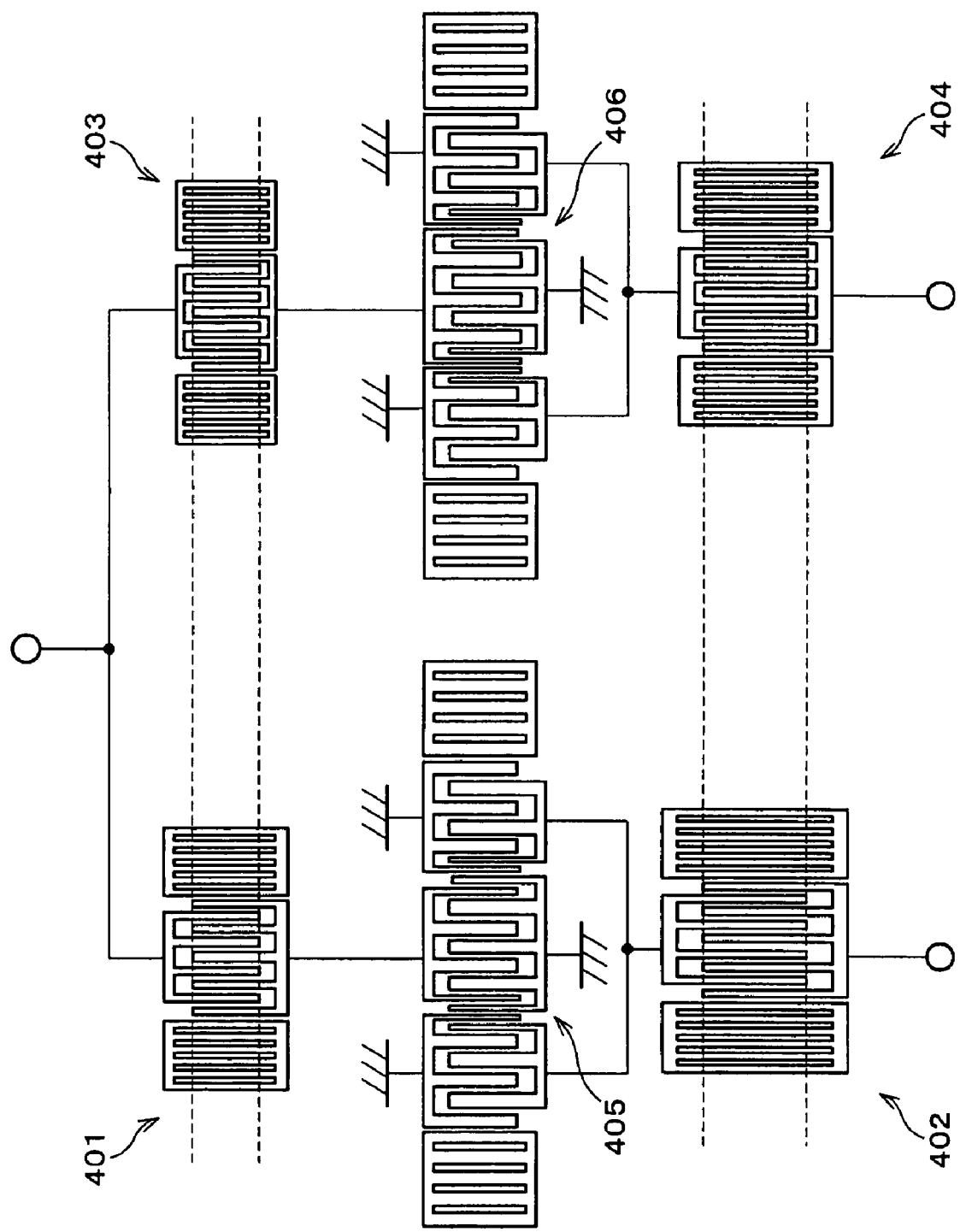
FIG. 33 is a configuration diagram which shows a surface acoustic wave device according to a third preferred embodiment of the present invention of the present invention.

As shown in FIG. 33, while the IDTs of the single port surface acoustic resonators (the single port surface acoustic wave resonators 112, 116, 120, and 121) of the conventional arrangement are configured with an interval between the electrode finger tip and the bus bar electrically connected to the electrode fingers facing the aforementioned electrode fingers of 0.9 μm, with the present third preferred embodiment, the IDTs of the single port surface acoustic resonators 401 and 402 have an interval therebetween of about 0.9 μm, and the IDTs of the single port surface acoustic resonators 403 and 404 have an interval therebetween of about 0.3 μm.

The surface acoustic wave device according to the third preferred embodiment has a configuration wherein the single-port surface acoustic wave resonators 401 and 402, and the single-port surface acoustic wave resonators 403 and 404, include IDTs having different intervals between the electrode finger tip and the bus bar electrically connected to the electrode fingers facing the aforementioned electrode fingers.

Figure 34:
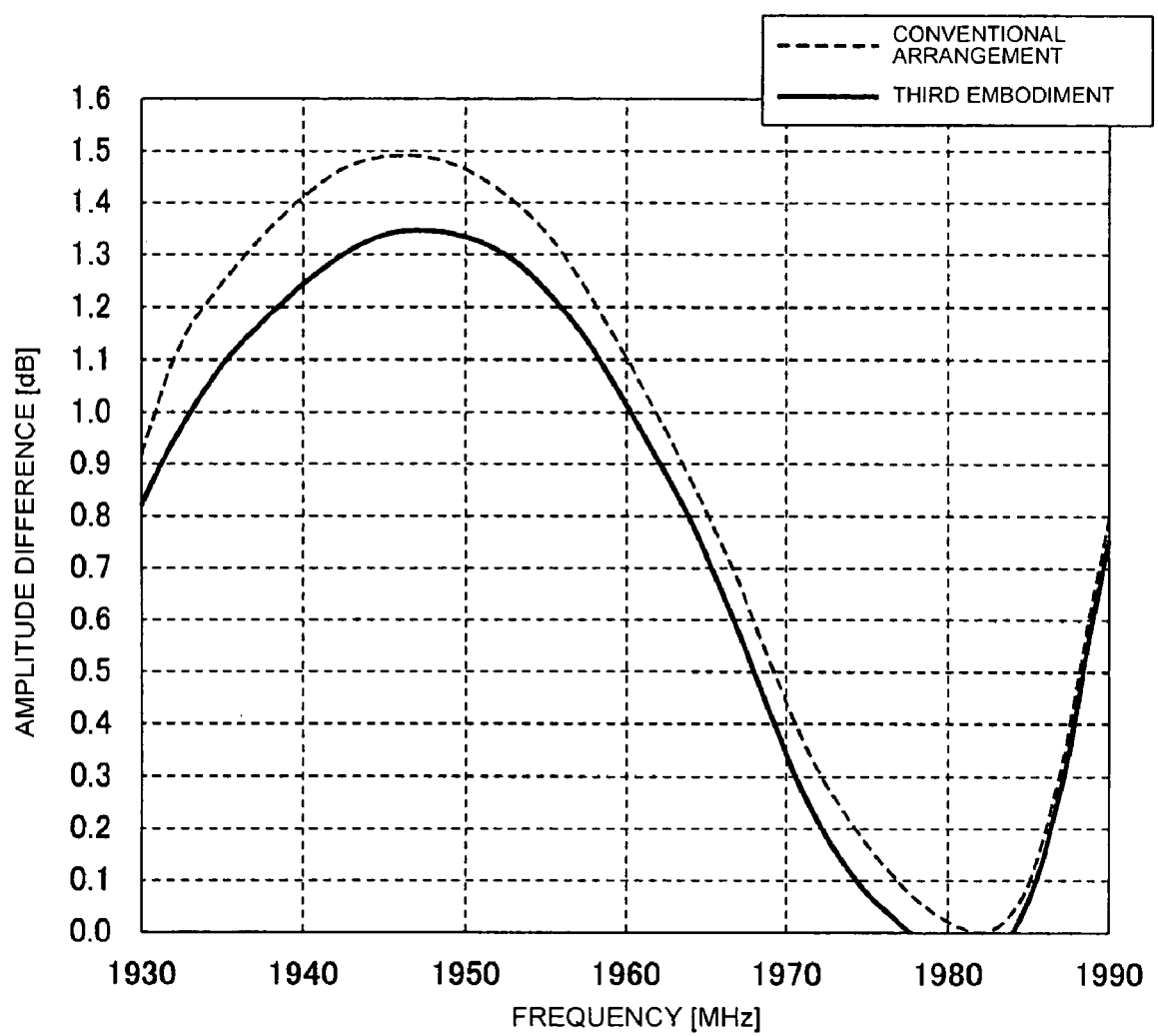
FIG. 34 is a chart which shows the relation between the frequency and the amplitude difference with the aforementioned third preferred embodiment and conventional arrangement.
Figure 35:
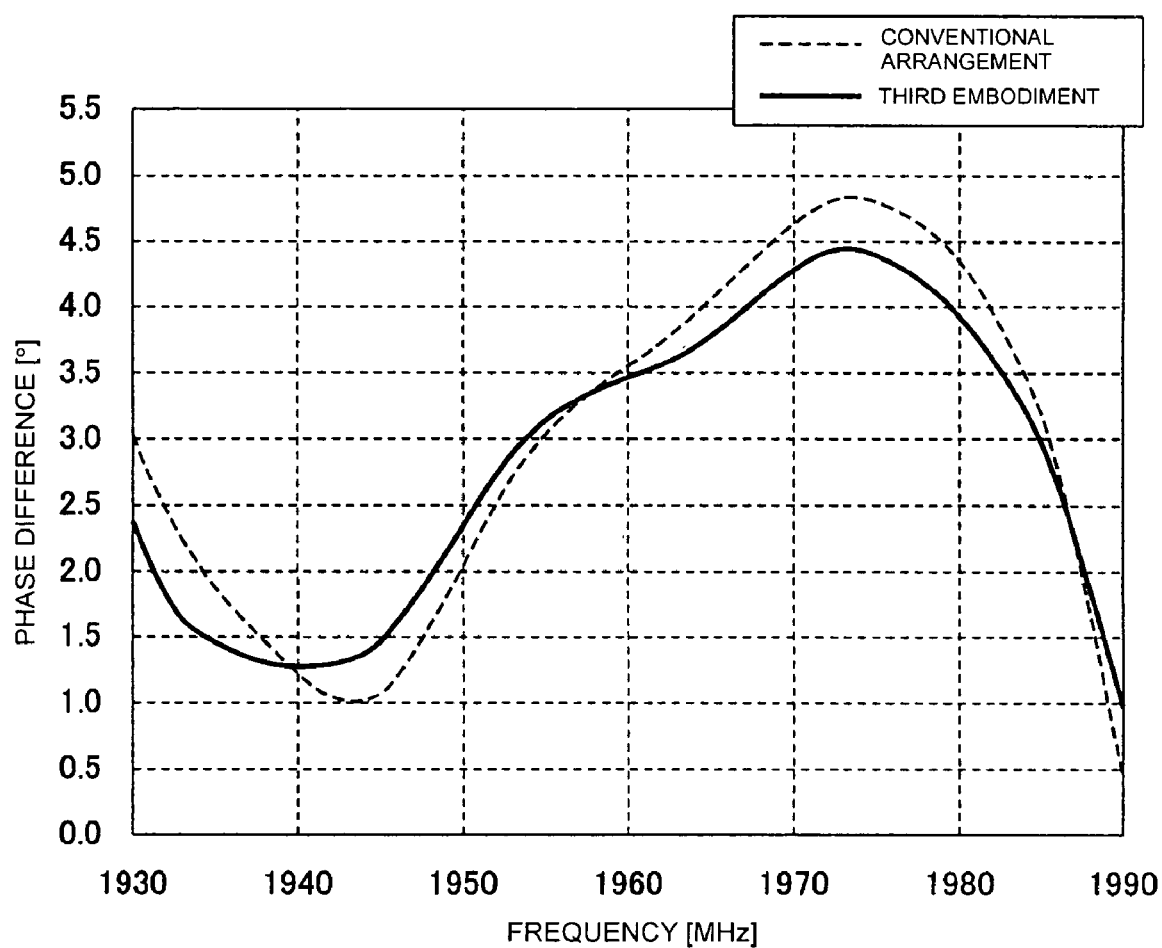
FIG. 35 is a chart which shows the relation between the frequency and the phase difference with the aforementioned third preferred embodiment and conventional arrangement.

Next, description will be made regarding the advantages of the third preferred embodiment. FIG. 34 is a chart which shows the amplitude difference over the frequency obtained by the surface acoustic wave device according to the third preferred embodiment shown in FIG. 34, and FIG. 35 is a chart which shows the phase difference over the frequency obtained by the surface acoustic wave device according to the third preferred embodiment. FIGS. 34 and 35 show the amplitude difference and the phase difference obtained by the conventional arrangement, respectively, as comparative examples.

Note that the frequency range of the pass band for the PCS receiving filter is 1930 MHz to 1990 MHz. While the conventional arrangement exhibits the maximal amplitude difference of 1.50 dB within the aforementioned range, the arrangement according to the third preferred embodiment exhibits the maximal difference of about 1.35 dB in this range, which is improved by about 0.15 dB.

Furthermore, while the conventional arrangement exhibits maximal phase difference of 4.8° in this range, the arrangement according to the third preferred embodiment exhibits maximal phase difference of about 4.4°, which is improved by about 0.4°.

Description will be made below regarding the reason why the surface acoustic wave device according to the third preferred embodiment exhibits the above-described advantages. With the third preferred embodiment, the single-port surface acoustic wave resonators 403 and 404 include IDTs having a smaller interval between the electrode finger tip and the bus bar electrically connected to the electrode fingers facing the aforementioned electrode fingers than that of the single-port surface acoustic wave resonators 401 and 402. Thus, with the third preferred embodiment, the intensities of the SSBW occurring on the single-port surface acoustic resonators 403 and 404, and the single-port surface acoustic resonators 401 and 402, are adjusted.

As a result, with the third preferred embodiment, deviations of the frequency properties and deviations of the phase properties are compensated for between the surface acoustic wave device including a longitudinally coupled-resonator type surface acoustic wave filter 405 and the single-port surface acoustic wave resonators 401 and 402 and the surface acoustic wave device including a longitudinally coupled-resonator type surface acoustic wave filter 406 and the single-port surface acoustic wave resonators 403 and 404, thereby suppressing the amplitude difference and the phase difference between the balanced signal terminals.

While description has been made in the third preferred embodiment regarding the arrangement wherein each of the input/output terminals of the 3-IDT longitudinally coupled-resonator type surface acoustic wave filter devices 405 and 406 are serially connected to one single-port surface acoustic surface wave resonator, an arrangement according to the present invention is not restricted to the above-described configuration, but rather, the present invention may be applied to any surface acoustic wave device having balanced signal terminals, regardless of the configuration thereof, which produces the same advantages.

Figure 36:
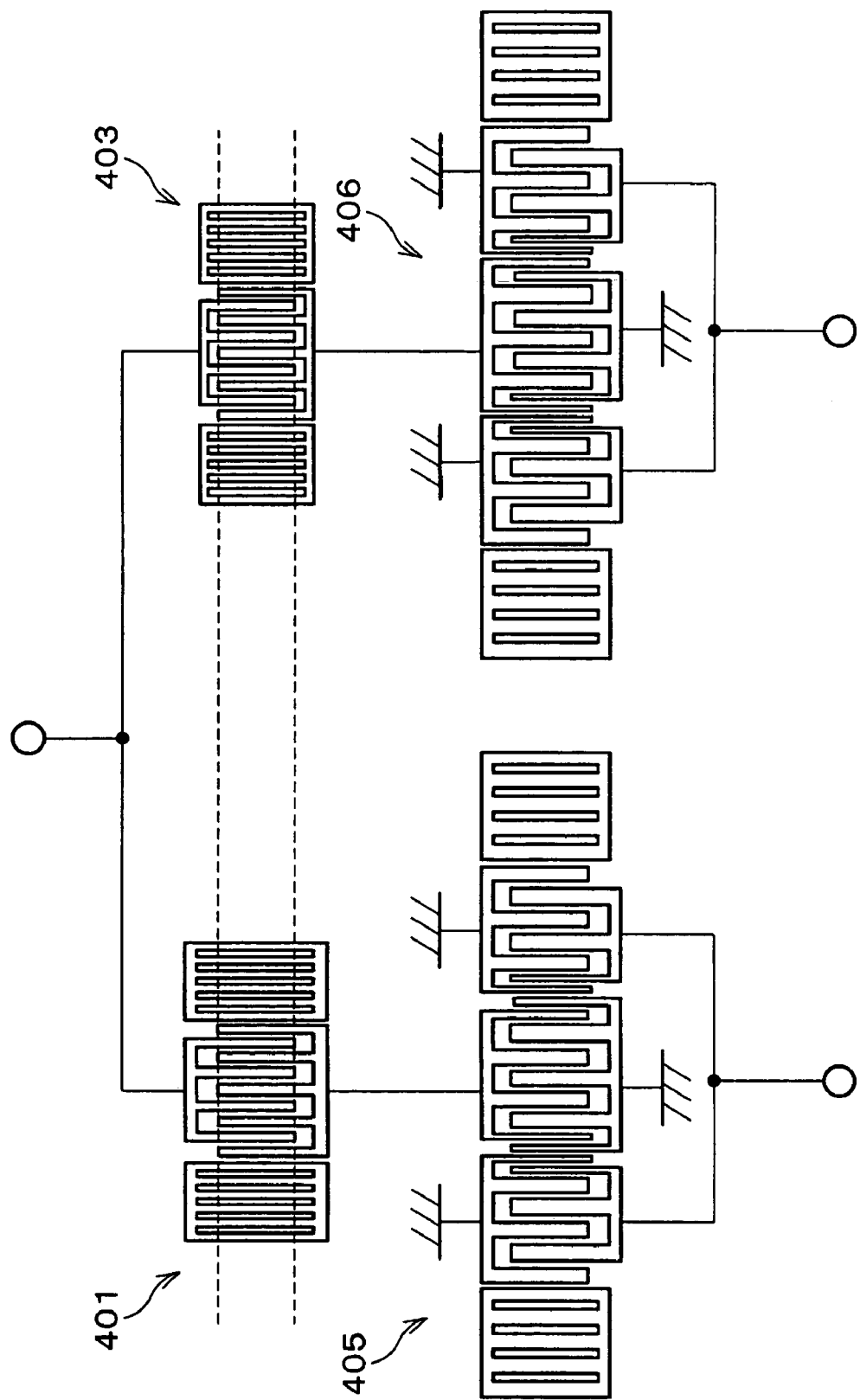
FIG. 36 is a configuration diagram which shows a modification according to the aforementioned third preferred embodiment of the present invention.
Figure 37:
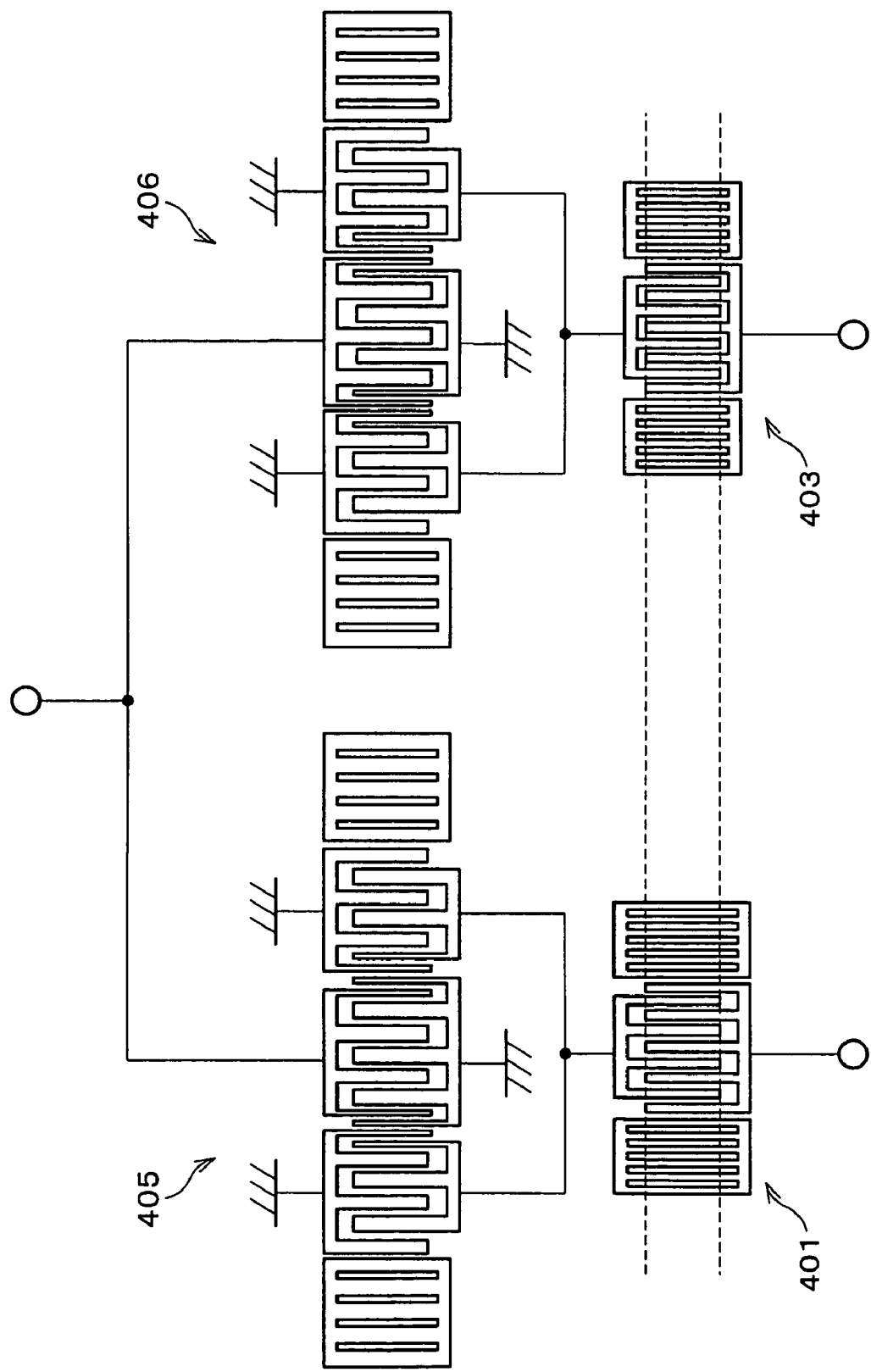
FIG. 37 is a configuration diagram which shows another modification according to the aforementioned third preferred embodiment of the present invention.

For example, the present invention may be applied to an arrangement wherein only each of the input terminals of the surface acoustic wave filter devices 405 and 406 are serially connected to a single-port surface acoustic wave resonator as shown in FIG. 36, and an arrangement wherein only each of the output terminals of the surface acoustic wave filter devices 405 and 406 are serially connected to a single-port surface acoustic wave resonator as shown in FIG. 37, which produce the same advantages.

Figure 38:
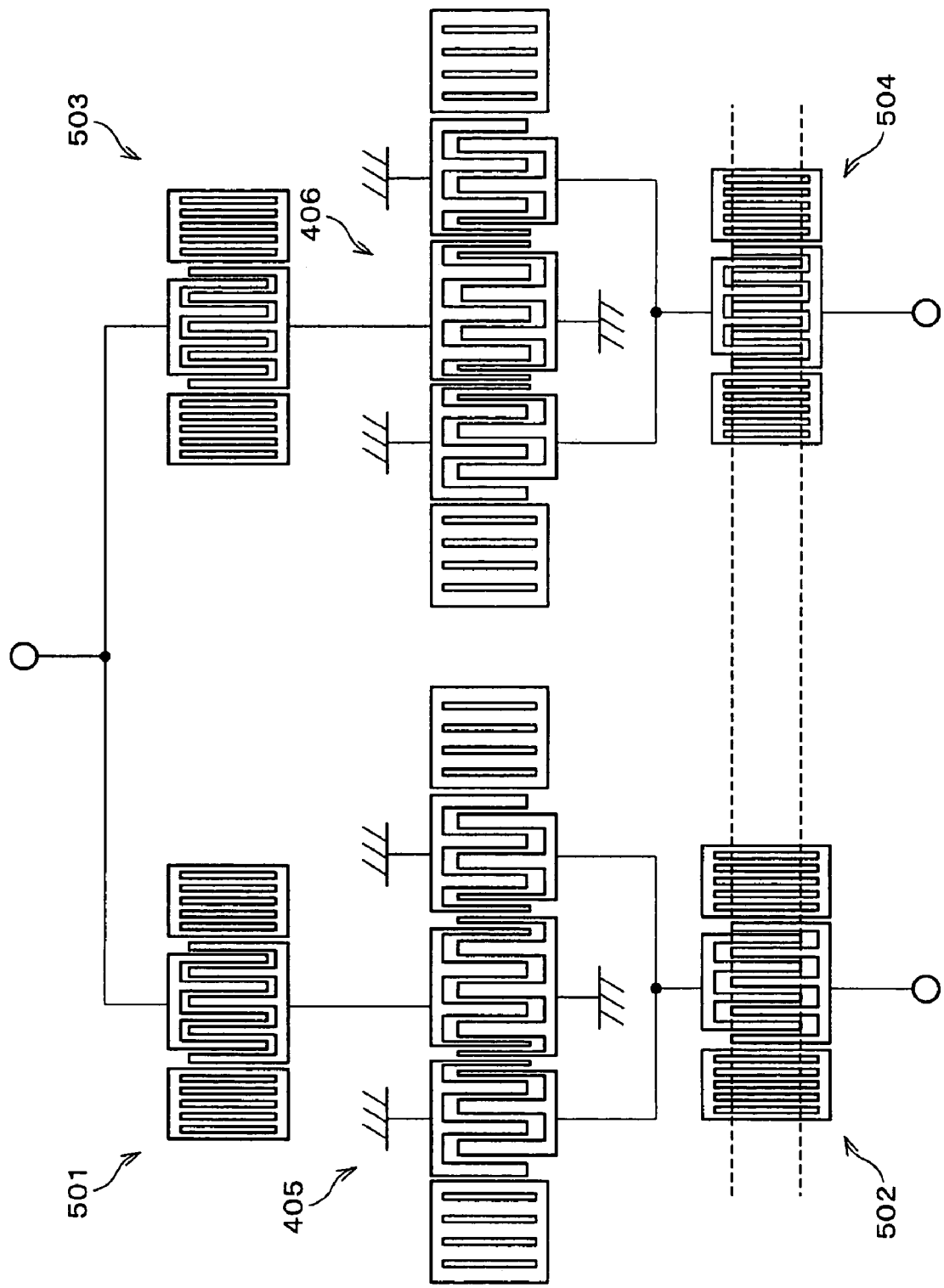
FIG. 38 is a configuration diagram which shows yet another modification according to the aforementioned third preferred embodiment of the present invention.

Furthermore, as shown in FIG. 38, an arrangement may be made having the same configuration as in FIG. 33, except that IDTs 501 and 503 include IDTs with the same interval between the electrode finger tip and the bus bar electrically connected to the electrode fingers facing the aforementioned electrode fingers, and IDTs 502 and 504 have different intervals therebetween, which produce the same advantages.

Fourth Preferred Embodiment

Figure 39:
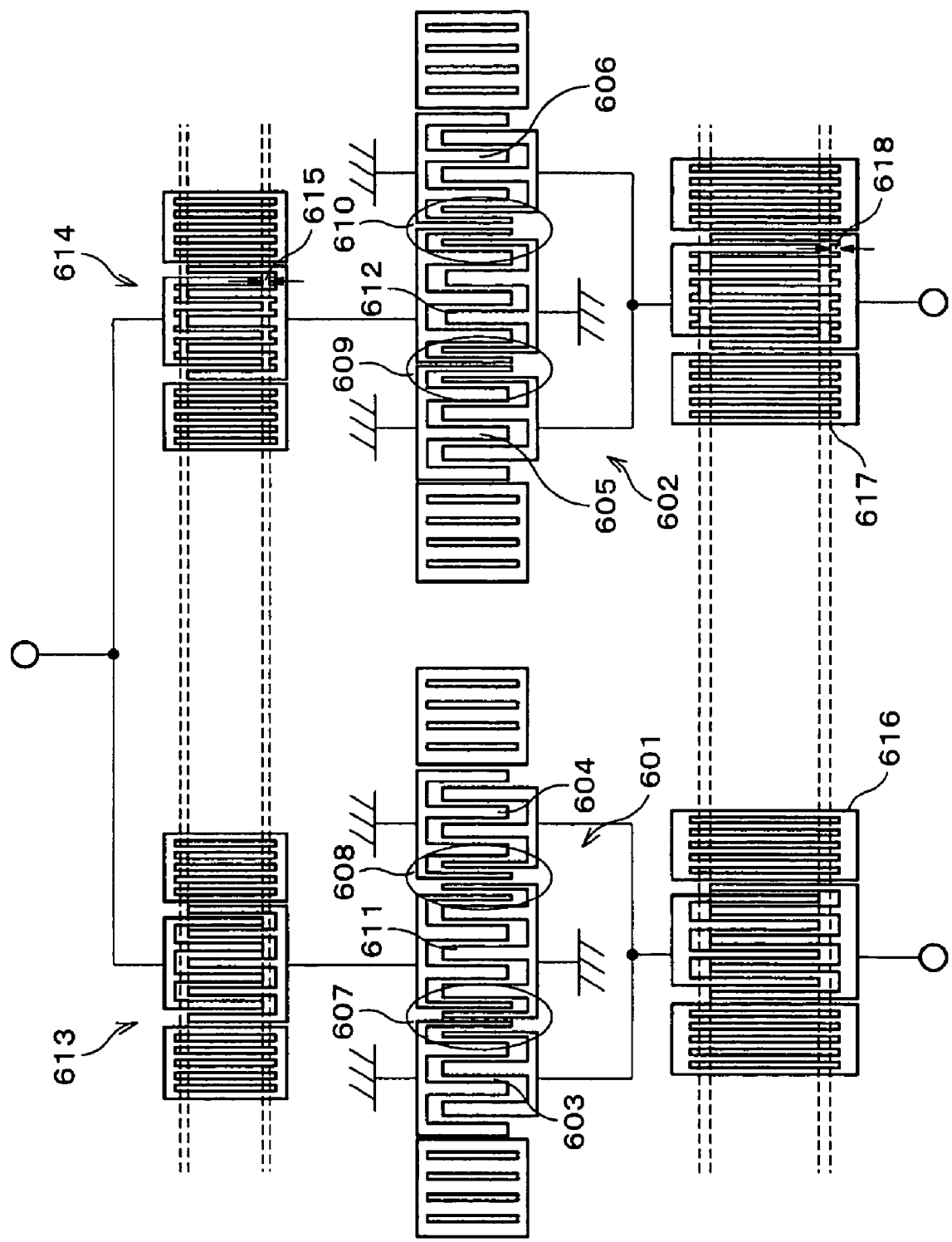
FIG. 39 is a configuration diagram which shows a surface acoustic wave device according to a fourth preferred embodiment of the present invention of the present invention.
Figure 40:
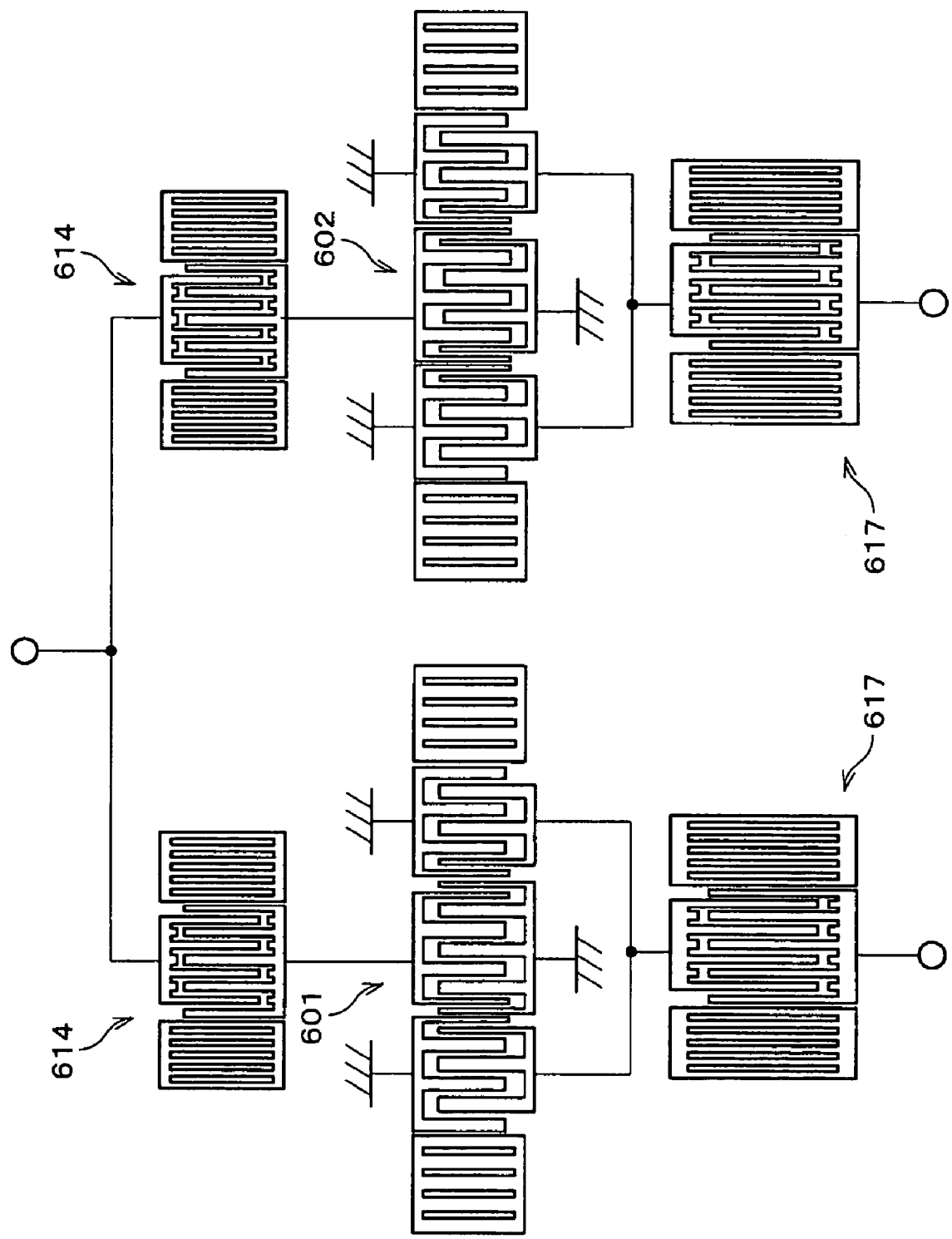
FIG. 40 is a configuration diagram which shows a comparative example of a surface acoustic wave device for describing the advantages of the aforementioned surface acoustic wave device according to the fourth preferred embodiment of the present invention.

FIG. 39 shows a surface acoustic wave device according to a fourth preferred embodiment of the present invention, and FIG. 40 shows a comparative example as to the fourth preferred embodiment. Description will be made with respect to the fourth preferred embodiment according to the present invention, with a receiving filter for a DCS device, as an example. The surface acoustic wave device according to the forth preferred embodiment preferably includes Al electrodes disposed on an unshown 40±5°-Y-cut-X-propagation LiTaO$_3$ substrate, for example.

The surface acoustic wave device according to the fourth preferred embodiment has the same configuration as the configuration of the conventional comparative example, except for the configuration described below. That is to say, longitudinally coupled-resonator type surface acoustic wave filter devices 601 and 602 have a configuration wherein a predetermined number of electrode fingers near the intervals between IDTs 603 and 611; IDTs 611 and 604; IDTs 605 and 612; and IDTs 612 and 606, (regions denoted by reference numerals 607, 608, 609, and 610, in FIG. 39) have narrower pitches than the other regions (which will be refereed to as "narrow-pitch electrode fingers" hereafter), and adjacent IDTs are disposed with an interval approximately 0.5 times the IDT wavelength therearound, thereby suppressing loss due to components escaping as bulk waves. Note that FIGS.

39 and 40 show an example having a small number of electrode fingers to simplify the drawing.

Description will be made in detail regarding a design of the surface acoustic wave filter devices 601 and 602, with the wavelength determined by the pitch of the narrow-pitch electrode fingers as λ2, with the wavelength determined by the normal pitch as λ1, and with the reflector wavelength as λR.

That is to say:

Interleaving depth: about 50.9 λ1

Number of electrode fingers of IDTs (in the order of the IDTs 603, 611, and 604): 17(4), (4)/37/(4), and (4)/17, (the numerals in parentheses are the number of narrow-pitch electrode fingers)

Note that IDTs 605, 612, and 606, each have the same number of electrode fingers.

IDT wavelength λ1: about 2.162 μm, λ2: about 1.958 μm (λ1 corresponds to normal pitch, λ2 corresponds to narrow pitch)

Reflector wavelength λR: about 2.174 μm

Number of electrode fingers of reflectors: 150

IDT-IDT interval (interval between normal electrode finger with wavelength of λ1 and narrow electrode finger with wavelength of λ2): about 0.25 λ1+0.25 λ2

IDT-IDT interval (interval between narrow electrode fingers with wavelength of λ2): about 0.50 λ2

IDT-reflector interval: about 0.50·λR

Duty of IDT: about 0.63

Duty of reflector: about 0.57

Electrode thickness: about 9.48·λ1

Interval between electrode finger tip and bus bar: about 0.9 μm

Description will be made below in detail regarding a design of the single-port surface acoustic wave resonators 613 and 614.

That is to say:

Interleaving depth: about 21.5 λ1

Number of electrode fingers of IDTs: 241

IDT wavelength and reflector wavelength: about 2.098 μm

Number of electrode fingers of reflectors: 30

IDT-reflector interval: about 0.5 λR

Length of dummy electrode provided to IDTs between each electrode finger and bus bar:

Single-port surface acoustic wave resonator 613: 0 μm (without any dummy electrodes)

Single-port surface acoustic wave resonator 614 (portion denoted by reference numeral 615): about 2 μm Description will be made below in detail regarding a design of the single-port surface acoustic wave resonators 616 and 617.

That is to say:

Interleaving depth: about 36.8 λ1

Number of electrode fingers of IDTs: 241

IDT wavelength and reflector wavelength: about 2.040 μm

Number of electrode fingers of reflectors: 30

IDT-reflector interval: about 0.50 μR

Length of dummy electrode provided to IDTs between each electrode finger and bus bar:

Single-port surface acoustic wave resonator 616: 0 μm (without any dummy electrodes)

Single-port surface acoustic wave resonator 617 (portion denoted by reference numeral 618): about 2 μm The surface acoustic wave device according to the fourth preferred embodiment has a configuration wherein the single-port surface acoustic wave resonators 613 and 616 include IDTs with a length of dummy electrodes provided between an electrode finger and the bus bar of 0 μm (i.e., without any dummy electrodes), and the single-port surface acoustic wave resonators 614 and 617 with a length of dummy electrodes therebetween of about 2 μm so as to have a different interval (gap) therebetween.

Figure 41:
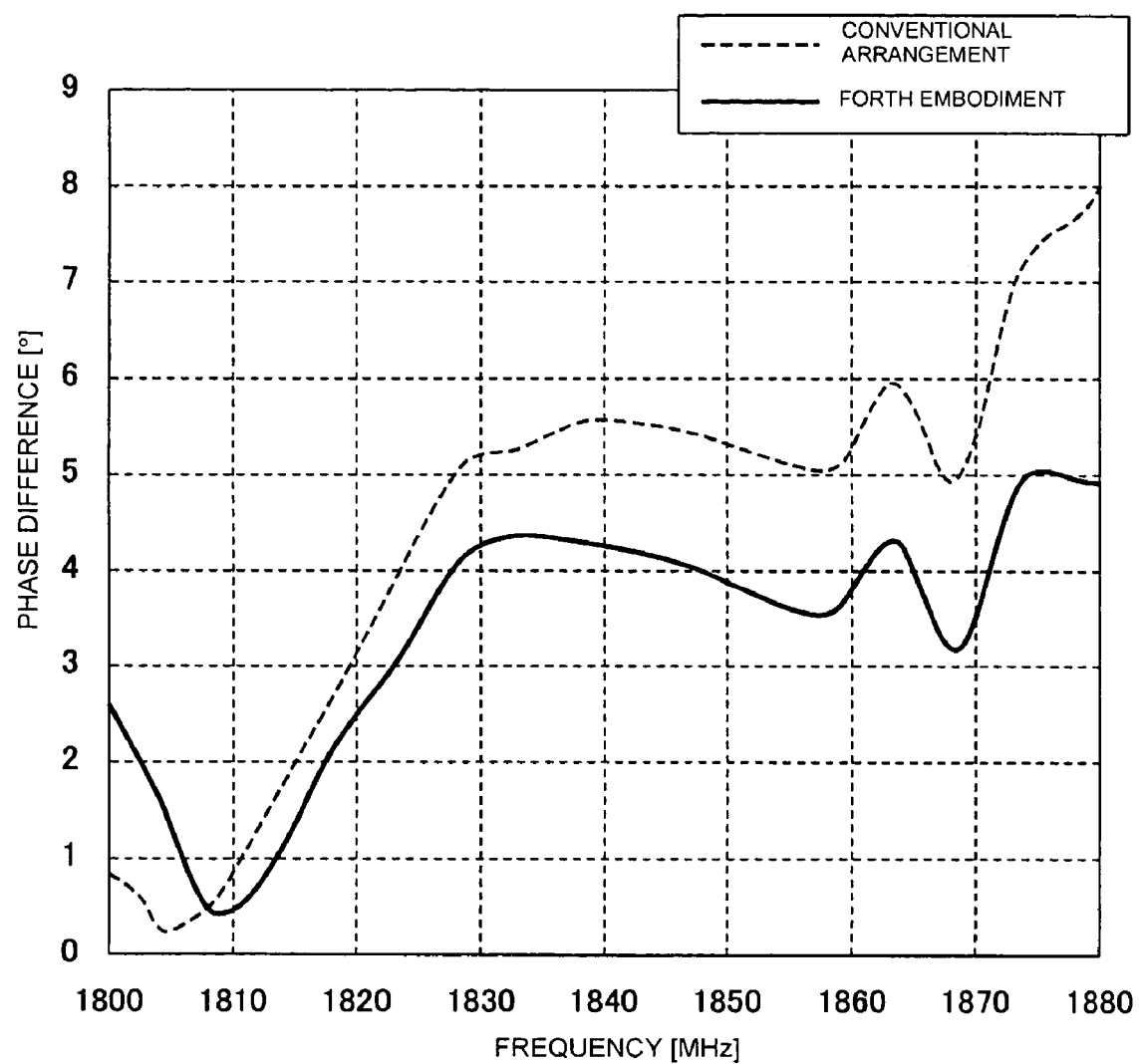
FIG. 41 is a chart which shows the relationship between the frequency and the phase difference with the aforementioned fourth preferred embodiment and conventional arrangement.

Next, description will be made regarding the advantages of the fourth preferred embodiment. FIG. 41 is a chart which shows the phase difference over the frequency obtained by the surface acoustic wave device according to the fourth preferred embodiment. FIG. 41 also shows the phase difference obtained by the conventional arrangement, as a comparative example. Note that the frequency range of the pass band for the DCS receiving filter is 1805 MHz to 1880 MHz. While the conventional arrangement exhibits maximal phase difference of 8° within the aforementioned range, the arrangement according to the fourth embodiment exhibits maximal phase difference of about 5° in this range, which is improved by about 3°.

Description will be made below regarding the reason why the surface acoustic wave device according to the fourth preferred embodiment exhibits the above-described advantages. With the fourth preferred embodiment, the single-port surface acoustic wave resonators 614 and 617 have a greater length of the dummy electrodes, each of which are provided to an IDT between an electrode finger and the bus bar than with the single-port surface acoustic wave resonators 613 and 616. Thus, with the fourth preferred embodiment, the intensities of the SSBW occurring on the single-port surface acoustic resonators 613 and 616 and on the single-port surface acoustic wave resonators 614 and 617 are adjusted.

As a result, with the fourth preferred embodiment, deviation of the frequency properties and deviation of the phase properties are compensated for between the surface acoustic wave device including a longitudinally coupled-resonator type surface acoustic wave filter 601 and the single-port surface acoustic wave resonators 613 and 616 and between the surface acoustic wave device including a longitudinally coupled-resonator type surface acoustic wave filter 602 and the single-port surface acoustic wave resonators 614 and 617, thereby suppressing the phase difference between the balanced signal terminals.

While description has been made in the fourth preferred embodiment regarding the arrangement wherein each of the input/output terminals of the 3-IDT longitudinally coupled-resonator type surface acoustic wave filter devices 601 and 602 are serially connected to a single-port surface acoustic surface wave resonator, an arrangement according to the present invention is not restricted to the above-described configuration, but rather, the present invention may be applied to any surface acoustic wave device having balanced signal terminals, regardless of the configuration thereof, which produces the same advantages.

Figure 42:
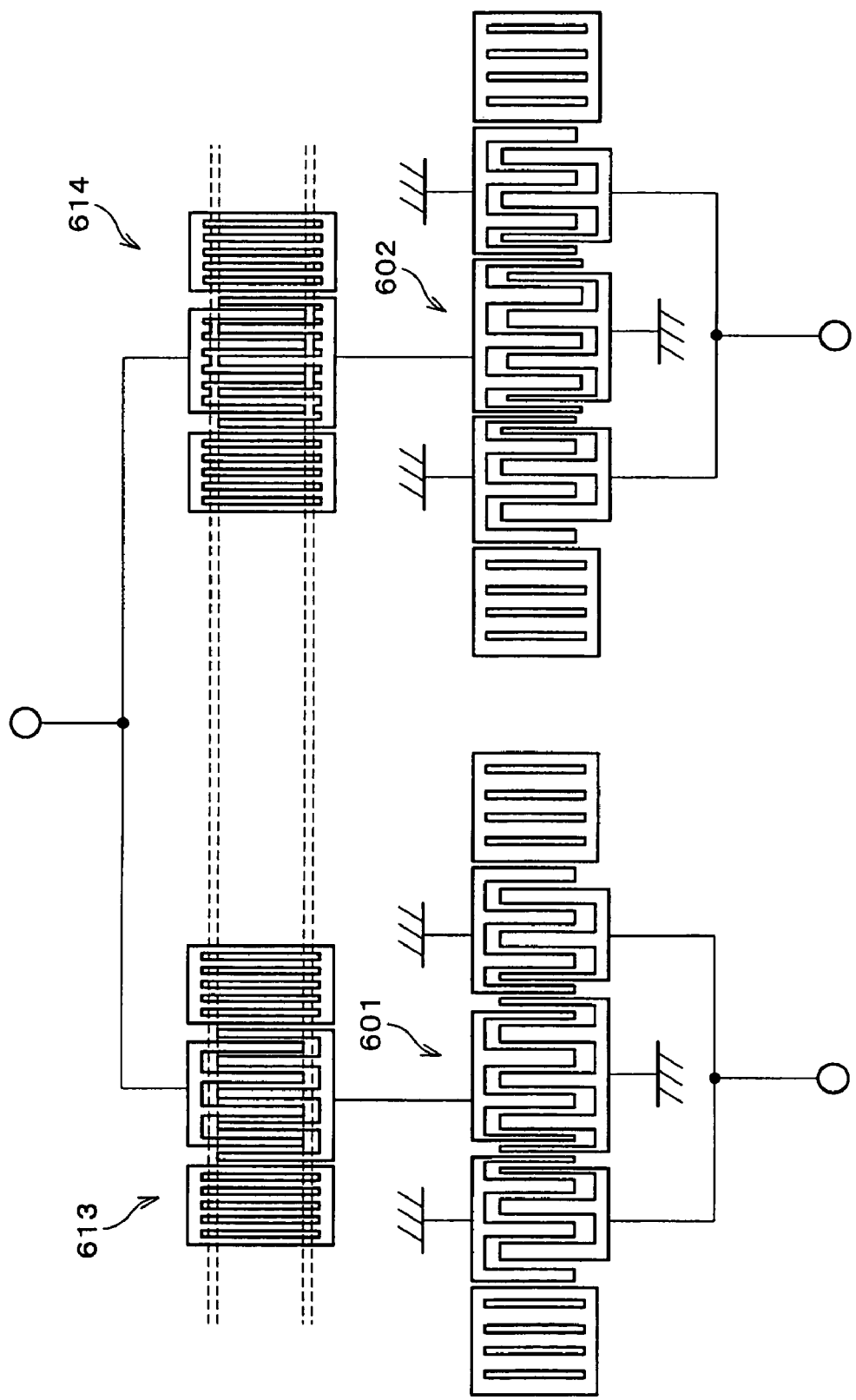
FIG. 42 is a configuration diagram which shows a modification according to the aforementioned fourth preferred embodiment of the present invention.
Figure 43:
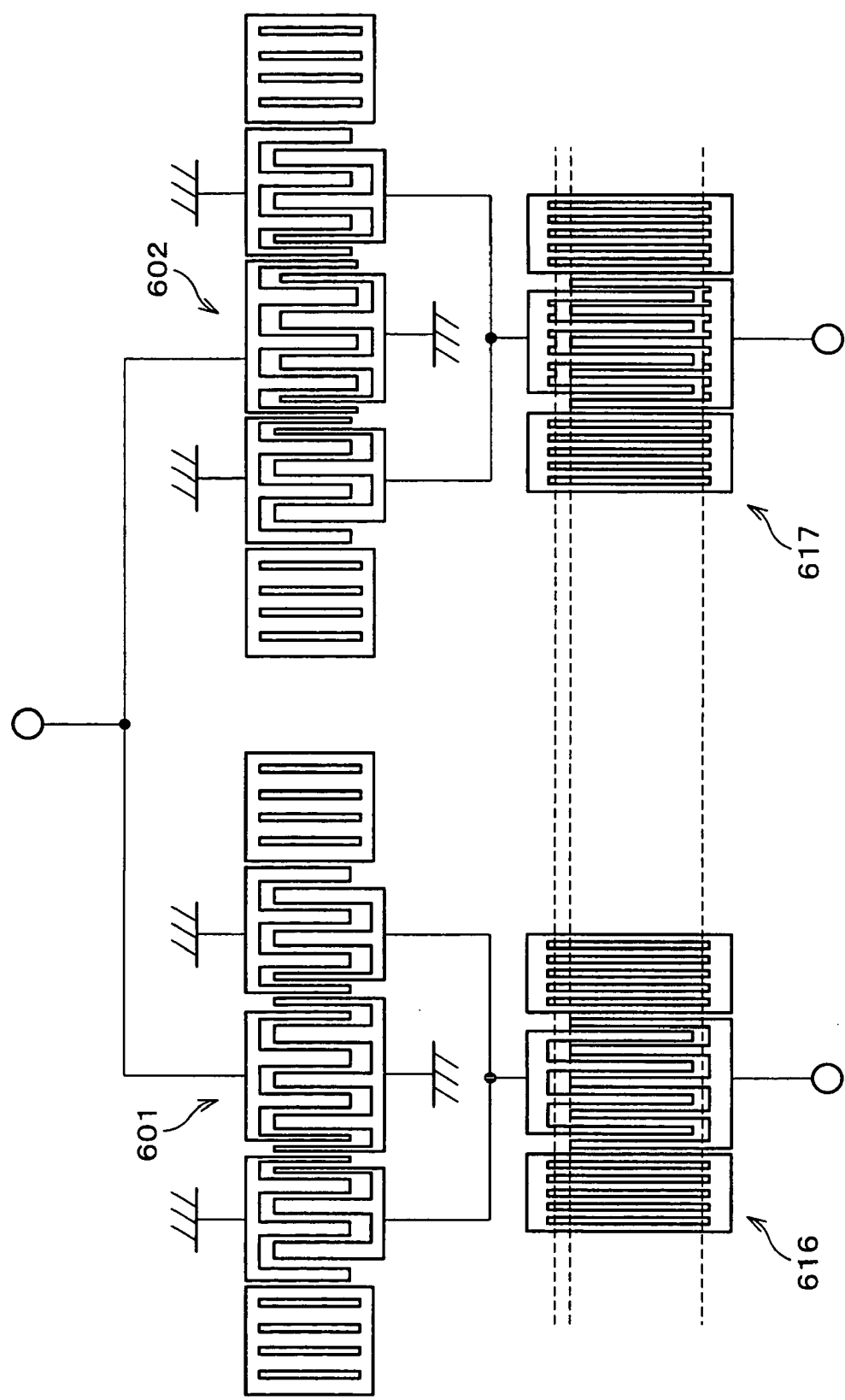
FIG. 43 is a configuration diagram which shows another modification according to the aforementioned fourth preferred embodiment of the present invention.

For example, the present invention may be applied to an arrangement wherein only the input terminals of the surface acoustic wave filter devices 601 and 602 are serially connected to a single-port surface acoustic wave resonator as shown in FIG. 42, and an arrangement wherein only the output terminals of the surface acoustic wave filter devices 601 and 602 are serially connected to a single-port surface acoustic wave resonator as shown in FIG. 43, which exhibit the same advantages.

Figure 44:
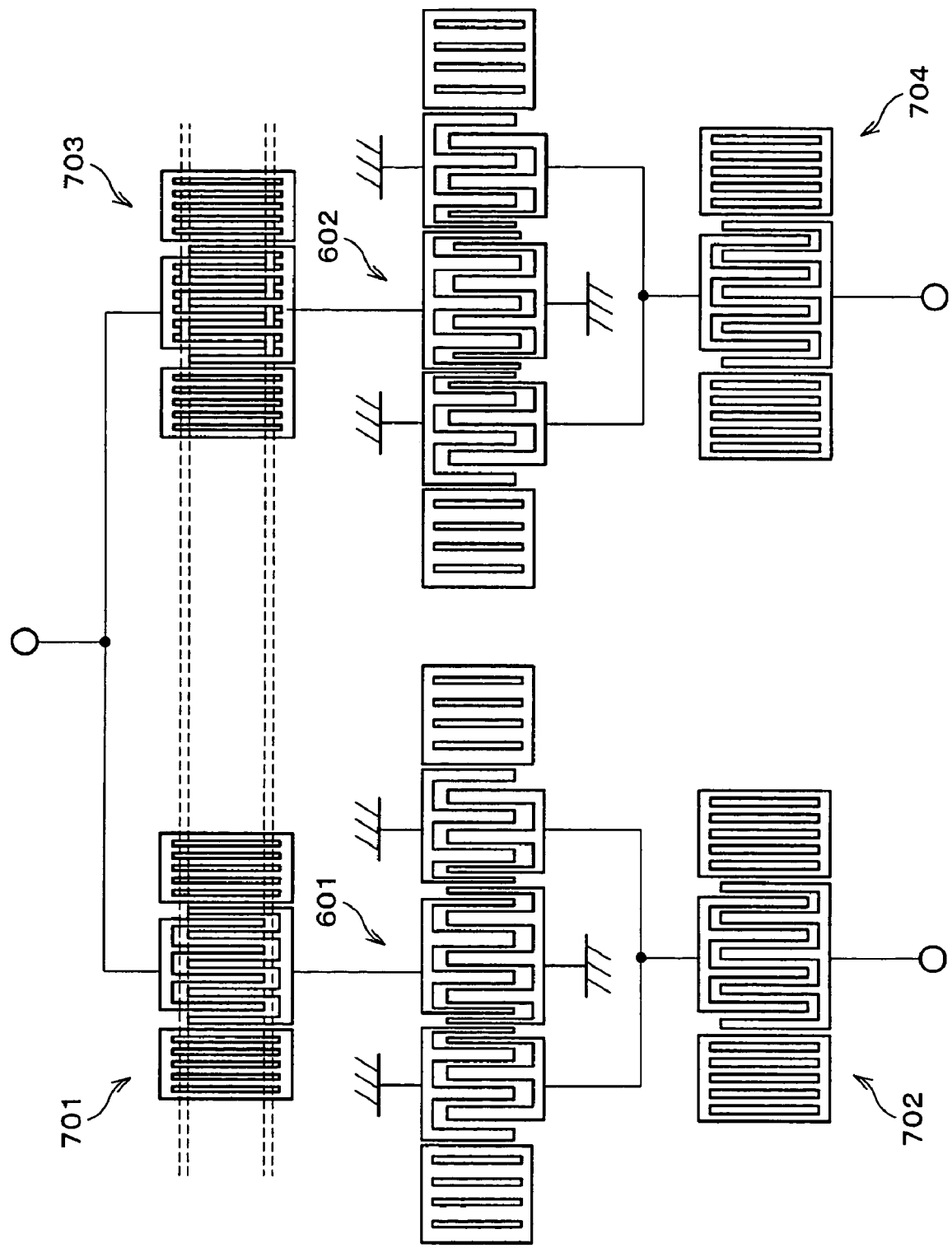
FIG. 44 is a configuration diagram which shows yet another modification according to the aforementioned fourth preferred embodiment of the present invention.

Furthermore, as shown in FIG. 44, an arrangement may be provided which has the same configuration as in FIG. 39, except that with the single-port surface acoustic wave resonators, IDTs 701 and 703 have different lengths of the dummy electrodes, each of which are provided to the IDTs between an electrode finger and the bus bar, while IDTs 702 and 704 have the same length of the dummy electrodes therebetween, which produces the same advantages.

As described above, the present invention may be applied to surface acoustic wave devices including two or more surface acoustic wave filter devices, each of which have a longitudinally coupled-resonator type surface acoustic wave filter device including two or more IDTs, and a single-port surface acoustic wave resonator, having a balance-unbalance conversion function. That is to say, according to the present invention, a surface acoustic wave device having such a configuration further includes two surface acoustic wave filter devices or two single-port surface acoustic wave resonators that have different intervals between, the tip of the electrode fingers for causing excitation of surface acoustic waves, and the bus bar electrically connected to the electrode fingers facing the aforementioned electrode fingers. Alternatively, according to the present invention, the surface acoustic wave device having such a configuration further includes two surface acoustic wave filter devices or two single-port surface acoustic wave resonators that have different lengths of dummy electrodes, each of which are provided to the IDTs between an electrode finger and the bus bar. In either configuration, the phase difference between the balanced signal terminals of the surface acoustic wave device is suppressed.

Note that while description has been made regarding the arrangement wherein a 40±5°-Y-cut-X-propagation LiTaO$_3$ substrate is provided for a piezoelectric substrate, a piezoelectric substrate used in the present invention is not restricted to the aforementioned piezoelectric substrate, but rather, a piezoelectric substrate such as a 64°-Y-cut-X-propagation LiNbO$_3$ substrate, a 47°-Y-cut-X-propagation LiNbO$_3$ substrate, or other suitable piezoelectric substrate, may be used in the present invention, which produces the same advantages.

Furthermore, while description has been made regarding the arrangement wherein the IDT connected to one of the balanced signal electrodes, and the IDT connected to the other balanced signal electrode, have different intervals (gaps) between the electrode finger tip and the bas bar facing the aforementioned electrode fingers such that suitable difference is obtained between the intensities of the SSBW occurring on the aforementioned two IDTs connected to respective balanced electrodes, arrangements according to the present invention are not restricted to the above-described configuration, but rather, any configuration which produces a suitable difference between the properties of the SSBW occurring on the circuits connected to respective balanced signal electrodes may be utilized.

For example, an arrangement may be provided in which the aforementioned two IDTs have different film thicknesses of the aforementioned bus bar portions, or having different structures of the aforementioned bus bar portions. Furthermore, an arrangement may be provided in which, with the surface acoustic wave filter connected to one of the balanced terminals and the surface acoustic wave filter connected to the other balanced terminal, the bus bars of the IDTs thereof are coated with the sound absorptive material of different compositions, and/or different thicknesses. An elastic material which adheres to the bus bar is sufficient for the aforementioned sound absorptive material. For example, silicone rubber or other suitable material may be used for the aforementioned absorptive member.

The above-described change in the film thickness or film structure, or adhesion of the sound absorptive material, does not change excitation intensity of the SSBW, but does change the transverse mode properties. However, the SSBW readily combines with the transverse mode wave, and accordingly, changes in the transverse mode properties change the combination of the transverse mode wave and the SSBW, thereby effecting changes in excitation of the SSBW. Accordingly, an arrangement having a configuration wherein suitable changes in the transverse mode properties are obtained produces the same advantages according to the present invention.

Surface acoustic wave filter devices, to which the present invention may be applied, will be listed below.

(1) A configuration including two surface acoustic wave filter devices including two or more IDTs, wherein one of the terminals of each of the two surface acoustic wave filter devices are connected to an unbalanced signal terminal, and the other to respective balanced signal terminals (FIGS. 1, 12, 13, 14, 15, and 16).

(2) A configuration including three surface acoustic wave filter devices including two or more IDTs, wherein one of the three surface acoustic wave filter devices is connected to the unbalanced signal terminal, and the other surface acoustic wave filter devices are connected to respective balanced signal terminals while also connected to the one surface acoustic wave device in parallel (FIG. 17).

(3) A configuration including four surface acoustic wave filter devices (A, B, C, and D) including two or more IDTs, wherein ones of the terminals of the two surface acoustic wave devices (A, B) are connected to a single unbalanced signal terminal while the other terminals thereof are connected to the other surface acoustic wave filter devices (C, D), respectively, in the vertical direction (A–C, and B–D), and the surface acoustic wave filter devices (C, D), connected to the former surface acoustic wave filter devices (A, B) in the vertical direction, are connected to respective balanced signal terminals (FIGS. 18, 19, 31, and 32).

(4) A configuration including a surface acoustic wave filter device with a balance-unbalance conversion function including three or more IDTs, wherein each of the balanced signal terminals are connected to separate IDTs (FIG. 20).

(5) A configuration including a surface acoustic wave filter device with a balance-unbalance conversion function including three IDTs, wherein the IDTs on the left and right sides are connected to the unbalanced signal terminals, while one of the comb-shaped electrode of the IDT at the middle portion is divided into two parts in the propagating direction of the surface acoustic wave, and the two-divided comb-shaped electrodes are connected to respective balanced signal terminals (FIG. 21).

(6) A configuration including a surface acoustic wave filter device having a balance-unbalance conversion function, which includes three IDTs, wherein the IDTs on the left and right sides are connected to respective balanced signal terminals, and one of the comb-shaped electrodes of the IDT at the middle portion is divided into two portions in the interleaving direction (FIG. 22).

(7) A configuration including two surface acoustic wave filter devices including two or more IDTs, connected serially, wherein one of the surface acoustic wave filters is connected to the unbalanced signal terminal, and the other surface acoustic wave filter is connected to the balanced signal terminals (FIGS. 23 and 24).

Note that with the configurations in (1) through (3) described above, the difference in the intensity of the SSBW occurs between the two surface acoustic wave filter devices connected to the balanced signal terminals. On the other hand, with the configurations in (4) through (7) described above, the difference in the intensity of the SSBW occurs between the IDTs of the surface acoustic wave filter device connected to the balanced signal terminals.

Next, description will be made regarding a communication device including the surface acoustic wave device having any one of the configurations according to the above-described preferred embodiments with reference to FIG. 45. A communication device 800 preferably includes an antenna 801, an antenna shared section/RF Top filter 802, an amplifier 803, an Rx interstage filter 804, a mixer 805, a first interface filter 806, a mixer 807, a second interface filter 808, a first and second local synthesizer 811, a TCXO (Temperature Compensated Crystal Oscillator) 812, a divider 813, and a local filter 814, making up a receiver side (Rx side) circuit.

Figure 45:
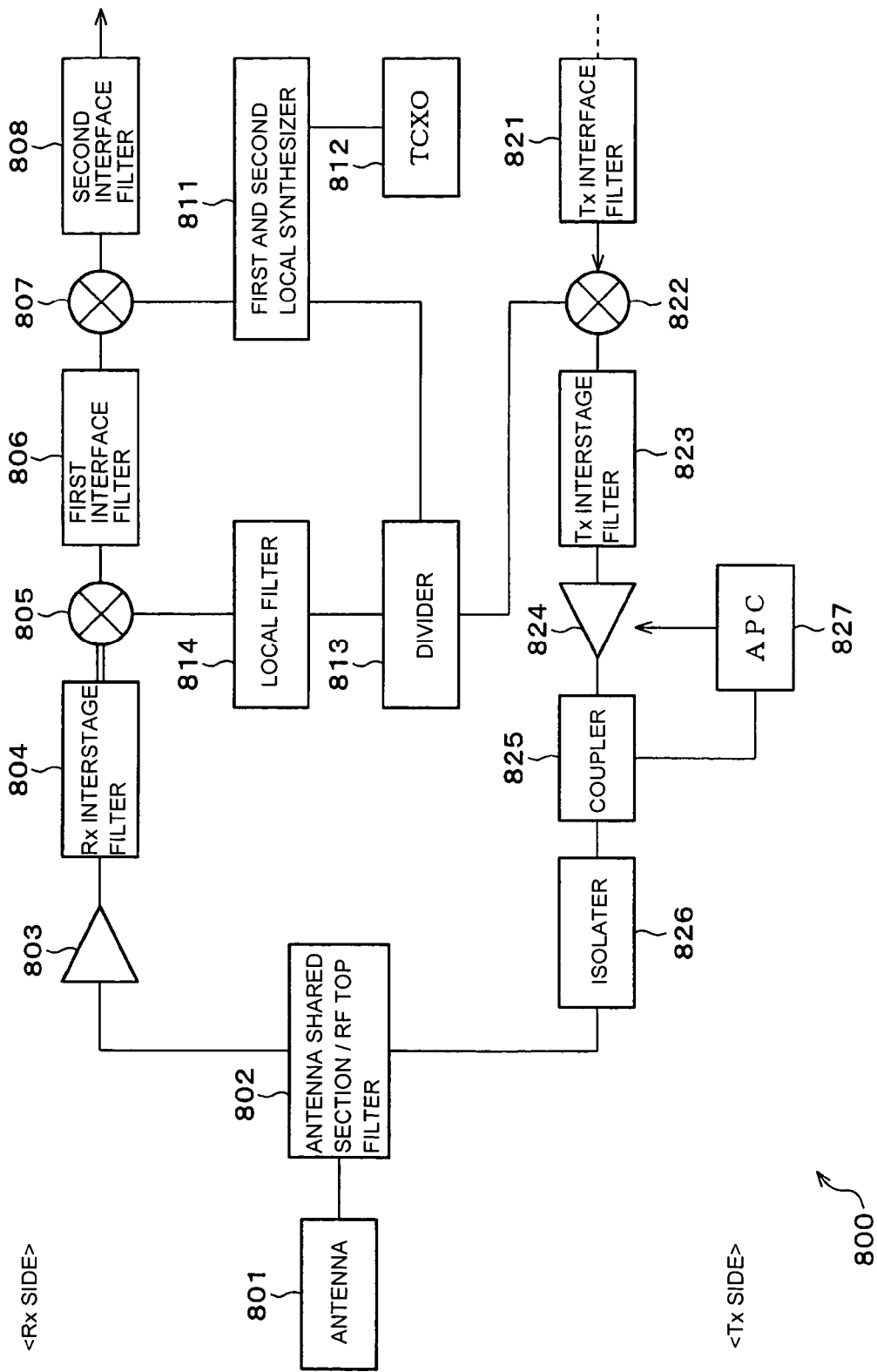
FIG. 45 is a block diagram which shows principal components of a communication device employing a surface acoustic wave device according to any one of the aforementioned preferred embodiments of the present invention.

In this case, balanced signals are preferably transmitted from the Rx interstage filter 804 to the mixer 805 as shown by double lines in FIG. 45, to ensure balancing.

Furthermore, as a transceiver side (Tx side) circuit for transmission, the aforementioned communication device 800 further includes the aforementioned antenna 801 and antenna shared section/RF Top filter 802, which are shared with the aforementioned Rx side circuit, and a Tx interface filter 821, a mixer 822, a Tx interstage filter 823, an amplifier 824, a coupler 825, an isolator 826, and an APC (Automatic Power Control) 827.

In this case, the surface acoustic wave device according to one of the above-described preferred embodiments is suitably used for the aforementioned Rx interstage filter 804, first interface filter 806, Tx interface filter 821, and Tx interstage filter 823.

The surface acoustic wave device according to various preferred embodiments of the present invention has the advantages of the suppressed amplitude difference and phase difference, which improve performance. Thus, the aforementioned communication device including the surface acoustic wave device according to various preferred embodiments of the present invention has the advantage of improved transmission properties.

The present invention is not limited to the above-described preferred embodiments, rather, various modification can be made within the scope of the appended claims. Furthermore, various modifications using the combination of the technical features disclosed in the above-described preferred embodiments are also encompassed within the technical scope of the present invention.

What is claimed is:

1. A surface acoustic wave device having a balance-unbalance conversion function, comprising:
   at least two surface acoustic wave filter devices having at least two comb-shaped electrode portions; wherein
   a first of the at least two surface acoustic wave filter devices is connected to a first one of balanced signal terminals, and a second of the at least two surface acoustic wave devices is connected to a second one of the balanced signal terminals; and
   said first and second surface acoustic wave filter devices have a configuration wherein a difference in intensity of an excited surface skimming bulk wave occurs therebetween.

2. A surface acoustic wave device according to claim 1, wherein said first and second surface acoustic wave filter devices include IDTs having different intervals between tips of electrode fingers and bus bars so as to produce a difference in the intensity of the excited surface skimming bulk wave between said first and second surface acoustic wave filter devices.

3. A surface acoustic wave device according to claim 1, wherein said first and second surface acoustic wave filter devices include IDTs having different intervals between tips of electrode fingers and dummy electrode fingers, each of which are connected to a bus bar so as to effect a difference in the intensity of the excited surface skimming bulk wave between said first and second surface acoustic wave filter devices.

4. A surface acoustic wave device according to claim 1, wherein said first and second surface acoustic wave filter devices include comb-shaped electrodes having lengths of dummy electrode fingers, each of which are connected to a bus bar so as to be introduced between an electrode finger and a bus bar in order to effect a difference in the intensity of the excited surface skimming bulk wave between said first and second surface acoustic wave filter devices.

5. A surface acoustic wave device according to claim 1, wherein said first and second surface acoustic wave filter devices include at least one of, IDTs having film thicknesses of bus bars that are different from one another, and a film structure that is different from one another, in order to effect a difference in the intensity of the excited surface skimming bulk wave between said first and second surface acoustic wave filter devices.

6. A surface acoustic wave device according to claim 1, wherein said first and second surface acoustic wave filter devices include IDTs having sound absorptive material coated on bus bars, at least one of the compositions and the thicknesses of the sound absorptive material of the first and second surface acoustic wave filter devices being different from one another, so as to effect a difference in the intensity of the excited surface skimming bulk wave between said first and second surface acoustic wave filter devices.

7. A surface acoustic wave device according to claim 1, wherein all of said comb-shaped electrode portions have different structures between said first and second surface acoustic wave filters.

8. A surface acoustic wave device according to claim 1, wherein at least one of said comb-shaped electrode portions has a different structure between said first and second surface acoustic wave filters.

9. A surface acoustic wave device according to claim 1, wherein each of said first and second surface acoustic wave filter devices are serially connected to a surface acoustic wave resonator.

10. A surface acoustic wave device according to claim 1, wherein electrode fingers of a portion facing a comb-shaped electrode portion coupled to a comb-shaped electrode portion connected to the first of the balanced signal terminals are connected to a signal terminal, and electrode fingers of a portion facing a comb-shaped electrode portion coupled to a comb-shaped electrode portion connected to the second of the balanced signal terminals are grounded.

11. A surface acoustic wave device according to claim 1, wherein said comb-shaped electrodes are arranged with an interval between tips of electrode fingers and a bus bar of about 0.1 $\mu$m or more, and equal to or less than about 0.55 times as great as the wavelength of the surface acoustic wave propagating thereon.

12. A communication device comprising a surface acoustic wave device according to claim 1.

13. A surface acoustic wave device including a surface acoustic wave filter with a balance-unbalance conversion function, comprising:
   at least three comb-shaped electrode portions; wherein
   a difference in intensity of a surface skimming bulk wave is produced between one of the at least three comb-shaped electrode portions that is connected to a first of balanced signal terminals and another of the comb-shaped electrode portions that is connected to a second of the balanced signal terminals.

14. A surface acoustic wave device according to claim 13, wherein a plurality of said surface acoustic wave filters are connected serially.

15. A surface acoustic wave device according to claim 13, wherein each of said comb-shaped portions connected to said balanced signal terminals have different intervals of tips of electrode fingers and bus bars so as to effect a difference in the intensity of the excited surface skimming bulk wave therebetween.

16. A surface acoustic wave device according to claim 13, wherein each of said comb-shaped portions connected to said balanced signal terminals have different intervals of tips of electrode fingers and dummy electrodes, each of which are connected to a bus bar so as to effect a difference in the intensity of the excited surface skimming bulk wave therebetween.

17. A surface acoustic wave device according to claim 13, wherein each of said comb-shaped portions connected to said balanced signal terminals include different lengths of dummy electrode fingers, each of which are connected to a bus bar so as to be introduced between an electrode finger and said bus bar in order to effect a difference in the intensity of the excited surface skimming bulk wave therebetween.

18. A surface acoustic wave device according to claim 13, wherein each of said comb-shaped portions connected to said balanced signal terminals has at least one of different film thicknesses and different film structures of bus bar portions so as to effect a difference in the intensity of the excited surface skimming bulk wave therebetween.

19. A surface acoustic wave device according to claim 13, wherein each of said comb-shaped portions connected to said balanced signal terminals include sound absorptive material with which bus bars are coated, the sound absorptive material of each of said comb-shaped portions having at least one of different compositions and different thicknesses, so as to effect a difference in the intensity of the excited surface skimming bulk wave therebetween.

20. A surface acoustic wave device according to claim 14, wherein the surface acoustic wave filters is serially connected to a surface acoustic wave resonator.

21. A surface acoustic wave device according to claim 13, wherein electrode fingers of a portion facing one of the comb-shaped electrode portions coupled to the comb-shaped electrode portions connected to the first of the balanced signal terminals are connected to a signal terminal, and electrode fingers of a portion facing the comb-shaped electrode portion coupled to the comb-shaped electrode portion connected to the second of the balanced signal terminals are grounded.

22. A surface acoustic wave device according to claim 13, wherein said comb-shaped electrodes are arranged with an interval between tips of electrode fingers and a bus bar of about 0.1 µm or more, and equal to or less than about 0.55 times as great as the wavelength of the surface acoustic wave propagating thereon.

23. A communication device including a surface acoustic wave device according to claim 13.

24. A surface acoustic wave device including:
at least one surface acoustic wave filter having a balance-unbalance conversion function and including at least two comb-shaped electrode portions; and
surface acoustic wave resonators serially connected to respective balanced signal terminals of said surface acoustic wave device; wherein
said surface acoustic wave resonators having different intervals between tips of electrode fingers and bus bars thereof.

25. A surface acoustic wave device comprising:
at least two surface acoustic wave filter devices according to claim 24, each of which includes at least two comb-shaped electrode portions; wherein
one of said balanced signal terminals of said surface acoustic wave device is connected to a first of said at least two surface acoustic wave filter devices and the other of said balanced signal terminals is connected to a second of said at least two surface acoustic wave filter devices;
said first and second surface acoustic wave filter devices have a difference in at least one of:
an interval between tips of electrode fingers and a bus bar,
an interval between tips of electrode fingers and dummy electrode fingers connected to a bus bar,
an length of dummy electrode fingers connected to a bus bar,
a film thickness of said bus bar,
a film structure of said bus bar,
and including a difference in at least one of the material of a sound absorptive material with which said bus bar is coated, and the thickness thereof, between said first and second surface acoustic wave filter devices.

26. A surface acoustic wave device according to claim 24, including at least three comb-shaped electrode portions, wherein one of said comb-shaped electrode portions connected to a first of the balanced signal terminals of said surface acoustic wave device and another one of said comb-shaped electrode portions connected to a second of said balanced signal terminals have a difference in at least one of:
an interval between tips of electrode fingers and a bus bar,
an interval between tips of electrode fingers and dummy electrode fingers connected to a bus bar,
a length of dummy electrode fingers each of which are connected to said bus bar,
a film thickness of said bus bar,
a film structure of said bus bar,
and including a difference in at least one of:
a material of a sound absorptive material with which said bus bar is coated, and a thickness thereof, between said comb-shaped electrode portions connected to said balanced signal terminals.

27. A surface acoustic wave device according to claim 24, wherein electrode fingers of a portion facing one of the comb-shaped electrode portions coupled to another of the comb-shaped electrode portions connected to a first of the balanced signal terminals are connected to a signal terminal, and electrode fingers of a portion facing one of the comb-shaped electrode portions coupled to another of the comb-shaped electrode portions connected to a second of the balanced signal terminals are grounded.

28. A surface acoustic wave device according to claim 24, wherein said comb-shaped electrodes are arranged with an interval between tips of electrode fingers and a bus bar of about 0.1 µm or more, and equal to or less than about 0.55 times as great as the wavelength of the surface acoustic wave propagating thereon.

29. A communication device including a surface acoustic wave device according to claim 24.

30. A surface acoustic wave device including:
at least one surface acoustic wave filter having a balance-unbalance conversion function and including at least two comb-shaped electrode portions; and
surface acoustic wave resonators serially connected to respective balanced signal terminals of said surface acoustic wave device; wherein
said surface acoustic wave resonators have different intervals between tips of electrode fingers and dummy electrode fingers, each of which are connected to a bus bar thereof.

31. A surface acoustic wave device comprising:
at least two surface acoustic wave filter devices according to claim 30, each of which includes at least two comb-shaped electrode portions; wherein
one of balanced signal terminals of said surface acoustic wave device is connected to a first of said at least two surface acoustic wave filter devices and the other of said balanced signal terminals is connected to a second of said at least two surface acoustic wave filter devices;
said first and second surface acoustic wave filter devices have a difference in at least one of:
an interval between tips of electrode fingers and a bus bar,
an interval between tips of electrode fingers and dummy electrode fingers connected to a bus bar,
a length of the dummy electrode fingers connected to a bus bar,
a film thickness of said bus bar,
a film structure of said bus bar,
and including a difference in at least one of:
a material of a sound absorptive material with which said bus bar is coated, and a thickness thereof, between said first and second surface acoustic wave filter devices.

32. A surface acoustic wave device according to claim 30, including at least three comb-shaped electrode portions, wherein one of said comb-shaped electrode portions connected to one of the balanced signal terminals of said surface acoustic wave device and another one of said comb-shaped electrode portions connected to the other of said balanced signal terminal have a difference in at least one of:
an interval between tips of electrode fingers and a bus bar,
an interval between tips of electrode fingers and dummy electrode fingers connected to a bus bar,
a length of dummy electrode fingers each of which are connected to said bus bar,
a film thickness of said bus bar,
a film structure of said bus bar,
and including a difference in at least one of a material of a sound absorptive material with which said bus bar is coated, and a thickness thereof, between said comb-shaped electrode portions connected to said balanced signal terminals.

33. A surface acoustic wave device according to claim 30, wherein electrode fingers of a portion facing one of the comb-shaped electrode portions coupled to another of the comb-shaped electrode portion connected to one of balanced signal terminals are connected to a signal terminal, and electrode fingers of a portion facing one of the comb-shaped electrode portions coupled to another of the comb-shaped electrode portions connected to the other balanced signal terminal are grounded.

34. A surface acoustic wave device according to claim 30, wherein said comb-shaped electrodes are arranged with an interval between tips of electrode fingers and a bus bar of about 0.1 $\mu$m or more, and equal to or less than about 0.55 times as great as the wavelength of the surface acoustic wave propagating thereon.

35. A communication device including a surface acoustic wave device according to claim 30.

36. A surface acoustic wave device including:
at least one surface acoustic wave filter having a balance-unbalance conversion function and including at least two comb-shaped electrode portions; and
surface acoustic wave resonators serially connected to respective balanced signal terminals of said surface acoustic wave device; wherein
said surface acoustic wave resonators include different lengths of dummy electrode fingers, each of which are connected to a bus bar so as to be introduced between electrode finger and a bus bar thereof.

37. A surface acoustic wave device comprising:
at least two surface acoustic wave filter devices according to claim 36, each of which includes at least two comb-shaped electrode portions; wherein
one of the balanced signal terminals of said surface acoustic wave device is connected to a first of said at least two surface acoustic wave filter devices and the other of said balanced signal terminals is connected to a second of said at least two surface acoustic wave filter devices;
said first and second surface acoustic wave filter devices have a difference in at least one of:
an interval between tips of electrode fingers and a bus bar,
an interval between tips of electrode fingers and dummy electrode fingers connected to a bus bar,
a length of the dummy electrode fingers connected to a bus bar,
a film thickness of said bus bar,
a film structure of said bus bar,
and including a difference in at least one of:
a material of a sound absorptive material with which said bus bar is coated, and a thickness thereof, between said first and second surface acoustic wave filter devices.

38. A surface acoustic wave device according to claim 36, including at least three comb-shaped electrode portions, wherein one of said comb-shaped electrode portions connected to one of the balanced signal terminals of said surface acoustic wave device and another one of said comb-shaped electrode portions connected to the other of said balanced signal terminals have a difference in at least one of:
an interval between tips of electrode fingers and a bus bar,
an interval between tips of electrode fingers and dummy electrode fingers connected to a bus bar,
a length of dummy electrode fingers each of which are connected to said bus bar,
a film thickness of said bus bar,
a film structure of said bus bar,
and including a difference in at least one of:
a material of a sound absorptive material with which said bus bar is coated, and a thickness thereof, between said comb-shaped electrode portions connected to said balanced signal terminals.

39. A surface acoustic wave device according to claim 36, wherein electrode fingers of a portion facing one of the comb-shaped electrode portions coupled to another of the comb-shaped electrode portions connected to one of balanced signal terminals are connected to a signal terminal, and electrode fingers of a portion facing one of the comb-shaped electrode portions coupled to another of the comb-shaped electrode portions connected to the other balanced signal terminal are grounded.

40. A surface acoustic wave device according to claim 36, wherein said comb-shaped electrodes are arranged with an interval between tips of electrode fingers and a bus bar of about 0.1 μm or more, and equal to or less than about 0.55 times as great as the wavelength of the surface acoustic wave propagating thereon.

41. A communication device including a surface acoustic wave device according to claim 36.

42. A surface acoustic wave device including:
at least one surface acoustic wave filter having a balance-unbalance conversion function and including at least two comb-shaped electrode portions; and
surface acoustic wave resonators serially connected to respective balanced signal terminals of said surface acoustic wave device; wherein
said surface acoustic wave resonators have at least one of different film thicknesses of bus bar portions and different film structures thereof.

43. A surface acoustic wave device comprising:
at least two surface acoustic wave filter devices according to claim 42, each of which includes at least two comb-shaped electrode portions; wherein
one of the balanced signal terminals of said surface acoustic wave device is connected to a first of said at least two surface acoustic wave filter devices and the other of said balanced signal terminals is connected to a second of said at least two surface acoustic wave filter devices;
said first and second surface acoustic wave filter devices have a difference in at least one of:
an interval between tips of electrode fingers and a bus bar,
an interval between tips of electrode fingers and dummy electrode fingers connected to a bus bar,
a length of dummy electrode fingers connected to a bus bar,
a film thickness of said bus bar,
a film structure of said bus bar,
and including a difference in at least one of:
a material of a sound absorptive material with which said bus bar is coated, and a thickness thereof, between said first and second surface acoustic wave filter devices.

44. A surface acoustic wave device according to claim 42, including at least three comb-shaped electrode portions, wherein one of said comb-shaped electrode portions connected to one of the balanced signal terminals of said surface acoustic wave device and another one of said comb-shaped electrode portions connected to the other of said balanced signal terminals have a difference in at least one of:
an interval between tips of electrode fingers and a bus bar,
an interval between tips of electrode fingers and dummy electrode fingers connected to a bus bar,
a length of dummy electrode fingers each of which are connected to said bus bar,
a film thickness of said bus bar,
a film structure of said bus bar,
and including a difference in at least one of:
a material of a sound absorptive material with which said bus bar is coated, and a thickness thereof, between said comb-shaped electrode portions connected to said balanced signal terminals.

45. A surface acoustic wave device according to claim 42, wherein electrode fingers of a portion facing one of the comb-shaped electrode portions coupled to another of the comb-shaped electrode portions connected to one of balanced signal terminals are connected to a signal terminal, and electrode fingers of a portion facing one of the comb-shaped electrode portions coupled to another of the comb-shaped electrode portions connected to the other balanced signal terminal are grounded.

46. A surface acoustic wave device according to claim 42, wherein said comb-shaped electrodes are provided with an interval between the tips of electrode fingers and a bus bar of about 0.1 μm or more, and equal to or less than about 0.55 times as great as the wavelength of the surface acoustic wave propagating thereon.

47. A communication device including a surface acoustic wave device according to claim 42.

48. A surface acoustic wave device including:
at least one surface acoustic wave filter having a balance-unbalance conversion function and including at least two comb-shaped electrode portions; and
surface acoustic wave resonators serially connected to respective balanced signal terminals of said surface acoustic wave device; wherein
said surface acoustic wave resonators include sound absorptive material with which bus bars thereof are coated, the sound absorptive material of the surface acoustic wave resonators having at least one of different compositions and different thicknesses.

49. A surface acoustic wave device comprising:
at least two surface acoustic wave filter devices according to claim 48, each of which includes at least two comb-shaped electrode portions; wherein
one of the balanced signal terminals of said surface acoustic wave device is connected to a first of said at least two surface acoustic wave filter devices and the other of said balanced signal terminals is connected to a second of said at least two surface acoustic wave filter devices;
said first and second surface acoustic wave filter devices have a difference in at least one of:
an interval between tips of electrode fingers and a bus bar,
an interval between tips of electrode fingers and dummy electrode fingers connected to a bus bar,
a length of dummy electrode fingers connected to a bus bar,
a film thickness of said bus bar,
a film structure of said bus bar,
and including a difference in at least one of:
a material of a sound absorptive material with which said bus bar is coated, and a thickness thereof, between said first and second surface acoustic wave filter devices.

50. A surface acoustic wave device according to claim 48, including at least three comb-shaped electrode portions, wherein one of said comb-shaped electrode portions connected to one of the balanced signal terminals of said surface acoustic wave device and another one of said comb-shaped electrode portions connected to the other of said balanced signal terminals have a difference in at least one of:
an interval between tips of electrode fingers and a bus bar,
an interval between tips of electrode fingers and dummy electrode fingers connected to a bus bar,
a length of dummy electrode fingers each of which are connected to said bus bar,
a film thickness of said bus bar,
a film structure of said bus bar,
and including a difference in at least one of:
a material of a sound absorptive material with which said bus bar is coated, and a thickness thereof, between said comb-shaped electrode portions connected to said balanced signal terminals.

51. A surface acoustic wave device according to claim 48, wherein electrode fingers of a portion facing a comb-shaped electrode portion coupled to a comb-shaped electrode portion connected to one of balanced signal terminals are connected to a signal terminal, and electrode fingers of a portion facing a comb-shaped electrode portion coupled to a comb-shaped electrode portion connected to the other balanced signal terminal are grounded.

52. A surface acoustic wave device according to claim 48, wherein said comb-shaped electrodes are arranged with an interval between the tips of electrode fingers and a bus bar of about 0.1 µm or more, and equal to or less than about 0.55 times as great as the wavelength of the surface acoustic wave propagating thereon.

53. A communication device including a surface acoustic wave device according to claim 48.

54. A surface acoustic wave device having a balance-unbalance conversion function, comprising:
    at least two surface acoustic wave filters, each of which include at least two comb-shaped electrode portions; wherein
    an unbalanced signal terminal of said surface acoustic wave device is connected to two of said surface acoustic wave filters, and each of two balanced signal terminals of said surface acoustic wave device are connected to separate surface acoustic wave filters;
    surface acoustic wave resonators are serially connected between said unbalanced signal terminal, and each of said two surface acoustic wave filter devices connected to said unbalanced signal terminal; and
    said two surface acoustic wave resonators have different intervals between tips of electrode fingers and bus bars thereof.

55. A surface acoustic wave device comprising:
    at least two surface acoustic wave filter devices according to claim 54, each of which includes at least two comb-shaped electrode portions; wherein
    one of the balanced signal terminals of said surface acoustic wave device is connected to a first of said at least two surface acoustic wave filter devices and the other of said balanced signal terminals is connected to a second of said at least two surface acoustic wave filter devices;
    said first and second surface acoustic wave filter devices have a difference in at least one of:
    an interval between tips of electrode fingers and a bus bar,
    an interval between tips of electrode fingers and dummy electrode fingers connected to a bus bar,
    a length of the dummy electrode fingers connected to a bus bar,
    a film thickness of said bus bar,
    a film structure of said bus bar,
    and including a difference in at least one of:
    a material of a sound absorptive material with which said bus bar is coated, and a thickness thereof, between said first and second surface acoustic wave filter devices.

56. A surface acoustic wave device according to claim 54, including at least three comb-shaped electrode portions, wherein one of said comb-shaped electrode portions connected to one of the balanced signal terminals of said surface acoustic wave device and another one of said comb-shaped electrode portions connected to the other of said balanced signal terminals have a difference in at least one of:
    an interval between tips of electrode fingers and a bus bar,
    an interval between tips of electrode fingers and dummy electrode fingers connected to a bus bar,
    a length of dummy electrode fingers each of which are connected to said bus bar,
    a film thickness of said bus bar,
    a film structure of said bus bar,
    and including a difference in at least one of:
    a material of a sound absorptive material with which said bus bar is coated, and a thickness thereof, between said comb-shaped electrode portions connected to said balanced signal terminals.

57. A surface acoustic wave device according to claim 54, wherein electrode fingers of a portion facing one of the comb-shaped electrode portions coupled to another of the comb-shaped electrode portions connected to one of the balanced signal terminals are connected to a signal terminal, and electrode fingers of a portion facing one of the comb-shaped electrode portions coupled to another of the comb-shaped electrode portions connected to the other balanced signal terminal are grounded.

58. A surface acoustic wave device according to claim 54, wherein said comb-shaped electrodes are arranged with an interval between tips of electrode fingers and a bus bar of about 0.1 µm or more, and equal to or less than about 0.55 times as great as the wavelength of the surface acoustic wave propagating thereon.

59. A communication device including a surface acoustic wave device according to claim 54.

60. A surface acoustic wave device having a balance-unbalance conversion function, comprising:
    at least two surface acoustic wave filters, each of which include at least two comb-shaped electrode portions; wherein
    an unbalanced signal terminal of said surface acoustic wave device is connected to two of said surface acoustic wave filters, and each of two balanced signal terminals of said surface acoustic wave device are connected to separate surface acoustic wave filters;
    surface acoustic wave resonators are serially connected between said unbalanced signal terminal, and each of said two surface acoustic wave filter devices connected to said unbalanced signal terminal; and
    said surface acoustic wave resonators have different intervals between tips of electrode fingers and dummy electrode fingers thereof, each of which are connected to a bus bar thereof.

61. A surface acoustic wave device comprising:
    at least two surface acoustic wave filter devices according to claim 60, each of which includes at least two comb-shaped electrode portions; wherein
    one of the balanced signal terminals of said surface acoustic wave device is connected to a first of said at least two surface acoustic wave filter devices and the other of said balanced signal terminals is connected to a second of said at least two surface acoustic wave filter devices;
    said first and second surface acoustic wave filter devices have a difference in at least one of:
    an interval between tips of electrode fingers and a bus bar,
    an interval between tips of electrode fingers and dummy electrode fingers connected to a bus bar,
    a length of dummy electrode fingers connected to a bus bar,
    a film thickness of said bus bar,
    a film structure of said bus bar,
    and including a difference in at least one of:
    a material of a sound absorptive material with which said bus bar is coated, and a thickness thereof, between said first and second surface acoustic wave filter devices.

62. A surface acoustic wave device according to claim 60, including at least three comb-shaped electrode portions, wherein one of said comb-shaped electrode portions connected to one of the balanced signal terminals of said surface acoustic wave device and another one of said comb-shaped electrode portions connected to the other of said balanced signal terminals have a difference in at least one of:
an interval between tips of electrode fingers and a bus bar,
an interval between tips of electrode fingers and dummy electrode fingers connected to a bus bar,
a length of dummy electrode fingers each of which are connected to said bus bar,
a film thickness of said bus bar,
a film structure of said bus bar,
and including a difference in at least one of:
a material of a sound absorptive material with which said bus bar is coated, and a thickness thereof, between said comb-shaped electrode portions connected to said balanced signal terminals.

63. A surface acoustic wave device according to claim 60, wherein electrode fingers of a portion facing one of the comb-shaped electrode portions coupled to another of the comb-shaped electrode portions connected to one of balanced signal terminals are connected to a signal terminal, and electrode fingers of a portion facing one of the comb-shaped electrode portions coupled to another of the comb-shaped electrode portions connected to the other balanced signal terminal are grounded.

64. A surface acoustic wave device according to claim 60, wherein said comb-shaped electrodes are arranged with an interval between the tips of electrode fingers and a bus bar of about 0.1 μm or more, and equal to or less than about 0.55 times as great as the wavelength of the surface acoustic wave propagating thereon.

65. A communication device including a surface acoustic wave device according to claim 60.

66. A surface acoustic wave device having a balance-unbalance conversion function, comprising:
at least two surface acoustic wave filters, each of which include at least two comb-shaped electrode portions; wherein
an unbalanced signal terminal of said surface acoustic wave device is connected to two of said surface acoustic wave filters, and each of two balanced signal terminals of said surface acoustic wave device are connected to separate surface acoustic wave filters;
surface acoustic wave resonators are serially connected between said unbalanced signal terminal, and each of said two surface acoustic wave filter devices connected to said unbalanced signal terminal; and
said surface acoustic wave resonators include different lengths of dummy electrode fingers, each of which are connected to a bus bar thereof so as to be introduced between an electrode finger and said bus bar of the comb-shaped electrode portions.

67. A surface acoustic wave device comprising:
at least two surface acoustic wave filter devices according to claim 66, each of which includes at least two comb-shaped electrode portions; wherein
one of the balanced signal terminals of said surface acoustic wave device is connected to a first of said at least two surface acoustic wave filter devices and the other of said balanced signal terminals is connected to a second of said at least two surface acoustic wave filter devices;
said first and second surface acoustic wave filter devices have a difference in at least one of:
an interval between tips of electrode fingers and a bus bar,
an interval between tips of electrode fingers and dummy electrode fingers connected to a bus bar,
a length of dummy electrode fingers connected to a bus bar,
a film thickness of said bus bar,
a film structure of said bus bar,
and including a difference in at least one of:
a material of a sound absorptive material with which said bus bar is coated, and a thickness thereof, between said first and second surface acoustic wave filter devices.

68. A surface acoustic wave device according to claim 66, including at least three comb-shaped electrode portions, wherein one of said comb-shaped electrode portions connected to one of the balanced signal terminals of said surface acoustic wave device and another one of said comb-shaped electrode portions connected to the other of said balanced signal terminals have a difference in at least one of:
an interval between tips of electrode fingers and a bus bar,
an interval between tips of electrode fingers and dummy electrode fingers connected to a bus bar,
a length of dummy electrode fingers each of which are connected to said bus bar, a film thickness of said bus bar,
a film structure of said bus bar,
and including a difference in at least one of:
a material of a sound absorptive material with which said bus bar is coated, and a thickness thereof, between said comb-shaped electrode portions connected to said balanced signal terminals.

69. A surface acoustic wave device according to claim 66, wherein electrode fingers of a portion facing one of the comb-shaped electrode portions coupled to another of the comb-shaped electrode portions connected to one of balanced signal terminals are connected to a signal terminal, and electrode fingers of a portion facing one of the comb-shaped electrode portions coupled to another of the comb-shaped electrode portions connected to the other balanced signal terminal are grounded.

70. A surface acoustic wave device according to claim 66, wherein said comb-shaped electrodes are arranged with an interval between the tips of electrode fingers and a bus bar of about 0.1 μm or more, and equal to or less than about 0.55 times as great as the wavelength of the surface acoustic wave propagating thereon.

71. A communication device including a surface acoustic wave device according to claim 66.

72. A surface acoustic wave device having a balance-unbalance conversion function, comprising:
at least two surface acoustic wave filters, each of which include at least two comb-shaped electrode portions; wherein
an unbalanced signal terminal of said surface acoustic wave device is connected to two of said surface acoustic wave filters, and each of two balanced signal terminals of said surface acoustic wave device are connected to separate surface acoustic wave filters;
surface acoustic wave resonators are serially connected between said unbalanced signal terminal, and each of said two surface acoustic wave filter devices connected to said unbalanced signal terminal; and
said surface acoustic wave resonators include at least one of different film structures of bus bar portions and different film thickness thereof.

73. A surface acoustic wave device comprising:
at least two surface acoustic wave filter devices according to claim 72, each of which includes at least two comb-shaped electrode portions; wherein
one of the balanced signal terminals of said surface acoustic wave device is connected to a first of said at least two surface acoustic wave filter devices and the other of said balanced signal terminals is connected to a second of said at least two surface acoustic wave filter devices;

said first and second surface acoustic wave filter devices have a difference in at least one of:
an interval between tips of electrode fingers and a bus bar,
an interval between tips of electrode fingers and dummy electrode fingers connected to a bus bar,
a length of dummy electrode fingers connected to a bus bar,
a film thickness of said bus bar,
a film structure of said bus bar,
and including a difference in at least one of:
a material of a sound absorptive material with which said bus bar is coated, and a thickness thereof, between said first and second surface acoustic wave filter devices.

74. A surface acoustic wave device according to claim 72, including at least three comb-shaped electrode portions, wherein one of said comb-shaped electrode portions connected to one of the balanced signal terminals of said surface acoustic wave device and another one of said comb-shaped electrode portions connected to the other of said balanced signal terminals have a difference in at least one of:
an interval between tips of electrode fingers and a bus bar,
an interval between tips of electrode fingers and dummy electrode fingers connected to a bus bar,
a length of dummy electrode fingers each of which are connected to said bus bar,
a film thickness of said bus bar,
a film structure of said bus bar,
and including a difference in at least one of:
a material of a sound absorptive material with which said bus bar is coated, and a thickness thereof, between said comb-shaped electrode portions connected to said balanced signal terminals.

75. A surface acoustic wave device according to claim 72, wherein electrode fingers of a portion facing one of the comb-shaped electrode portions coupled to another of the comb-shaped electrode portions connected to one of the balanced signal terminals are connected to a signal terminal, and electrode fingers of a portion facing one of the comb-shaped electrode portions coupled to another of the comb-shaped electrode portions connected to the other balanced signal terminal are grounded.

76. A surface acoustic wave device according to claim 72, wherein said comb-shaped electrodes are arranged with an interval between the tips of electrode fingers and a bus bar of about 0.1 $\mu$m or more, and equal to or less than about 0.55 times as great as the wavelength of the surface acoustic wave propagating thereon.

77. A communication device including a surface acoustic wave device according to claim 72.

78. A surface acoustic wave device having a balance-unbalance conversion function, comprising:
at least two surface acoustic wave filters, each of which include at least two comb-shaped electrode portions; wherein
an unbalanced signal terminal of said surface acoustic wave device is connected to two of said surface acoustic wave filters, and each of two balanced signal terminals of said surface acoustic wave device are connected to separate surface acoustic wave filters;
surface acoustic wave resonators are serially connected between said unbalanced signal terminal, and each of said two surface acoustic wave filter devices connected to said unbalanced signal terminal; and
said surface acoustic wave resonators include sound absorptive material with which bus bars thereof are coated, the sound absorptive material of the surface acoustic wave resonators having at least one of different compositions and different thicknesses.

79. A surface acoustic wave device comprising:
at least two surface acoustic wave filter devices according to claim 78, each of which includes at least two comb-shaped electrode portions; wherein
one of the balanced signal terminals of said surface acoustic wave device is connected to a first of said at least two surface acoustic wave filter devices and the other of said balanced signal terminals is connected to a second of said at least two surface acoustic wave filter devices;
said first and second surface acoustic wave filter devices have a difference in at least one of:
an interval between tips of electrode fingers and a bus bar,
an interval between tips of electrode fingers and dummy electrode fingers connected to a bus bar,
a length of dummy electrode fingers connected to a bus bar,
a film thickness of said bus bar,
a film structure of said bus bar,
and including a difference in at least one of:
a material of a sound absorptive material with which said bus bar is coated, and a thickness thereof, between said first and second surface acoustic wave filter devices.

80. A surface acoustic wave device according to claim 78, including at least three comb-shaped electrode portions, wherein one of said comb-shaped electrode portions connected to one of the balanced signal terminals of said surface acoustic wave device and another one of said comb-shaped electrode portions connected to the other of said balanced signal terminal have a difference in at least one of:
an interval between tips of electrode fingers and a bus bar,
an interval between tips of electrode fingers and dummy electrode fingers connected to a bus bar,
a length of dummy electrode fingers each of which are connected to said bus bar,
a film thickness of said bus bar,
a film structure of said bus bar,
and including a difference in at least one of:
a material of a sound absorptive material with which said bus bar is coated, and a thickness thereof, between said comb-shaped electrode portions connected to said balanced signal terminals.

81. A surface acoustic wave device according to claim 78, wherein electrode fingers of a portion facing one of the comb-shaped electrode portions coupled to another of the comb-shaped electrode portions connected to one of balanced signal terminals are connected to a signal terminal, and electrode fingers of a portion facing one of the comb-shaped electrode portions coupled to another of the comb-shaped electrode portions connected to the other balanced signal terminal are grounded.

82. A surface acoustic wave device according to claim 78, wherein said comb-shaped electrodes are arranged with an interval between the tips of electrode fingers and a bus bar of about 0.1 $\mu$m or more, and equal to or less than about 0.55 times as great as the wavelength of the surface acoustic wave propagating thereon.

83. A communication device including a surface acoustic wave device according to claim 78.

* * * * *